US010139727B2

(12) United States Patent
Tsuchimura et al.

(10) Patent No.: US 10,139,727 B2
(45) Date of Patent: Nov. 27, 2018

(54) CHEMICAL AMPLIFICATION RESIST COMPOSITION, RESIST FILM USING THE SAME, RESIST-COATED MASK BLANK, METHOD OF FORMING PHOTOMASK AND PATTERN, AND METHOD OF MANUFACTURING ELECTRONIC DEVICE AND ELECTRONIC DEVICE

(71) Applicant: FUJIFILM CORPORATION, Minato-ku, Tokyo (JP)

(72) Inventors: Tomotaka Tsuchimura, Haibara-gun (JP); Koutarou Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/540,454

(22) Filed: Nov. 13, 2014

(65) Prior Publication Data

US 2015/0072274 A1   Mar. 12, 2015

Related U.S. Application Data

(63) Continuation of application No. PCT/JP2013/063863, filed on May 10, 2013.

(30) Foreign Application Priority Data

| May 21, 2012 | (JP) | ................................. 2012-115607 |
| Mar. 14, 2013 | (JP) | ................................. 2013-051817 |

(51) Int. Cl.
| G03F 7/038 | (2006.01) |
| G03F 7/039 | (2006.01) |
| G03F 7/004 | (2006.01) |
| G03F 7/32 | (2006.01) |
| G03F 7/30 | (2006.01) |
| G03F 7/20 | (2006.01) |
| G03F 1/20 | (2012.01) |
| G03F 1/22 | (2012.01) |
| G03F 1/00 | (2012.01) |
| G03F 1/50 | (2012.01) |
| G03F 1/56 | (2012.01) |
| C08F 212/14 | (2006.01) |

(52) U.S. Cl.
CPC .......... *G03F 7/0382* (2013.01); *C08F 212/14* (2013.01); *G03F 1/00* (2013.01); *G03F 1/20* (2013.01); *G03F 1/22* (2013.01); *G03F 1/50* (2013.01); *G03F 1/56* (2013.01); *G03F 7/0045* (2013.01); *G03F 7/0046* (2013.01); *G03F 7/0392* (2013.01); *G03F 7/0397* (2013.01); *G03F 7/2059* (2013.01); *G03F 7/30* (2013.01); *G03F 7/322* (2013.01); *G03F 7/325* (2013.01)

(58) Field of Classification Search
None
See application file for complete search history.

(56) References Cited

U.S. PATENT DOCUMENTS

| 6,521,393 B1 | 2/2003 | Kishimura et al. |
| 8,435,717 B2 | 5/2013 | Hagiwara et al. |
| 2001/0038970 A1 | 11/2001 | Cameron et al. |
| 2003/0198894 A1* | 10/2003 | Mizutani ............... G03F 7/0045 430/280.1 |
| 2007/0042290 A1* | 2/2007 | Inabe .................... G03F 7/0045 430/270.1 |
| 2007/0248908 A1 | 10/2007 | Huang et al. |
| 2010/0035185 A1 | 2/2010 | Hagiwara et al. |
| 2010/0197136 A1* | 8/2010 | Shimada et al. .............. 438/653 |
| 2011/0008735 A1 | 1/2011 | Ohsawa et al. |
| 2011/0059396 A1* | 3/2011 | Wang .................... G03F 7/0045 430/270.1 |
| 2011/0189607 A1 | 8/2011 | Ohashi et al. |
| 2011/0189609 A1* | 8/2011 | Kawabata et al. ......... 430/270.1 |
| 2011/0293900 A1* | 12/2011 | Tomeba ................ G03F 7/0045 428/195.1 |
| 2012/0003583 A1* | 1/2012 | Tsuchimura .......... G03F 7/0045 430/283.1 |
| 2012/0100481 A1* | 4/2012 | Ito ........................ G03F 7/0045 430/283.1 |
| 2012/0301817 A1 | 11/2012 | Inasaki et al. |
| 2013/0130175 A1 | 5/2013 | Hagiwara et al. |
| 2014/0296561 A1 | 10/2014 | Ohsawa et al. |

FOREIGN PATENT DOCUMENTS

| CN | 101546116 A | 9/2009 |
| EP | 0 899 614 A1 | 3/1999 |
| JP | 2000-258902 A | 9/2000 |
| JP | 2005-227680 A | 8/2005 |
| JP | 2005-266799 A | 9/2005 |
| JP | 2008-162101 A | 7/2008 |
| JP | 4175115 B2 | 11/2008 |
| JP | 2009-007327 A | 1/2009 |
| JP | 2011-16746 A | 1/2011 |
| JP | 2011157313 A | 8/2011 |
| JP | 2011175230 A | 9/2011 |
| JP | 2012107151 A | 6/2012 |
| WO | WO 2006/043597 A1 * | 4/2006 |

OTHER PUBLICATIONS

Machine-assisted English translation of JP 2005-227680 (Kodama) provided by JPO (2005).*
Chemical Abstract (Accession No. 2006:381200)—English abstract for WO 2006/043597 A1 (2006).*
Machine-assisted English translation of WO 2006/043597 A1, provided by Google (2006).*
International Search Report of PCT/JP2013/063863, dated Jun. 11, 2013. [PCT/ISA/210], 4 pages in English.
Written Opinion of PCT/JP2013/063863, dated Jun. 11, 2013, 4 pages in English.

(Continued)

*Primary Examiner* — Sin J Lee
(74) *Attorney, Agent, or Firm* — Sughrue Mion, PLLC

(57) ABSTRACT

A chemical amplification resist composition according to the present invention includes (A) a compound including a triarylsulfonium cation having one or more fluorine atoms and capable of generating an acid with a volume of 240 Å$^3$ or higher by irradiation of active rays or radiation; and (B) a compound including a phenolic hydroxyl group.

18 Claims, No Drawings

(56) References Cited

OTHER PUBLICATIONS

Notice of Reasons for Rejection, dated Jun. 2, 2015, issued in corresponding JP Application No. 2013-051817, 13 pages in English and Japanese.
Office Action dated Mar. 24, 2016, issued by the Taiwan Patent Office in corresponding Taiwanese Application No. 102117465.
Office Action dated Jun. 10, 2016, from the Korean Intellectual Property Office in counterpart Korean Application No. 10-2014-7031627.
Office Action dated Sep. 7, 2016, issued by the Intellectual Property Office of Taiwan in corresponding Taiwanese Application No. 102117465.
Office Action dated Sep. 1, 2017 from the State Intellectual Property Office of the P.R.C. in counterpart Chinese Application No. 201380023929.X.
Office Action dated Feb. 8, 2018 from the State Intellectual Property Office of the P.R.C. in counterpart Chinese application No. 201380023929.X.
Communication dated Apr. 26, 2018, from the State Intellectual Property Office of the P.R.C. in counterpart Chinese Application No. 201380023929.X.

\* cited by examiner

CHEMICAL AMPLIFICATION RESIST COMPOSITION, RESIST FILM USING THE SAME, RESIST-COATED MASK BLANK, METHOD OF FORMING PHOTOMASK AND PATTERN, AND METHOD OF MANUFACTURING ELECTRONIC DEVICE AND ELECTRONIC DEVICE

CROSS-REFERENCE TO RELATED APPLICATIONS

This application is a Continuation of PCT International Application No. PCT/JP2013/063863 filed on May 10, 2013, which claims priority under 35 U.S.C § 119(a) to Japanese Patent Application No. 2012-115607 filed on May 21, 2012 and Japanese Patent Application No. 2013-051817 filed on Mar. 14, 2013. Each of the above application(s) is hereby expressly incorporated by reference, in its entirety, into the present application.

BACKGROUND OF THE INVENTION

1. Field of the Invention

The present invention relates to a chemical amplification resist composition from which high precision pattern is able to be formed using an electron beam or extreme ultraviolet beam suitably used in an ultra-microlithography process or other fabrication process of manufacturing an ultra LSI or high capacity microchip; a negative chemical amplification resist composition; a resist film using the same; a resist-coated mask blank; a method of forming a photomask and a pattern; and a method of manufacturing an electronic device and the electronic device.

2. Description of the Related Art

In microfabrication using a resist composition, along with the increase in the degree of integration of integrated circuits, there is a demand for formation of ultrafine patterns. Therefore, the exposure wavelength also tends to become shorter, as in the case of the transition from g-line to i-line, or further to excimer laser light, and, for example, the development of lithographic technologies using electron beams is currently underway.

The resist film subjected to exposure by an excimer laser or an electron beam is usually formed from a chemical amplification resist composition, various compounds are developed for a photoacid generator which is a main constituent component of a chemical amplification resist composition and, for example, a technology is known in which a satisfactory pattern is to be formed and a fluorine-substituted triphenyl sulfonium salt is used as a photoacid generator (for example, refer to JP4175115B, JP2005-266799A, or JP2000-258902A).

However, from the viewpoint of total performance as a resist, the discovery of appropriate combinations of the resin, photoacid generators, basic compounds, additives, solvents, and the like, which are used is problematic, and, in particular, in view of recent demand for forming an ultrafine pattern (for example, a line width of 50 nm or less) with high performance, the current situation cannot yet be said to be sufficient.

In addition, microfabrication using a resist composition is not only directly used for producing integrated circuits but also has been applied in recent years for producing a so-called imprint mold structure (for example, JP2008-162101A). Therefore, to sufficiently respond to these applications, an important problem has come about in forming an ultrafine pattern (for example, line width of 50 nm or less) in a state in which high sensitivity and high resolution are satisfied at the same time.

SUMMARY OF THE INVENTION

An object of the present invention is to provide a chemical amplification resist composition (in particular, a negative chemical amplification resist composition) able to form an ultrafine pattern (for example, a line width of 50 nm or less) in a state in which high PED stability, superior PEB temperature dependency, high sensitivity and high resolution (for example, high resolving power, superior pattern shape and small line edge roughness (LER)) are satisfied at the same time. Another object of the present invention is to provide a resist film using the chemical amplification resist composition, a resist-coated mask blank, a method of forming a photomask and a pattern, and a method of manufacturing an electronic device and the electronic device.

As a result of intensive studies, the present inventors have found that the object can be attained by a chemical amplification resist composition containing an acid generator with a specific structure and a compound including a phenolic hydroxyl group.

Specifically, the present invention includes the following.

(1) A chemical amplification resist composition including (A) a compound including a triarylsulfonium cation having one or more fluorine atoms and capable of generating an acid with a volume of 240 Å$^3$ or higher by irradiation of active rays or radiation; and (B) a compound including a phenolic hydroxyl group.

(2) The chemical amplification resist composition according to (1), in which the compound (A) is a compound including a triarylsulfonium cation having three or more fluorine atoms.

(3) The chemical amplification resist composition according to (2), wherein each of the three aryl groups in the triarylsulfonium cation of compound (A) includes one or more fluorine atoms.

(4) The chemical amplification resist composition according to (2) or (3), wherein a benzene ring configuring at least one aryl group from the three aryl groups in the triarylsulfonium cation of the compound (A) is directly bonded to at least one fluorine atom of the three or more fluorine atoms included in the compound (A).

(5) The chemical amplification resist composition according to any one of (1) to (4), wherein the compound (B) is a resin in which solubility with respect to an alkali developer increases due to the action of an acid.

(6) The chemical amplification resist composition according to any one of (1) to (4), further comprising (C) an acid crosslinking compound.

(7) The chemical amplification resist composition according to (6), wherein the compound (C) is a compound having two or more of a hydroxymethyl group or an alkoxymethyl group in the molecule.

(8) The chemical amplification resist composition according to any one of (1) to (7), wherein the compound (B) is a resin including a repeating unit represented by the following General Formula (1).

[Chem. 1]

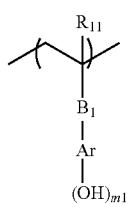

(1)

wherein, in General Formula 1, $R_{11}$ represents a hydrogen atom, a methyl group or a halogen atom.

$B_1$ represents a single bond or a divalent linking group.

Ar represents an aromatic ring.

m1 represents an integer of 1 or more.

(9) The chemical amplification resist composition according to any one of (1) to (8), wherein the composition is a chemical amplification resist composition for electron beam or extreme ultraviolet light exposure.

(10) A resist film formed of the chemical amplification resist composition according to any one of (1) to (9).

(11) A resist-coated mask blank coated with the resist film according to (10).

(12) A photomask obtained by exposing and developing the resist-coated mask blank according to [11].

(13) A method of forming a pattern comprising exposing the resist film according to (10) and developing the exposed film.

(14) A method for forming a pattern comprising exposing the resist-coated mask blank according to (11), and developing the exposed mask blank.

(15) A method of manufacturing an electronic device, including the method of forming a pattern according to (13) or (14).

(16) An electronic device manufactured by the method of manufacturing an electronic device according to (15).

The present invention preferably further has the configuration described below.

(17) The chemical amplification resist composition according to (5), wherein the compound (B) is a resin including a repeating unit represented by the following General Formula (A).

[Chem. 2]

(A)

wherein, $R_{01}$, $R_{02}$ and $R_{03}$ each independently represent a hydrogen atom, an alkyl group, a cycloalkyl group, a halogen atom, a cyano group or an alkoxycarbonyl group. $Ar_1$ represents an aromatic ring group. Alternatively, $R_{03}$ and $Ar_1$ are an alkylene group, and may form a 5- or 6-membered ring with a —C—C— chain, by being bonded to each other.

Y each independently represents a structure represented by the following General Formula (B).

n represents an integer of 1 to 4.

[Chem. 3]

(B)

wherein, $L_1$ and $L_2$ each independently represent a hydrogen atom, an alkyl group, a cycloalkyl group, an aryl group or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group or an aldehyde group. Moreover, the cyclic aliphatic group and the aromatic ring group may contain a hetero atom.

Moreover, at least two of Q, M and $L_1$ may bond with each other to form a 5- or 6-membered ring.

(18) The chemical amplification resist composition according to (3) or (4), in which each benzene ring configuring an aryl group of the triarylsulfonium cation in the compound (A) is directly bonded to one or more fluorine atoms respectively.

According to the present invention, it is possible to provide a chemical amplification resist composition (in particular, a negative chemical amplification resist composition) able to form an ultrafine pattern (for example, a line width of 50 nm or less) in a state in which high PED stability, superior PEB temperature dependency, high sensitivity and high resolution (for example, high resolving power, superior pattern shape and small line edge roughness (LER)) are satisfied at the same time.

In addition, according to the present invention it is possible to provide a resist film, a resist-coated mask blank, a method of forming a photomask and a pattern, and a method of manufacturing an electronic device and the electronic device.

DESCRIPTION OF THE PREFERRED EMBODIMENTS

Hereinafter, embodiments of the present invention will be described in detail.

Meanwhile, in regard to the denotation of a group (atomic group) in the present specification, a denotation without specifying whether the group is substituted or unsubstituted implies that the group (atomic group) includes a group (atomic group) having no substituent as well as a group (atomic group) having a substituent. For example, the term "alkyl group" includes not only an alkyl group having no substituent (an unsubstituted alkyl group) but also an alkyl group having a substituent (a substituted alkyl group).

The term "active rays" or "radiation" as used in the present invention means, for example, a bright line spectrum of a mercury lamp, far ultraviolet rays represented by excimer laser light, extreme ultraviolet rays (EUV light), X-ray or an electron beam. Also, the term "light" as used in the present invention means active rays or radiation. Furthermore, unless stated otherwise, the term "exposure" as used herein includes not only exposure to a mercury lamp, far ultraviolet rays represented by excimer laser light, X-ray, EUV light, or the like, but also rendering with particle beams such as an electron beam and an ion beam.

The chemical amplification resist composition according to the present invention contains (A) a compound including a triarylsulfonium cation having one or more fluorine atoms and capable of generating an acid with a volume of 240 Å$^3$ or higher by irradiation of active rays or radiation; and (B) a compound including a phenolic hydroxyl group.

According to such a configuration, it is possible to provide a chemical amplification resist composition able to form an ultrafine pattern (for example, a line width of 50 nm or less) in a state in which high PED stability, superior PEB temperature dependency, high sensitivity and high resolution (for example, high resolving power, superior pattern shape and small line edge roughness (LER)) are satisfied at the same time. The reason for this is not clear; however, it is presumed to be as shown below.

According to the chemical amplification resist composition of the present invention, first, since a compound generating an acid with a volume of 240 Å$^3$ or higher by irradiation of active rays or radiation is used as an acid generator, it is possible to suppress acid excessively diffusing to unexposed portions. In so doing, resolution may be improved, and, in particular, LER can be lowered and sensitivity can be improved. In addition, for the same reason, in a case where an ultrafine (for example, a line width of 50 nm or less) pattern is formed, the PED (Post Exposure time Delay) stability improves, and PEB temperature dependency improves.

Here, the compound generating an acid with a volume of 240 Å$^3$ or higher by irradiation of active rays or radiation becomes an element lowering solubility with respect to the developer of the resist film due to the volume being large. In addition, in particular, in a case where the active rays or radiation are an electron beam or extreme ultraviolet light, a chemical amplification reaction is more apt to occur in the bottom portion of the resist film due to the influence of reflected light from the underlayer of the resist film.

Thus, with respect to the resist film obtained by a positive resist composition containing a large volume of acid generator as above, in particular in a case where exposure is performed using an electron beam or extreme ultraviolet light, the cross-sectional shape of the obtained pattern easily obtains a reverse tapered shape. In addition, with respect to the resist film obtained by a negative resist composition containing a large volume of acid generator as above, in particular in a case where exposure is performed using an electron beam or extreme ultraviolet light, the cross-sectional shape of the obtained pattern easily obtains a forward tapered shape.

In so doing, the inventors found that it is possible to improve the cross-sectional shape of the pattern by making the acid generator a compound including a triarylsulfonium cation having one or more fluorine atoms. Additionally, the present inventors found that the improvement in the cross-sectional shape of the pattern is particularly effective when forming an ultrafine (for example, a line width of 50 nm or less) pattern.

The reason for this is not entirely clear; however, it is thought to be as below.

(i) There is a tendency for solubility with respect to the developer of the resist film to improve when the interaction of a compound including a fluorine atom in the cation and photosensitive component is smaller than the interaction of a compound not including a fluorine atom in the cation and a photosensitive component. In so doing, in comparison with the bottom portion of the resist film, even in the central portion or surface layer portion of the resist film in which the reaction rate of the chemical amplification reaction is lower, the dissolution rate with respect to the developer rises, and the dissolution rate difference with respect to the developer in the film thickness direction of the resist film is lowered.

(ii) A compound including a fluorine atom in the cation has higher surface free energy than a compound not including a fluorine atom in the cation, and is easily unevenly distributed in the surface layer portion of the resist film. As a result, there is a tendency for the concentration of the acid generator in the surface portion of the resist film to improve, and in the surface layer portion of the resist layer, the reaction rate of the chemical amplification reaction is improved. In so doing, the dissolution rate difference with respect to the developer in the film thickness direction of the resist film is lowered.

Additionally, as described above, it is thought that this contributes to the improvement in resolving power and the lowering of the LER by improving the cross-sectional shape of the pattern.

Furthermore, in regard to the acid generator in the present invention, by including a triarylsulfonium cation having a fluorine atom with high electronegativity, electron movement within the acid generator molecule progresses easily, particularly in exposure using an electron beam or extreme ultraviolet light, and as a result, it is thought that sensitivity improves.

The chemical amplification resist composition according to the present invention is preferably used for electron beam or extreme ultraviolet light exposure.

The chemical amplification resist composition according to the present invention may be used as a positive resist composition, or may be used as a negative resist composition.

Each of the components of the chemical amplification resist composition of the present invention will be described below in detail.

(1)(A) A compound including a triarylsulfonium cation including one or more fluorine atoms, and capable of generating sulfonic acid with a volume of 240 Å$^3$ or higher through irradiation of active rays or radiation.

The chemical amplification resist composition of the present invention contains (A) a compound including a triarylsulfonium cation having one or more fluorine atoms and capable of generating an acid with a volume of 240 Å$^3$ or higher by irradiation of active rays or radiation (below, these compounds are referred to as "compound (A)").

Compound (A) is a compound including a triarylsulfonium cation including one or more fluorine atoms, and capable of generating an acid with a volume of 240 Å$^3$ or higher by irradiation of active rays or radiation, and is preferably a compound including a triarylsulfonium cation including three or more fluorine atoms. Each of the three aryl groups in the triarylsulfonium cation of compound (A) preferably includes one or more fluorine atoms.

In addition, a benzene ring configuring at least one aryl group in the triarylsulfonium cation of the compound (A) is preferably directly bonded to at least one fluorine atom of the three or more fluorine atoms included in the compound (A), and the benzene ring configuring at least one aryl group of the triarylsulfonium cation in compound (A) is more preferably directly bonded to all of the fluorine atoms included in compound (A).

Each of the benzene rings configuring the aryl group of the triarylsulfonium cation in compound (A) is particularly preferably directly bonded to one or more fluorine atoms, respectively.

The compound (A) of the present invention is preferably a compound represented by the following General Formula (1)

[Chem. 4]

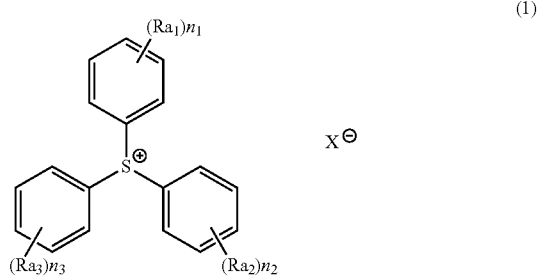

(1)

In General Formula (1), each of $R_{a1}$ and $R_{a2}$ independently represents a substituent.

$n_1$ and $n_2$ each independently represent an integer of 0 to 5.

$n_3$ represents an integer of 1 to 5.

$R_{a3}$ represents a group including a fluorine atom or one or more fluorine atoms.

$R_{a1}$ and $R_{a2}$ may be linked with each other to form a ring.

$X^-$ represents an organic anion.

Below, the sulfonium compound represented by General Formula (1) will be described in further detail.

Examples of the substituent of $R_{a1}$ and $R_{a2}$ are preferably an alkyl group, a cycloalkyl group, an alkoxy group, a cycloalkyloxy group, an alkoxy carbonyl group, an alkylsulfonyl group, a hydroxyl group, and a halogen atom (preferably a fluorine atom).

The alkyl group of $R_{a1}$ and $R_{a2}$ may be a linear alkyl group or a branched alkyl group. The alkyl group preferably has 1 to 10 carbon atoms, and examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these, a methyl group, an ethyl group, an n-butyl group, and a t-butyl group are particularly preferable.

Examples of the cycloalkyl group represented by $R_{a1}$ and $R_{a2}$ include a cyclic or polycyclic cycloalkyl group (preferably a cycloalkyl group having 3 to 20 carbon atoms). Examples thereof include cyclopropyl, cyclobutyl, cyclopentyl, cyclohexyl, cycloheptyl, cyclooctyl, cyclododecanyl, cyclopentenyl, cyclohexenyl, and cyclooctadienyl groups. Among these, cyclopropyl, cyclopentyl, cyclohexyl, cycloheptyl, and cyclooctyl groups are particularly preferable.

Examples of the alkyl group portion of the alkoxy group represented by $R_{a1}$ and $R_{a2}$ include the examples provided above as the alkyl group represented by $R_{a1}$ and $R_{a2}$. As the alkoxy group, a methoxy group, an ethoxy group, an n-propoxy group, and an n-butoxy group are particularly preferable.

Examples of the cycloalkyl group portion of the cycloalkyloxy group represented by $R_{a1}$ and $R_{a2}$ include the examples provided above as the cycloalkyl group represented by $R_{a1}$ and $R_{a2}$. As the cycloalkyloxy group, a cyclopentyloxy group and a cyclohexyloxy group are particularly preferable.

Examples of the alkoxy group portion of the alkoxy carbonyl group represented by $R_{a1}$ and $R_{a2}$ include the examples provided above as the alkoxy group represented by $R_{a1}$ and $R_{a2}$. As the alkoxy carbonyl group, a methoxycarbonyl group, an ethoxycarbonyl group, and an n-butoxycarbonyl group are particularly preferable.

Examples of the alkyl group portion of the alkylsulfonyl group represented by $R_{a1}$ and $R_{a2}$ include the examples provided above as the alkyl group represented by $R_{a1}$ and $R_{a2}$. In addition, examples of the cycloalkyl group portion of the cycloalkylsulfonyl group represented by $R_{a1}$ and $R_{a2}$ include the examples provided above as the cycloalkyl group represented by $R_{a1}$ and $R_{a2}$. As the alkylsulfonyl group or the cycloalkylsulfonyl group, a methane sulfonyl group, an ethane sulfonyl group, an n-propane sulfonyl group, an n-butane sulfonyl group, a cyclopentane sulfonyl group, and a cyclohexane sulfonyl group are particularly preferable.

The respective groups represented by $R_{a1}$ and $R_{a2}$ may further have a substituent. Examples of the substituent include a halogen atom such as a fluorine atom (preferably a fluorine atom), a hydroxyl group, a carboxyl group, a cyano group, a nitro group, an alkoxy group, a cycloalkyloxy group, an alkoxyalkyl group, a cycloalkyloxyalkyl group, an alkoxy carbonyl group, a cycloalkyloxycarbonyl group, an alkoxycarbonyloxy group, and a cycloalkyloxycarbonyloxy group.

The alkoxy group may be linear or may be branched. Examples of the alkoxy group include a methoxy group, an ethoxy group, an n-propoxy group, an i-propoxy group, an n-butoxy group, a 2-methylpropoxy group, a 1-methylpropoxy group, a t-butoxy group, and the like having 1 to 20 carbon atoms.

Examples of the cycloalkyloxy group include a cyclopentyloxy group, a cyclohexyloxy group, and the like having 3 to 20 carbon atoms.

The alkoxyalkyl group may be linear or may be branched. Examples of the alkoxyalkyl group include a methoxymethyl group, an ethoxymethyl group, a 1-methoxyethyl group, a 2-methoxyethyl group, a 1-ethoxyethyl group, a 2-ethoxyethyl group, and the like having 2 to 21 carbon atoms.

Examples of the cycloalkyloxyalkyl group include a cyclopentyloxyethyl group, a cyclopentyloxypentyl group, a cyclohexyloxyethyl group, a cyclohexyloxypentyl group, and the like having 4 to 21 carbon atoms.

The alkoxycarbonyl group may be linear or may be branched. Examples of the alkoxy carbonyl group include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like having 2 to 21 carbon atoms.

Examples of the cycloalkyloxycarbonyl group include a cyclopentyloxycarbonyl group, a cyclohexyloxycarbonyl group, and the like having 4 to 21 carbon atoms.

The alkoxycarbonyloxy group may be linear or may be branched. Examples of the alkoxycarbonyloxy group include a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, and the like having 2 to 21 carbon atoms.

Examples of the cycloalkyloxycarbonyloxy group include a cyclopentyloxycarbonyloxy group, a cyclohexyloxycarbonyloxy group, and the like having 4 to 21 carbon atoms.

As described above, $R_{a1}$ and $R_{a2}$ may be linked with each other to form a ring. In this case, it is preferable that the $R_{a1}$ and $R_{a2}$ form a single bond or a divalent linking group, and examples of the a divalent linking group include —COO—, —OCO—, —CO—, —O—, —S—, —SO—, —SO$_2$—, an alkylene group, a cycloalkylene group, and alkenylene group or a combination of two or more kinds thereof, and these groups preferably have 20 or fewer carbon atoms in total. In a case where $R_{a1}$ and $R_{a2}$ link together to form a ring, $R_{a1}$ and $R_{a2}$ preferably form —COO—, —OCO—, —CO—, —O—, —S—, —SO—, —SO$_2$— or a single bond, more preferably form —O—, —S— or a single bond, and particularly preferably form a single bond.

$R_{a3}$ is a fluorine atom or a group including a fluorine atom. Examples of groups including a fluorine atom include groups in which a fluorine atom is substituted for an alkyl group, a cycloalkyl group, an alkoxy group, a cycloalkyloxy group, an alkoxy carbonyl group and an alkylsulfonyl group as $R_{a1}$ and $R_{a2}$. Suitable examples thereof include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, and among these $CF_3$ is more suitable.

$R_{a3}$ is preferably a fluorine atom or $CF_3$, and more preferably a fluorine atom.

In addition, along with $n_1$ and $n_2$ being one or more, $R_{a1}$, $R_{a2}$ and $R_{a3}$ are preferably each independently a fluorine atom or $CF_3$, and more preferably a fluorine atom.

$n_1$ and $n_2$ are each independently an integer of 0 to 5, preferably an integer of 0 to 2, and more preferably 0 or 1.

$n_3$ is an integer of 1 to 5, preferably 1 or 2, and more preferably 1.

Specific examples of such a cation in General Formula (1) are provided below.

[Chem. 5]

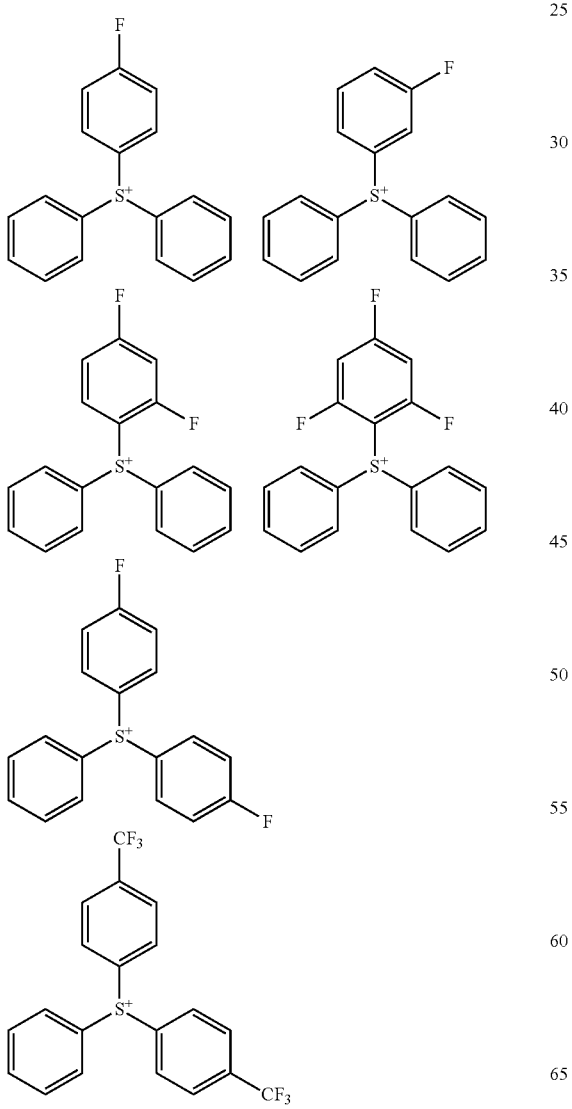

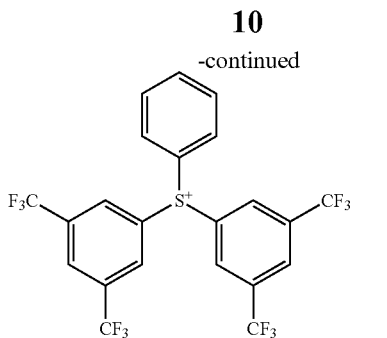

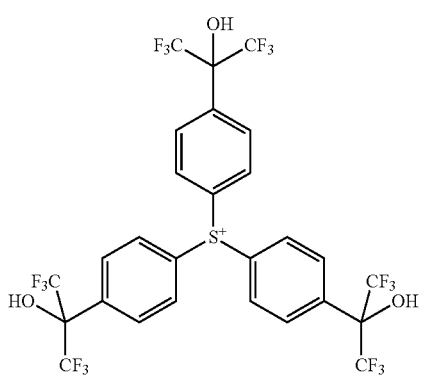

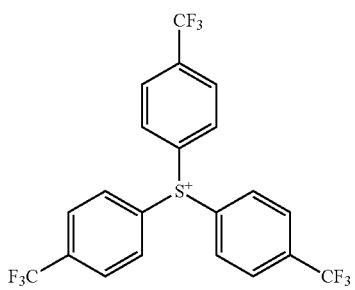

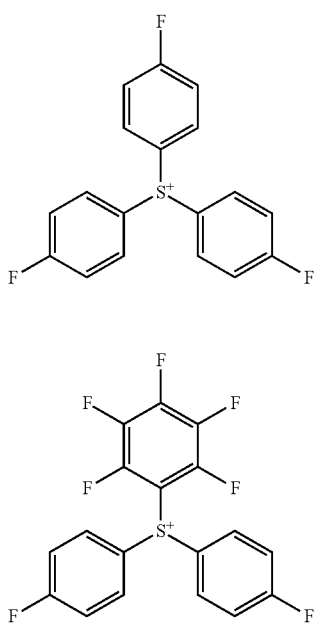

-continued
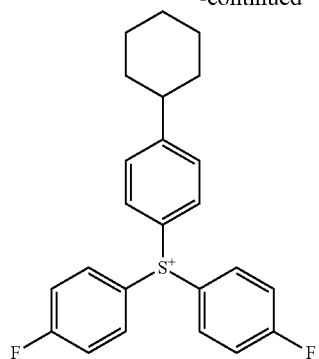
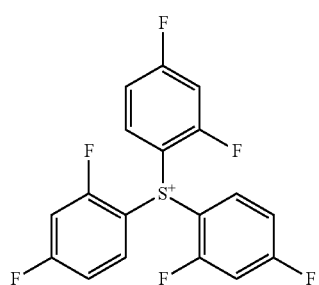
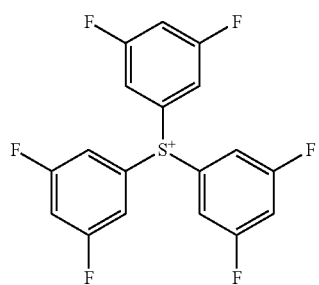
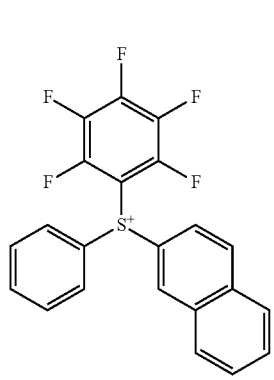
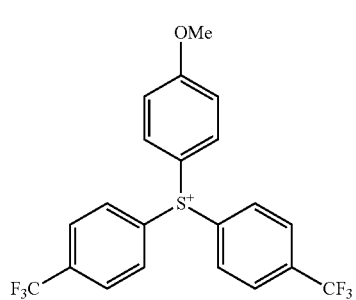
-continued
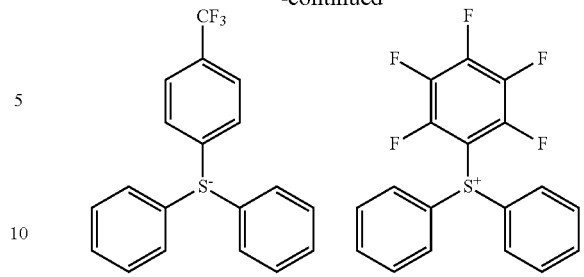
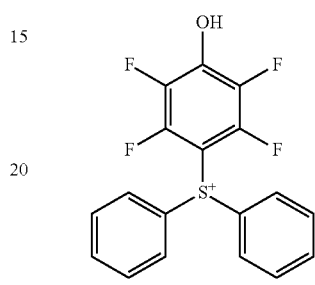
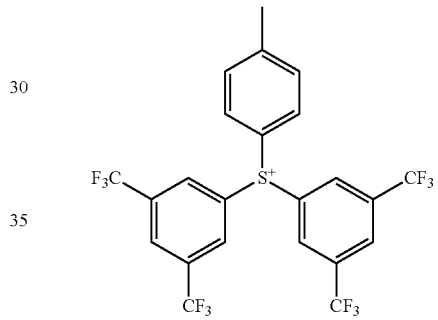
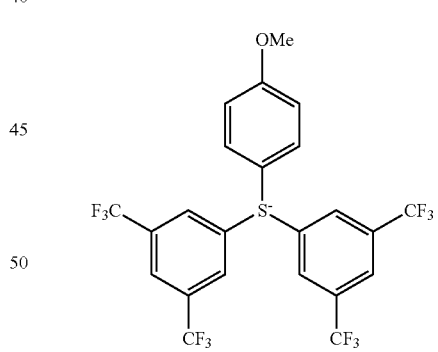
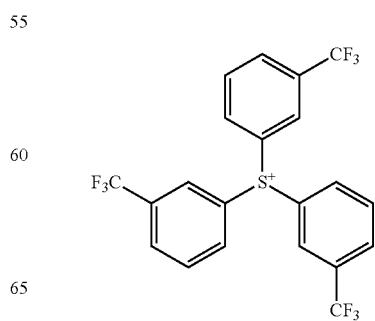

[Chem. 6]
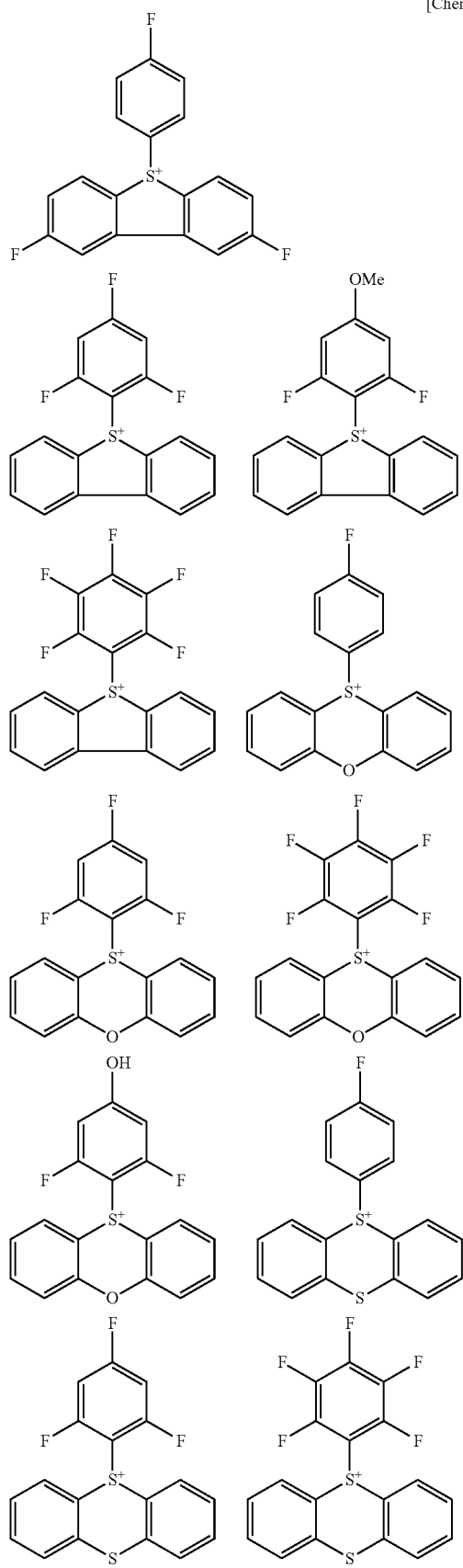
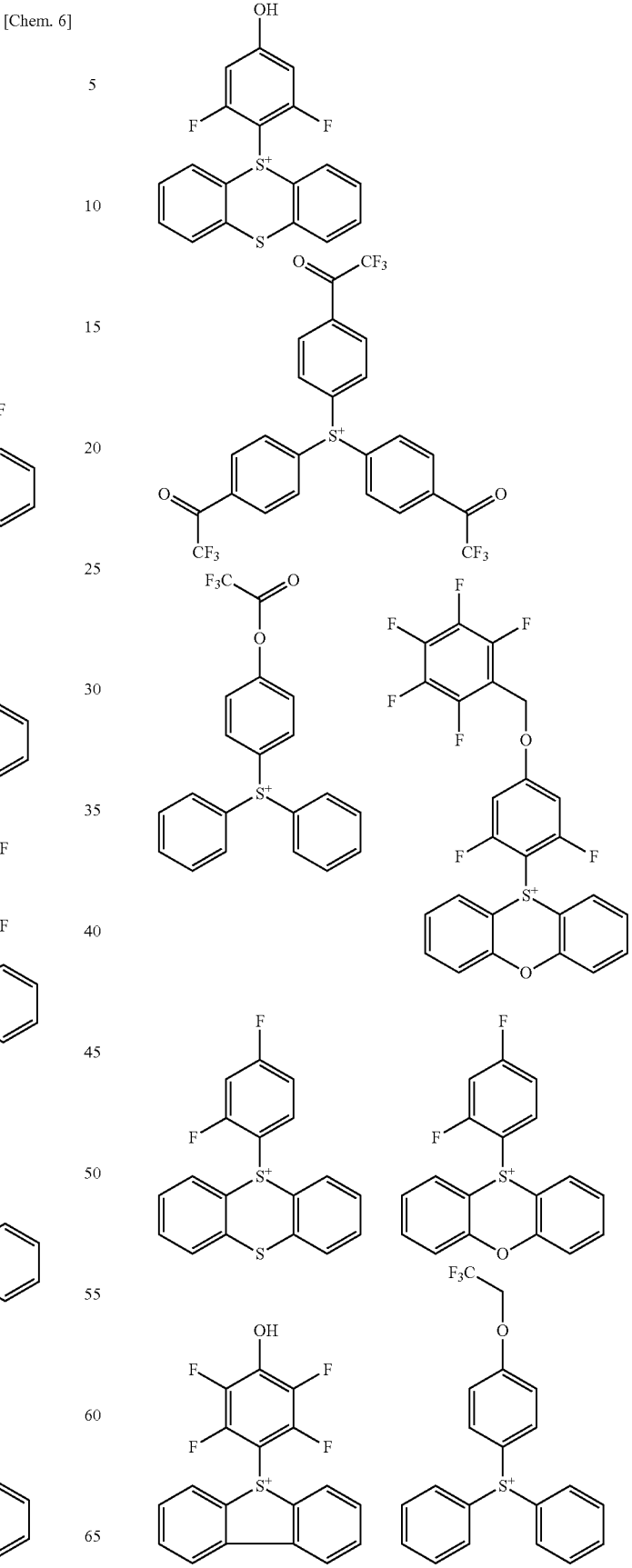

In the present invention, from the viewpoint of satisfactory resolution by suppressing the diffusion to unexposed portions of acid generated by exposure, the compound (A) generating the acid is a compound generating acid with a volume with of size of 240 Å$^3$ or greater by irradiation of active rays or radiation, is preferably a compound generating acid with a volume with a size of 300 Å$^3$ or greater, is more preferably a compound generating acid with a volume with a size of 350 Å$^3$ or greater and is further preferably a compound generating acid with a volume with a size of 400 Å$^3$ or greater. However, from the viewpoints of sensitivity and coating solvent solubility, the volume is preferably 2000 Å$^3$ or less, and more preferably 1500 Å$^3$ or less. The value of the volume was determined by using "WinMOPAC" manufactured by Fujitsu, Ltd. That is, first, the chemical structure of the acid related to each example is input, subsequently the most stable conformation of each acid is determined by calculation of the molecular force field by using an MM3 method using the chemical structure as the initial structure, and then molecular orbit calculation is carried out by using a PM3 method with respect to this most stable conformation. Thereby, the "accessible volume" of each acid can be calculated.

Below, in the present invention, examples of particularly preferable acid generators will be provided below. Meanwhile, for some of the examples, the calculated values of volume are indicated together (unit: Å$^3$). Meanwhile, the calculated value determined herein is the volume value of an acid with a proton bonded to the anion moiety.

Examples of the organic anion of X$^-$ in the General Formula (1) include a sulfonate anion, a carboxylate anion, a bis(alkylsulfonyl)amide anion, and a tris(alkylsulfonyl)methide anion. The organic anion is preferably represented by the following General Formulae (9), (10) or (11), and more preferably represented by the following General Formula (9).

[Chem. 7]

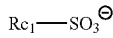
(9)

(10)

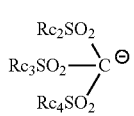
(11)

In the above General Formulae (9), (10) and (11), $R_{c1}$, $R_{c2}$, $R_{c3}$ and $R_{c4}$ each represent an organic group.

The organic anion of X$^-$ corresponds to the sulfonic acid, imide acid or methide acid, which are acids generated by irradiation of active rays or a radiation such as an electron beam or extreme ultraviolet light.

Examples of the organic group of $R_{c1}$ to $R_{c4}$ include an alkyl group, a cycloalkyl group, an aryl group, and groups having a plural number of these groups linked together. Among these organic groups, more preferred examples include an alkyl group in which the 1-position is substituted with a fluorine atom or a fluoroalkyl group; a cycloalkyl group substituted with a fluorine atom or a fluoroalkyl group; and a phenyl group substituted with a fluorine atom or a fluoroalkyl group. A plural number of the organic groups of $R_{c2}$ to $R_{c4}$ may be linked together to form a ring, and the group in which a plural number of these organic groups are linked is preferably an alkylene group substituted with a fluorine atom or a fluoroalkyl group. When the organic group has a fluorine atom or a fluoroalkyl group, the acidity of the acid generated by light irradiation increases, and sensitivity is enhanced. However, it is preferable that terminal groups do not contain fluorine atoms as the substituent.

In addition, preferable examples of X$^-$ include the sulfonate anion represented by the General Formulae (SA1) and (SA2) below.

[Chem. 8]

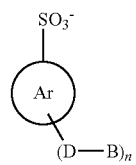
(SA1)

In Formula (SA1),

Ar represents an aryl group, and may further have a substituent other than the sulfonate anion and -(D-B) group.

n represents an integer of 0 or more. n is preferably from 1 to 4, more preferably from 2 to 3, and most preferably 3.

D represents a single bond or a divalent linking group. Examples of the divalent linking group include an ethyl group, a thioethyl group, a carbonyl group, a sulfoxide group, a sulfon group, a sulfonic acid ester group, and an ester group and groups formed by a combination of two or more types thereof.

B represents a hydrocarbon group.

Preferably, D is a single bond, and B is an aliphatic hydrocarbon structure.

[Chem. 9]

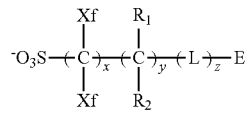
(SA2)

In Formula (SA2),

Xf's each independently represent a fluorine atom or an alkyl group substituted with at least one fluorine atom.

$R_1$ and $R_2$ each independently represent a hydrogen atom, a fluorine atom or an alkyl group, and in a case of a plurality being present, $R_1$ and $R_2$ may be the same as each other, or may be different from each other.

L's represents a divalent linking group, and in a case of a plurality being present, L's may be the same as each other, or may be different from each other.

E represents a cyclic organic group.

x represents an integer of 1 to 20, y represents an integer of 0 to 10, and z represents an integer of 0 to 10.

First, the sulfonate anion represented by Formula (SA1) will be described in detail.

In Formula (SA1), Ar is preferably an aromatic ring having 6 to 30 carbon atoms. Specifically, Ar is, for example, a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring. Among these, from the viewpoints of establishing both an improvement in roughness and increased sensitivity, a benzene ring, a naphthalene ring or an anthracene ring is preferable, and a benzene ring is more preferable.

In a case where Ar has a substituent other than the sulfonate anion and the -(D-B) group, examples of the substituent include, for example, a fluorine atom, a chlorine atom, an iodine atom and a bromine atom or the like, a hydroxyl group, a carboxyl group, as well as a sulfonic acid group.

In Formula (SA1), D is preferably a single bond, or an ether group or an ester group. More preferably, D is a single bond.

In the formula (SA1), B is, for example, an alkyl group (preferably an alkyl group having 1 to 20 carbon atoms), an alkenyl group (preferably an alkenyl group having 2 to 20 carbon atoms), an alkynyl group (preferably an alkynyl group having 2 to 20 carbon atoms), an aryl group (preferably an aryl group of 6 to 30 carbon atoms), or a cycloalkyl group (preferably a cycloalkyl group having 3 to 20 carbon atoms).

B is preferably an alkyl group or cycloalkyl group, and still more preferably a cycloalkyl group. The alkyl group, alkynyl group, alkenyl group, aryl group or cycloalkyl group of B may include a substituent.

The alkyl group of B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethypentyl group and a 2-ethylhexyl group.

Examples of the alkenyl group of B include a vinyl group, a propenyl group, and a hexenyl group.

Examples of the alkynyl group of B include a propynyl group and a hexynyl group.

Examples of the aryl group of B include a phenyl group and a p-tolyl group.

The cycloalkyl group of B may be a monocyclic cycloalkyl group or may be a polycyclic cycloalkyl group. Examples of the monocyclic cycloalkyl group include a cyclopropyl group, a cyclobutyl group, a cyclopentyl group, a cyclohexyl group, a cycloheptyl group and a cyclooctyl group. Examples of a polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group and a pinenyl group.

In the case of an alkyl group, an alkenyl group, an alkynyl group, an aryl group or a cycloalkyl group of B having a substituent, examples of the substituent are given below.

That is, examples of the substituent include halogen atoms such as a fluorine atom, a chlorine atom, a bromine atom, and an iodine atom; an alkoxy group such as a methoxy group, an ethoxy group and a tert-butoxy group; an aryloxy group such as a phenoxy group and a p-tolyloxy group; an alkylthioxy group such as a methylthioxy group, an ethylthioxy group and a tert-butylthioxy group; an arylthioxy group such as a phenylthioxy group and a p-tryloxy group; an alkoxy carbonyl group such as a methoxycarbonyl group a butoxycarbonyl group and a phenoxycarbonyl group; an acetoxy group; a straight chain alkyl group such as a methyl group, an ethyl group, a propyl group, a butyl group, a heptyl group, a hexyl group, a dodecyl group, and a 2-ethylhexyl group; a branched alkyl group; a cycloalkyl group such as a cyclohexyl group; an alkenyl group such as a vinyl group, a propenyl group and hexenyl group; an acetylene group; an alkynyl group such as a propynyl group, and a hexynyl group; an aryl group such as a phenyl group and a tolyl group; a hydroxyl group; carboxyl group; a sulfonic acid group; as well as a carbonyl group. Among these, from the viewpoints of establishing both an improvement in roughness and increased sensitivity, a straight chain alkyl group and a branched alkyl group are preferable.

Next, the sulfonate anion represented by Formula (SA2) will be described in detail.

In Formula (SA2), Xf is a fluorine atom, or an alkyl group substituted with at least one fluorine atom. The alkyl group preferably contains 1 to 10 carbon atoms, and more preferably 1 to 4 carbon atoms. In addition, the alkyl group in which a fluorine atom is substituted is preferably a perfluoroalkyl group.

Xf is preferably a fluorine atom or a perfluoroalkyl group having 1 to 4 carbon atoms. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Among these, a fluorine atom or $CF_3$ is preferable, and a fluorine atom is most preferable.

In formula (SA2), $R_1$ and $R_2$ each independently represent a hydrogen atom, a fluorine atom, or an alkyl group. The alkyl group may include a substituent (preferably a fluorine atom), and is preferably an alkyl group having 1 to 4 carbon atoms. The alkyl group of $R_1$ and $R_2$ which may include a substituent is preferably a perfluoroalkyl group having 1 to 4 carbon atoms. Specifically, the alkyl group of $R_1$ and $R_2$ including a substituent may be $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, $CF_3$ is preferable.

In formula (SA2), x is preferably 1 to 8, and more preferably 1 to 4. y is preferably 0 to 4, and more preferably 0. z is preferably 0 to 8, and more preferably 0 to 4.

In Formula (SA2), L represents a single bond or a divalent linking group. Examples of the divalent linking group include —COO—, —OCO—, —CO—, —O—, —S—, —SO—, —SO$_2$—, an alkylene group, a cycloalkylene group, an alkenylene group or a combination of two or more types thereof and these groups preferably have 20 or fewer carbon atoms in total. Among these, —COO—, —OCO—, —CO—, —O—, —S—, —SO— or —SO$_2$— are preferable, and —COO—, —OCO— or —SO$_2$ are more preferable.

In Formula (SA2), E represents a cyclic organic group. Examples of E include a cyclic aliphatic group, an aryl group and a heterocyclic group.

The cyclic aliphatic group of E preferably has 20 or fewer carbon atoms in total, and may have a monocyclic structure or may have a polycyclic structure. The cyclic aliphatic group including a monocyclic structure is preferably a monocyclic cycloalkyl group, such as a cyclopentyl group, cyclohexyl group and cyclooctyl group. The cyclic aliphatic group including a polycyclic structure is preferably a polycyclic cycloalkyl group, such as a norbornyl group, a tricyclodecanyl group, a tetracyclodecanyl group, a tetracyclododecanyl group and an adamantyl group. In particular, in a case where a cyclic aliphatic group having a bulky structure of a 6- or more membered ring is employed as E, diffusibility in the film in the PEB (post-exposure heating) process is suppressed and it is possible to further improve resolving power and EL (exposure latitude).

The aryl group of E preferably has 20 or fewer carbon atoms in total, and is, for example, a benzene ring, a naphthalene ring, a phenanthrene ring or an anthracene ring.

The heterocyclic group of E preferably has 20 or fewer carbon atoms in total, and may have aromaticity, or may not have aromaticity. The hetero atom included in this group is preferably a nitrogen atom or an oxygen atom. Specific examples of the heterocyclic structure include a furan ring, a thiophene ring, a benzofuran ring, a benzothiophene ring, a dibenzofuran ring, a dibenzothiophene ring, a pyridine ring, a pyperidine ring and a morpholine ring. Among these, a furan ring, a thiophene ring, a pyridine ring, a piperidine ring and a morpholine ring are preferred.

E may include a substituent. Examples of the substituent include an alkyl group (may be any of a straight chain, branched or cyclic, 1 to 12 carbon atoms is preferable), an aryl group (6 to 14 carbon atoms is preferred), a hydroxyl group, an alkoxy group, an ester group, an amido group, a urethane group, a ureido group, a thioether group, a sulfonamido group, and a sulfonic acid ester group.

Below, specific examples of the acid generated by compound (A) due to irradiation of active rays or radiation will be shown below, but the present invention is not limited thereto.

Specific examples of the acid generated will be shown below, but the present invention is not limited thereto.

[Chem. 10]

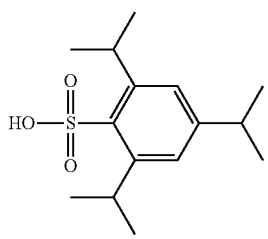

303 Å$^3$

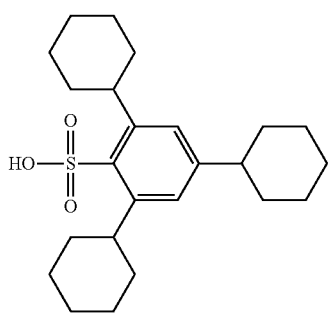

437 Å$^3$

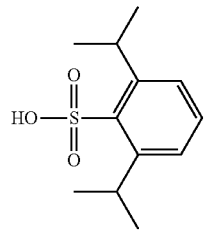

244 Å$^3$

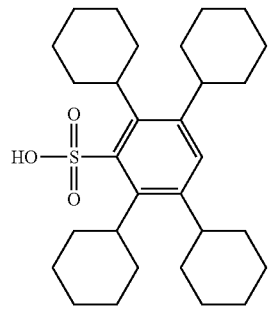

529 Å$^3$

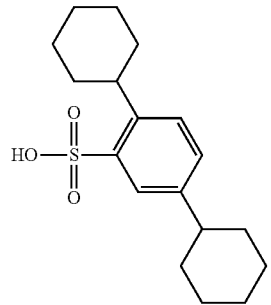

336 Å$^3$

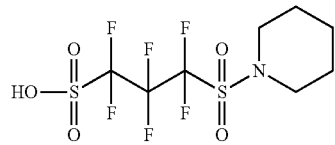

244 Å$^3$

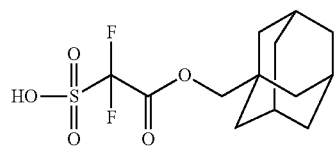

271 Å$^3$

-continued
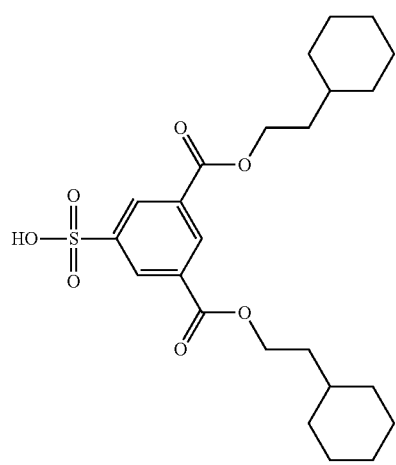
457 Å³
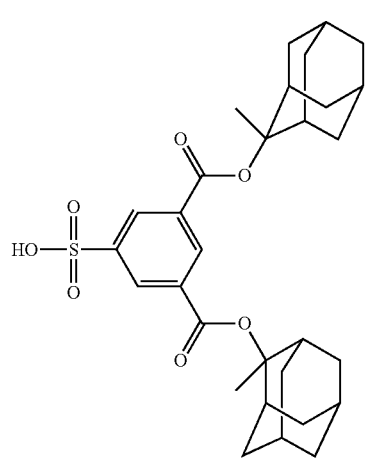
511 Å³
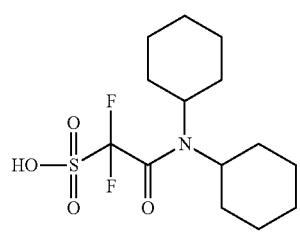
311 Å³
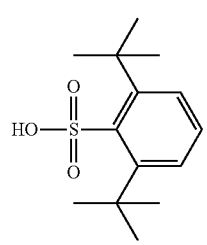
280 Å³
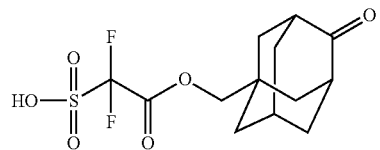
266 Å³
-continued
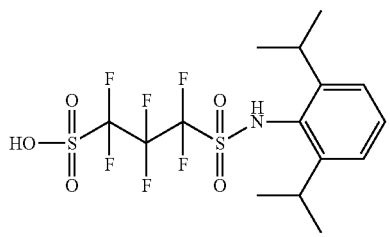
339 Å³
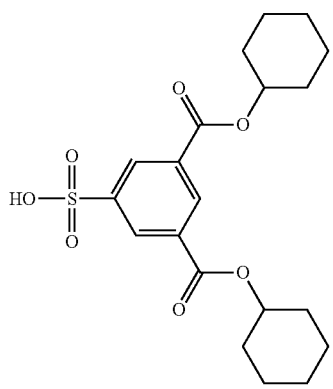
380 Å³
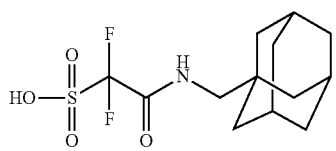
277 Å³
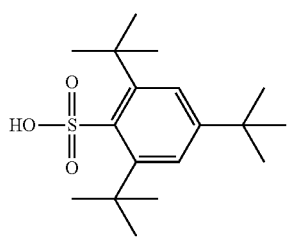
357 Å³
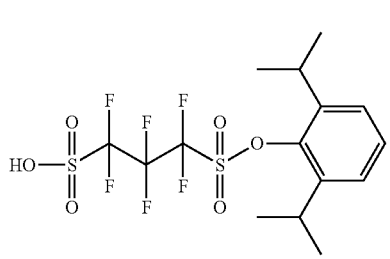
347 Å³
[Chem. 11]
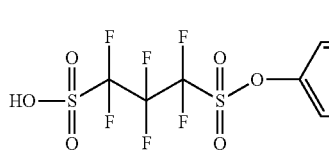
380 Å³

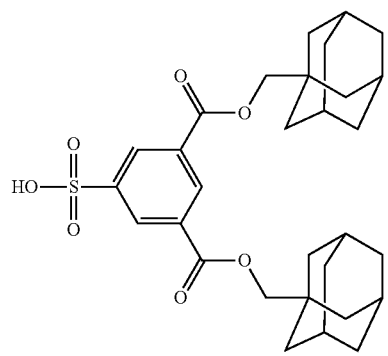 519 Å³
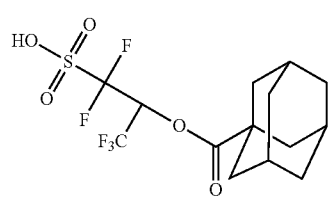 291 Å³
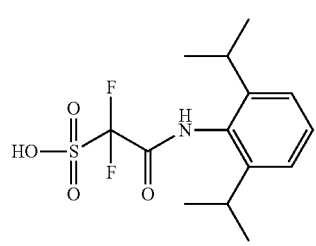 297 Å³
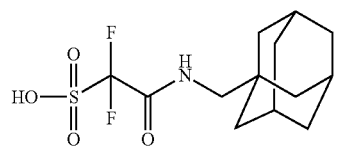 277 Å³
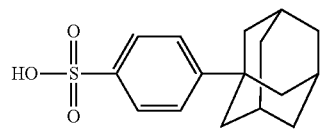 281 Å³
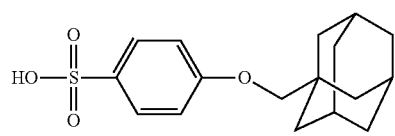 310 Å³
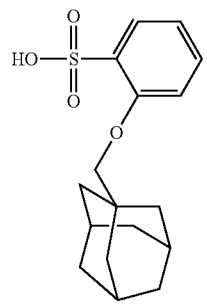 309 Å³
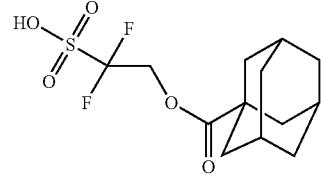 270 Å³
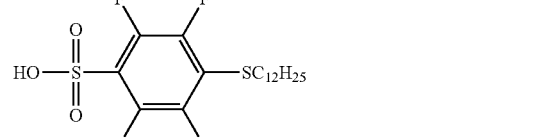 393 Å³
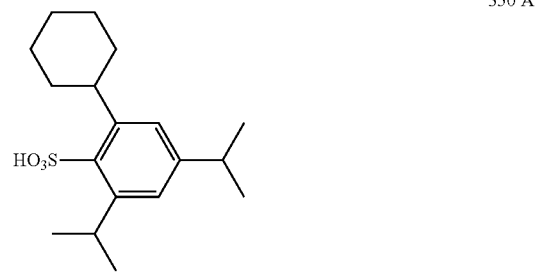 350 Å³
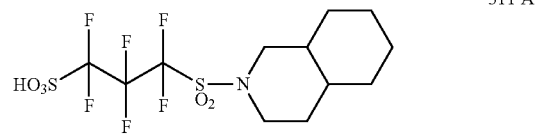 311 Å³
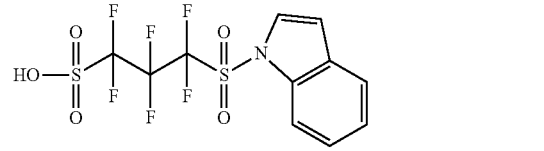 250 Å³
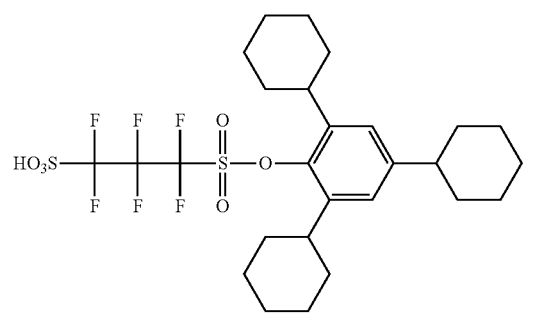 535 Å³
 290 Å³
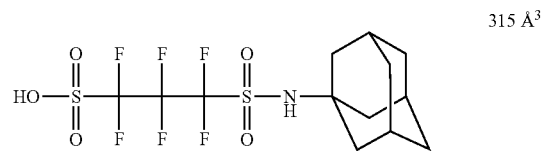 315 Å³

The content of the acid generator in the composition is preferably from 1 mass % to 40 mass %, more preferably from 2 mass % to 30 mass %, and still more preferably from 3 mass % to 25 mass %, based on the total solid content of the chemical amplification resist composition.

One kind of the acid generator can be used alone, or two or more kinds can be used in combination.

(2) (B) Compound Including Phenolic Hydroxyl Group

The composition of the present invention contains compound (B) including a phenolic hydroxyl group (hereinafter, referred to as compound (B)).

The phenolic hydroxyl group in the present invention is a group in which the hydrogen atom of an aromatic ring group is substituted with a hydroxyl group. The aromatic ring of the aromatic group is a monocyclic or polycyclic aromatic ring, and examples thereof include a benzene ring and a naphthalene ring.

The compound (B) including a phenolic hydroxyl group is not particularly limited as long as it includes a phenolic hydroxyl group, and may be a comparatively low molecular compound such as a molecular resist, or may be resin. Moreover, a low molecular weight cyclic polyphenol compound disclosed in, for example, JP2009-173623A and JP2009-173625A may be used.

From the viewpoint of reactivity and sensitivity, the compound (B) including a phenolic hydroxyl group is preferably resin.

In a case where the compound (B) including a phenolic hydroxyl group of the present invention is resin, the resin preferably contains a repeating unit including at least one type of phenolic hydroxyl group. The repeating unit including a phenolic hydroxyl group is not particularly limited; however, the repeating unit represented by the following General Formula (1) is preferable.

[Chem. 12]

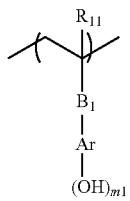

(1)

In General Formula 1, $R_{11}$ represents a hydrogen atom, a methyl group which may include a substituent or a halogen atom.

$B_1$ represents a single bond or a divalent linking group.

Ar represents an aromatic ring.

m1 represents an integer of 1 or more.

Examples of the methyl group which may be substituted for $R_{11}$ include a trifluoromethyl group and a hydroxymethyl group.

$R_{11}$ is preferably a hydrogen atom or a methyl group, and a hydrogen atom is preferred from the viewpoint of developability.

The divalent linking group of $B_1$ is preferably a carbonyl group, an alkylene group (preferably having 1 to 10 carbon atoms, and more preferably 1 to 5 carbon atoms), a sulfonyl group (—S(=O)$_2$—), —O—, —NH—, or divalent groups combining these.

$B_1$ preferably represents a single bond, a carbonyloxy group (—C(=O)—O—) or —C(=O)—NH—; and more preferably represents a single bond or a carbonyloxy group (—C(=O)—O—), and it is particularly preferable for B to represent a single bond, from the viewpoint of enhancing dry etching resistance.

The aromatic ring of Ar is a monocyclic or polycyclic aromatic ring, and examples thereof include aromatic hydrocarbon rings having 6 to 18 carbon atoms which may be substituted, such as a benzene ring, a naphthalene ring, an anthracene ring, a fluorene ring, and a phenanthrene ring; and aromatic heterocycles containing heterocycles such as, a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring and a naphthalene ring are preferred from the viewpoint of resolution, and a benzene ring is most preferred from the viewpoint of sensitivity.

m1 is preferably an integer of 1 to 5, and most preferably 1. When m1 is 1 and Ar is a benzene ring, the substitution position of —OH may be the para-position, the meta-position or the ortho-position with respect to the bonding position of the benzene ring with $B_1$ (when $B_1$ is a single bond, the polymer main chain). However, from the viewpoint of cross-linking reactivity, the para-position and the meta-position are preferred, and the para-position is more preferred.

The aromatic ring of Ar may have a substituent other than the group represented by —OH, and examples of the substituent include an alkyl group, a cycloalkyl group, a halogen atom, a hydroxyl group, an alkoxy group, a carboxyl group, an alkoxy carbonyl group, an alkylcarbonyl group, an alkylcarbonyloxy group, an alkylsulfonyloxy group, and an arylcarbonyl group.

The repeating unit having a phenolic hydroxyl group is more preferably a repeating unit represented by the following General Formula (2), from the viewpoints of cross-linking reactivity, developability, and dry etching resistance.

[Chem. 13]

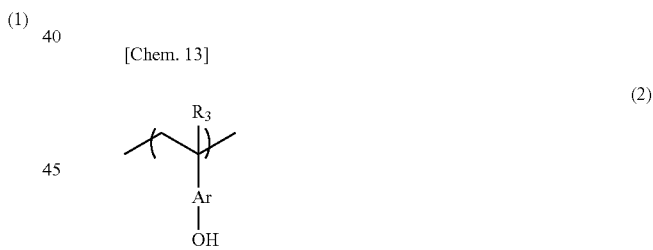

(2)

In General Formula (2), $R_3$ represents a hydrogen atom or a methyl group; Ar represents an aromatic ring.

$R_3$ represents a hydrogen atom or a methyl group, and is preferably a hydrogen atom in view of developability.

Ar in General Formula (2), has the same meaning as Ar in General Formula (1), and the preferable range is the same. The repeating unit represented by the General Formula (2) is preferably a repeating unit derived from hydroxystyrene (that is, a repeating unit represented by the General Formula (2), wherein $R_3$ represents a hydrogen atom; and Ar represents a benzene ring), from the viewpoint of sensitivity.

The compound (B) as a resin may be configured from only a repeating unit including a phenolic hydroxyl group as described above. The compound (B) as a resin may include a repeating unit as described later other than the repeating unit including a phenolic hydroxyl group as described above. In this case, the content of the repeating unit including a phenolic hydroxyl group is preferably 10 mol % to 98 mol % with respect to all repeating units of the compound (B) as a resin, more preferably 30 mol % to 97 mol % and still more preferably 40 mol % to 95 mol %. Thereby, particularly in the case where the resist film is a thin film (for example, when the thickness of the resist film is 10 nm to 150 nm), the dissolution rate of the exposed areas in the resist film of the present invention formed by using the compound (B) in an alkali developer can be more securely decreased (that is, the dissolution rate of the resist film using the compound (B) can be more reliably controlled to be optimal). As a result, the sensitivity can be more reliably increased.

Examples of the repeating unit having a phenolic hydroxyl group will be described below, but the examples are not intended to be limited to these.

[Chem. 14]

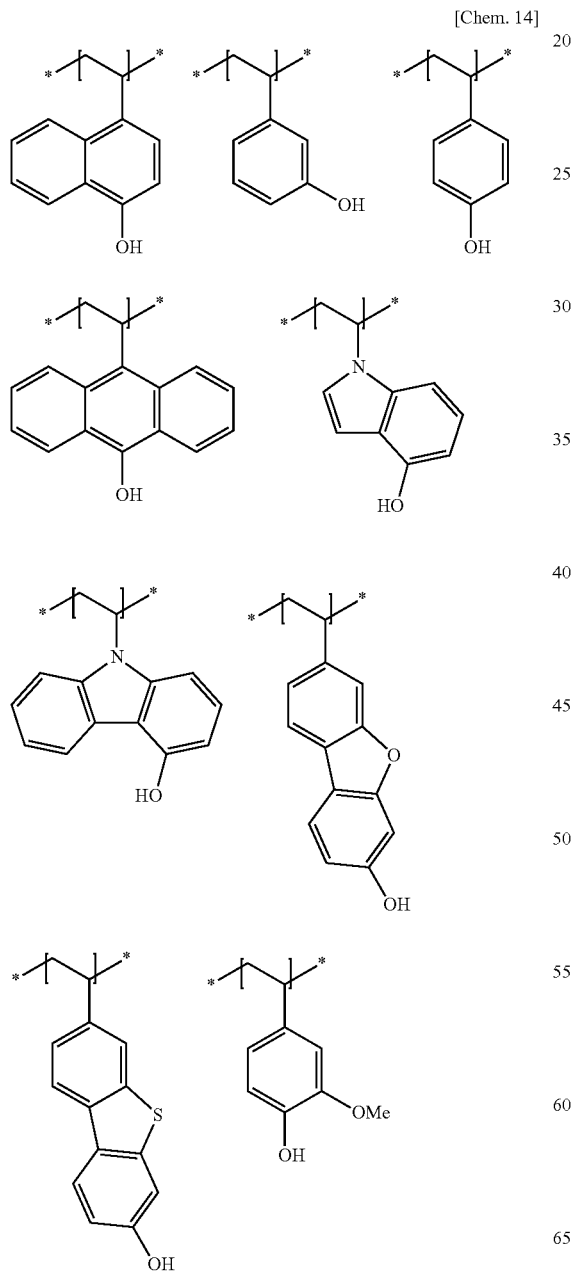

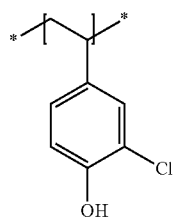
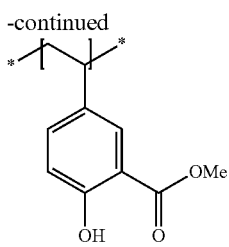
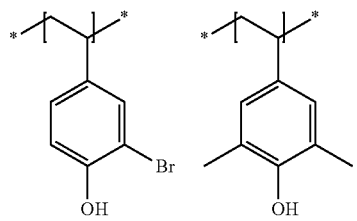
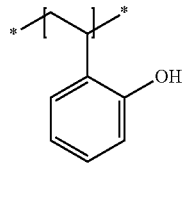
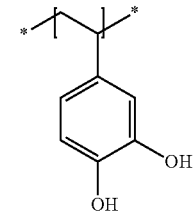
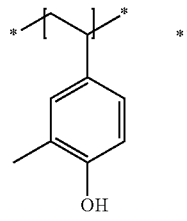
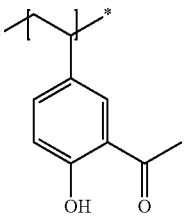
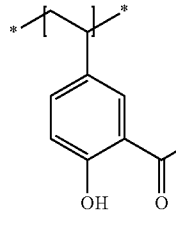
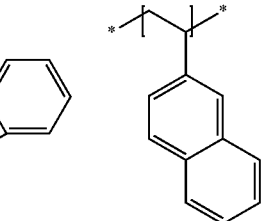
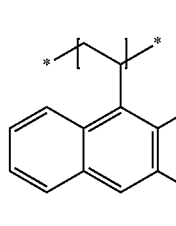
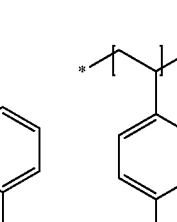
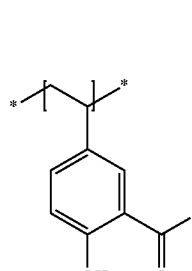
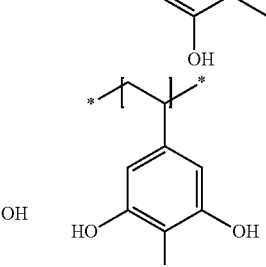

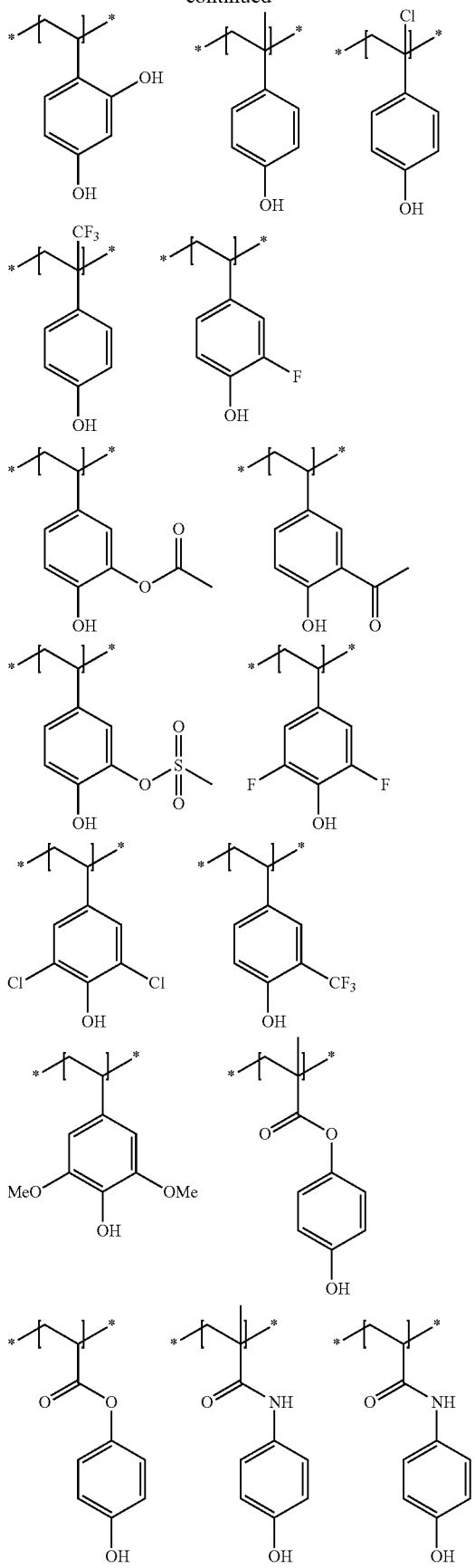

The compound (B) preferably includes a structure in which the hydrogen atom of the phenolic hydroxyl group is substituted with a group including a nonacid degradable polycyclic alicyclic hydrocarbon structure, from the point of obtaining a high glass transition temperature (Tg) and having favorable dry etching resistance.

By the compound (B) including the specified structure described above, the glass transition temperature (Tg) of the compound (B) increases, and an extremely hard resist film can be formed, and diffusibility of acid or dry etching resistance can be controlled. Accordingly, since the diffusibility of acid at the areas exposed to active rays or a radiation such as an electron beam or extreme ultraviolet rays is significantly suppressed, the resolving power, pattern shape and LER in fine patterns are excellent. In addition, it is thought that the compound (B) having a nonacid degradable polycyclic alicyclic hydrocarbon structure contributes to the further improvement of the dry etching resistance.

Further, although the details are unclear, it is assumed that the polycyclic alicyclic hydrocarbon structure has high hydrogen radical donating properties, becomes a hydrogen source during decomposition of the photoacid generator, further improves the decomposition efficiency of the photoacid generator and further increases the acid generation efficiency. It is thought that this contributes to more superior sensitivity.

In the specified structure described above which may be included in the compound (B) according to the present invention, an aromatic ring, such as a benzene ring, and a group having a nonacid degradable polycyclic alicyclic hydrocarbon structure are linked via an oxygen atom derived from a phenolic hydroxyl group. As described above, the structure not only contributes to high dry etching resistance, but also enables raising the glass transition temperature (Tg) of the compound (B), and due to a combination thereof, it is assumed that this provides higher resolving power.

In the present invention, the term "nonacid degradable" signifies the characteristic of a decomposition reaction not occurring due to the acid generated by the acid generator.

More specifically, the group including the nonacid degradable polycyclic alicyclic hydrocarbon structure is preferably a group stable in an acid or alkali. The term "group stable in acid or alkali" signifies a group not showing acid degradability and alkaline degradability. Here, the term "acid degradability" signifies characteristics in which a decomposition reaction occurs due to the action of the acid generated by the acid generator; examples of groups showing acid degradability include acid degradable groups described in "the repeating unit including an acid degradable group" described later.

In addition, the term "alkali degradability" signifies characteristics in which a decomposition reaction occurs due to the action of an alkali developer, and examples of groups showing alkali degradability include groups included in a suitably used resin in a positive chemical amplification resist composition, decomposing due to the action of an alkali developer of the related art and increasing the dissolution rate in the alkali developer (for example, groups having a lactone structure, or the like).

The group including a polycyclic alicyclic hydrocarbon structure is not particularly limited to only a monovalent group including a polycyclic alicyclic hydrocarbon structure; however, 5 to 40 carbon atoms in total is preferable, and 7 to 30 carbon atoms in total is more preferable. The polycyclic alicyclic hydrocarbon structure may include an unsaturated bond in the ring.

The polycyclic alicyclic hydrocarbon structure in the group including a polycyclic alicyclic hydrocarbon structure signifies a structure having a plurality of monocyclic alicyclic hydrocarbon groups, or a polycyclic alicyclic hydrocarbon structure, and may be bridged. As the monocyclic alicyclic hydrocarbon group, a cycloalkyl group having 3 to 8 carbon atoms is preferable, and examples may include a cyclopropyl group, a cyclopentyl group, a cyclohexyl group, a cyclobutyl group, and a cyclooctyl group. The structure including a plurality of monocyclic alicyclic hydrocarbon groups includes a plurality of these groups. The structure including a plurality of monocyclic alicyclic hydrocarbon groups preferably includes 2 to 4 monocyclic alicyclic hydrocarbon groups, and particularly preferably includes two groups.

Examples of the polycyclic alicyclic hydrocarbon structure include a bicyclo, tricyclo, or tetracyclo structure having 5 or more carbon atoms, and a polycyclic cyclo structure having 6 to 30 carbon atoms is preferable. Examples thereof include an adamantane structure, a decaline structure, a norbornane structure, a norbornene structure, a cedrol structure, an isobornane structure, a bornane structure, a dicyclopentane structure, an α-pinene structure, a tricyclodecane structure, a tetracyclododecane structure, or an androstane structure and the like. A portion of the carbon atoms in the monocyclic or polycyclic cycloalkyl group may be substituted with hetero atoms such as oxygen atoms.

Preferable examples of the polycyclic alicyclic hydrocarbon structure include, an adamantane structure, a decalin structure, a norbornane structure, a norbornene structure, a cedrol structure, a structure having a plurality of cyclohexyl groups, a structure having a plurality of cyclopentyl groups, a structure having a plurality of cyclooctyl groups, a structure having a plurality of cyclodecanyl groups, a structure having a plurality of cyclododecanyl groups, and a tricyclodecane structure, and an adamantane structure is most preferable from the viewpoint of dry etching resistance (in other words, groups having a non-acid decomposable polycyclic alicyclic hydrocarbon structure are most preferably groups having a nonacid degradable adamantane structure).

These polycyclic alicyclic hydrocarbon structures (with regard to a structure including a plurality of monocyclic alicyclic hydrocarbon groups, monocyclic alicyclic hydrocarbon structure corresponding to the monocyclic alicyclic hydrocarbon group (specifically, structures in the following Formulae (47) to (50))) are shown by the chemical formulae below.

[Chem. 15]

(1)

(2)

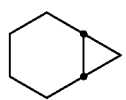

(3)

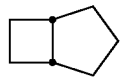

(4)

(5)

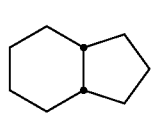

(6)

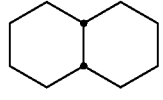

(7)

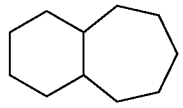

(8)

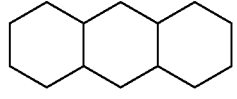

(9)

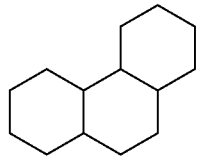

(10)

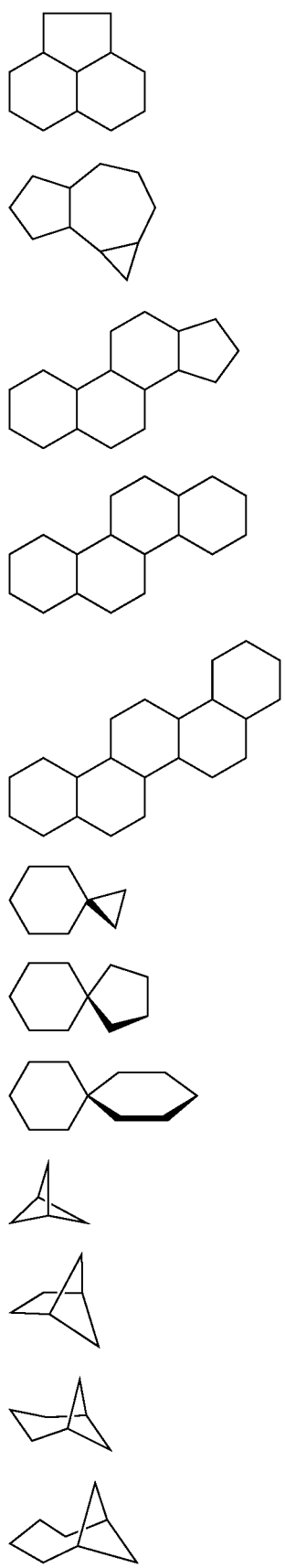
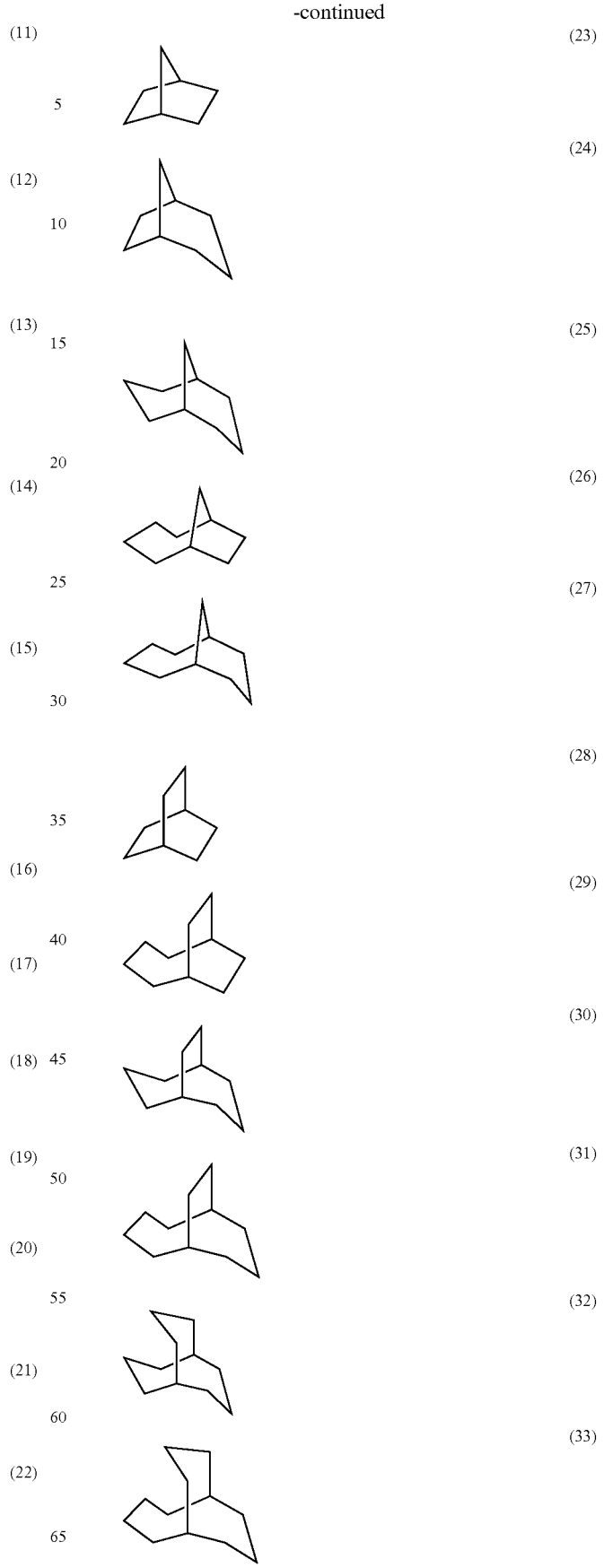

-continued

(34) 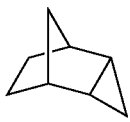

(35) 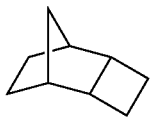

(36) 

(37) 

(38) 

(39) 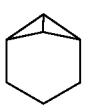

(40) 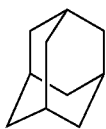

(41) 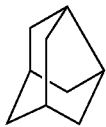

(42) 

(43) 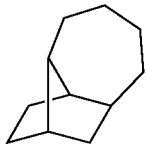

(44) 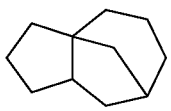

(45) 

-continued

(46) 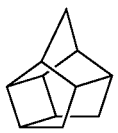

(47) 

(48) 

(49) 

(50) 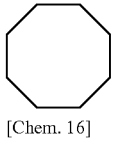

[Chem. 16]

(51) 

Furthermore, the polycyclic alicyclic hydrocarbon structure may have a substituent. Examples of the substituent include an alkyl group (preferably having 1 to 6 carbon atoms), a cycloalkyl group (preferably having 3 to 10 carbon atoms), an aryl group (preferably 6 to 15 carbon atoms), a halogen atom, a hydroxyl group, an alkoxy group (preferably having 1 to 6 carbon atoms), a carboxyl group, a carbonyl group, a thiocarbonyl group, an alkoxy carbonyl group (preferably having 2 to 7 carbon atoms) and groups combining these groups (preferably having 1 to 30 carbon atoms in total, and more preferably having 1 to 15 carbon atoms in total).

The polycyclic alicyclic hydrocarbon structure is preferably a structure represented by any of the above Formulae (7), (23), (40), (41) and (51), and a structure including two monovalent groups with one arbitrary hydrogen atom in the structure of the above Formula (48) as a bond, more preferably a structure represented by any of the above Formulae (23), (40) and (51), and a structure including two monovalent groups with one arbitrary hydrogen atom in the structure of the above Formula (48) as a bond, and most preferably a structure represented by the above Formula (40).

The group including a polycyclic alicyclic hydrocarbon structure is preferably a monovalent group with one arbitrary hydrogen atom of the polycyclic alicyclic hydrocarbon structure as a bond.

The structure in which a hydrogen atom of the phenolic hydroxyl group is substituted by a group including the above-described nonacid degradable polycyclic alicyclic hydrocarbon structure is preferably contained as a repeating unit including a structure in which the hydrogen atom of the phenolic hydroxyl group is substituted with a group including the nonacid degradable polycyclic alicyclic hydrocarbon structure in the compound (B) as a resin and is more preferably contained in the compound (B) as a repeating unit represented by the following General Formula (3).

[Chem. 17]

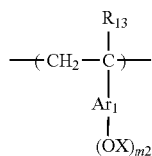

(3)

In General Formula (3), $R_{13}$ represents a hydrogen atom or a methyl group.

X represents a group including nonacid degradable polycyclic alicyclic hydrocarbon structure.

$Ar_1$ represents an aromatic ring.

m2 is an integer of from 1 or higher.

In General Formula (3), $R_{13}$ represents a hydrogen atom or a methyl group; however, a hydrogen atom is particularly preferable.

Example of the aromatic ring of $Ar_1$ of General Formula (3) include aromatic hydrocarbon rings which may include a substituent having 6 to 18 carbon atoms, such as a benzene ring, a naphthalene ring, an anthracene ring, a fluorene ring or a phenanthrene ring; or a heterocyclic aromatic ring including a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among them, a benzene ring and a naphthalene ring are preferred from the viewpoint of resolution, and a benzene ring is most preferred.

The aromatic ring of $Ar_1$ may include a substituent other than the group represented by the above —OX, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, an alkoxy carbonyl group (preferably having 2 to 7 carbon atoms); an alkyl group, an alkoxy group and an alkoxy carbonyl group are preferable, and an alkoxy group is more preferable.

X represents a group including nonacid degradable polycyclic alicyclic hydrocarbon structure. Specific examples and preferred ranges of the group including a nonacid degradable polycyclic alicyclic hydrocarbon structure represented by X are the same as described above. X is more preferably a group represented by —Y—$X_2$ in General Formula (4) described below.

m2 is preferably an integer of 1 to 5, and most preferably 1. When m2 is 1 and $Ar_1$ is a benzene ring, the position of substitution of —OX may be the para-position, the meta-position or the ortho-position with respect to the bonding position with the polymer main chain of the benzene ring; the para-position and meta-position are preferable and the para-position is more preferable.

In the present invention, the repeating unit represented by General Formula (3) is preferably a repeating unit represented by the following General Formula (4).

If the resin (B) including a repeating unit represented by General Formula (4) is used, the Tg of resin (B) increases, and diffusibility of acid or dry etching resistance can be more reliably controlled in order to form an extremely hard resist film.

[Chem. 18]

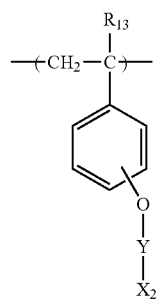

(4)

In General Formula (4), $R_{13}$ represents a hydrogen atom or a methyl group.

Y represents a single bond or a divalent linking group.

$X_2$ represents a nonacid degradable polycyclic alicyclic hydrocarbon group.

Preferable examples of the repeating unit represented by the General Formula (4) used in the present invention are described below.

In General Formula (4), $R_{13}$ represents a hydrogen atom or a methyl group; however, a hydrogen atom is particularly preferable.

In General Formula (4), Y is preferably a divalent linking group. Preferable groups as the divalent linking group of Y include a carbonyl group, a thiocarbonyl group, an alkylene group (preferably having 1 to 10 carbon atoms, and more preferably having 1 to 5 carbon atoms), a sulfonyl group, —COCH$_2$—, —NH— or a divalent linking group combining these (preferably having 1 to 20 carbon atoms in total, and more preferably having 1 to 10 carbon atoms in total), more preferably include a carbonyl group, —COCH$_2$—, a sulfonyl group, —CONN—, —CSNH—, still more preferably a carbonyl group, or —COCH$_2$—, and particularly preferably a carbonyl group.

$X_2$ represents a polycyclic alicyclic hydrocarbon group and is nonacid degradable. The polycyclic alicyclic hydrocarbon group preferably has 5 to 40 carbon atoms in total, and more preferably 7 to 30 carbon atoms. The polycyclic alicyclic hydrocarbon group may include an unsaturated bond in the ring.

Such a polycyclic alicyclic hydrocarbon group may be a group including a plurality of monocyclic alicyclic hydrocarbon groups or a polycyclic alicyclic hydrocarbon group, and may be bridged. As the monocyclic alicyclic hydrocarbon group, a cycloalkyl group having 3 to 8 carbon atoms is preferable, and examples include a cyclopropyl group, a cyclopentyl group, a cyclohexyl group, a cyclobutyl group, or a cyclooctyl groups, and includes a plurality of these groups. The group including a plurality of monocyclic alicyclic hydrocarbon groups preferably includes 2 to 4 monocyclic alicyclic hydrocarbon groups, and particularly preferably includes two groups.

The polycyclic alicyclic hydrocarbon group includes groups having a bicyclo, tricyclo, tetracyclo structure or the like having 5 or more carbon atoms, is preferably a group including a polycyclo structure having 6 to 30 carbon atoms, and example thereof include an adamantyl group, a norbornyl group, a norbornenyl group, an isobornyl group, a camphanyl group, a dicyclopentyl group, an α-pinel group, a tricyclodecanyl group, a tetracyclododecyl group and an androstanyl group. A portion of the carbon atoms in the monocyclic or polycyclic cycloalkyl group may be substituted with hetero atoms such as oxygen atoms.

The polycyclic alicyclic hydrocarbon group of the $X_2$ is preferably an adamantyl group, a decalin group, a norbornyl group, a norbornenyl group, a cedrol group, a group including a plurality of cyclohexyl groups, a group including a plurality of cyclopentyl groups, a group including a plurality of cyclooctyl groups, a group including a plurality of cyclodecanyl groups, a group including a plurality of cyclodecanyl groups, or a tricyclodecanyl group, and, from the viewpoint of dry etching resistance, most preferably an adamantyl group. As the chemical formula of the polycyclic alicyclic hydrocarbon structure in the polycyclic alicyclic hydrocarbon group of $X_2$, examples include the same chemical formula as the polycyclic alicyclic hydrocarbon structure in the polycyclic alicyclic hydrocarbon structure described above, and preferably ranges are the same. For the polycyclic alicyclic hydrocarbon group of $X_2$, an example is a monovalent group with one arbitrary hydrogen atom in the polycyclic alicyclic hydrocarbon structure described above as a bond.

The alicyclic hydrocarbon group may further include a substituent, and examples of the substituent are the same as the above-described substituent which may include the polycyclic alicyclic hydrocarbon structure.

The substitution position of the —O—Y—$X_2$ in General Formula (4) with respect to the bonding position of the polymer main chain of the benzene ring may be the para-position, the meta-position or the ortho-position; however, the para-position is preferable.

In the present invention, the repeating unit represented by General Formula (3) is preferably a repeating unit represented by the following General Formula (4').

[Chem. 19]

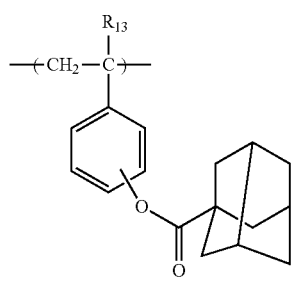

(4')

In General Formula (4'), $R_{13}$ represents a hydrogen atom or a methyl group.

In General Formula (4'), $R_{13}$ represents a hydrogen atom or a methyl group; however, a hydrogen atom is particularly preferable.

The substitution position of adamantyl ester group in General Formula (4') with respect to the bonding position of the polymer main chain of the benzene ring may be the para-position, the meta-position or the ortho-position; however, the para-position is preferable.

Specific examples of the repeating unit represented by General Formula (3) are given below.

[Chem. 20]

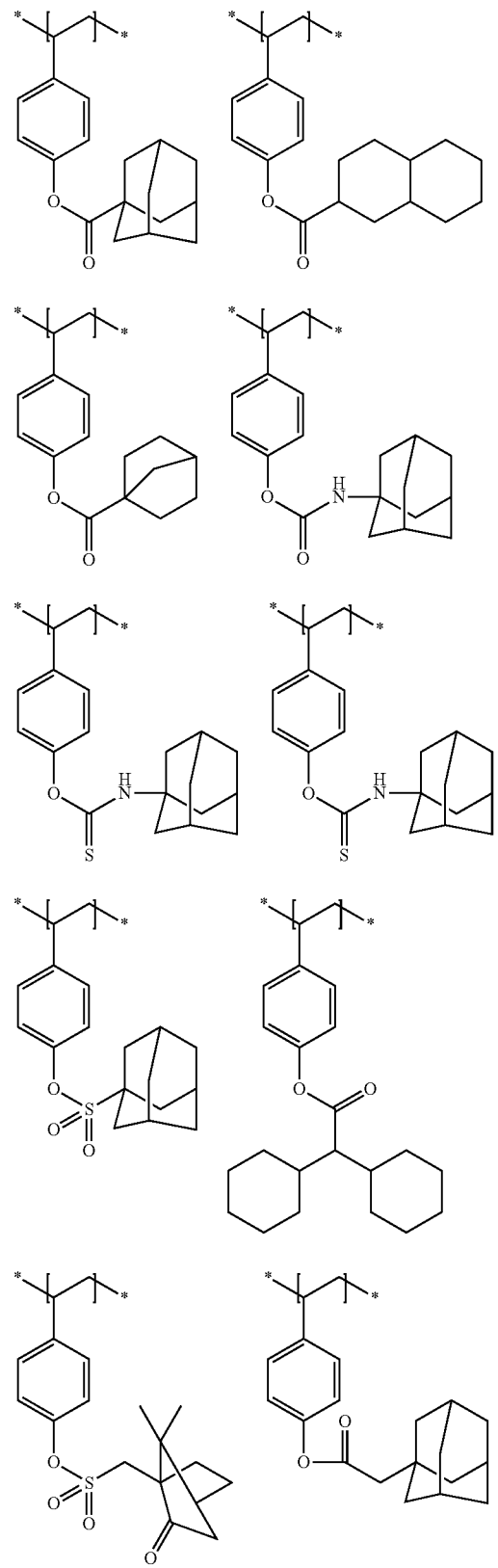

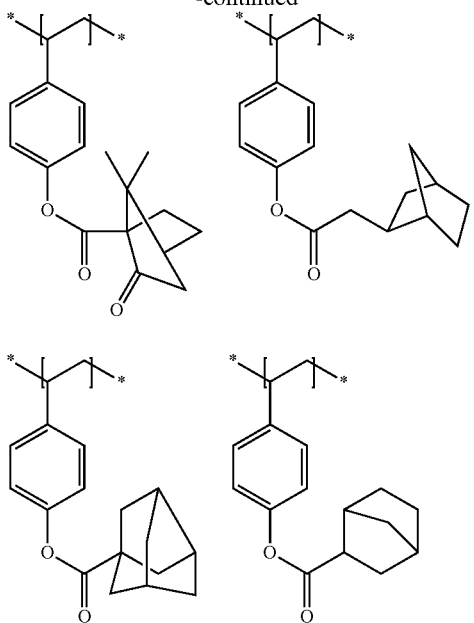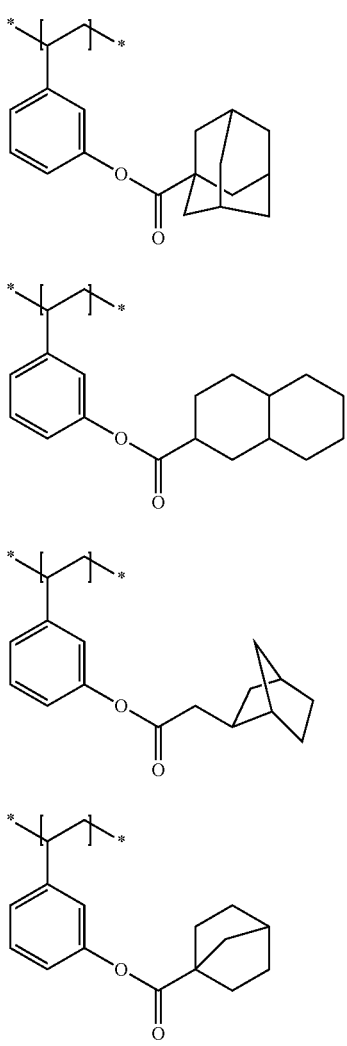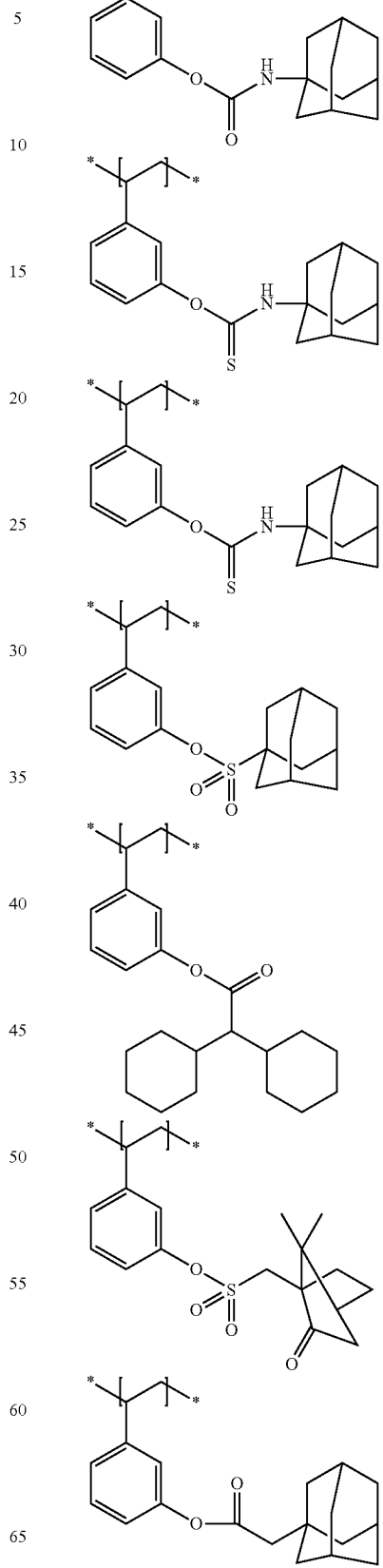

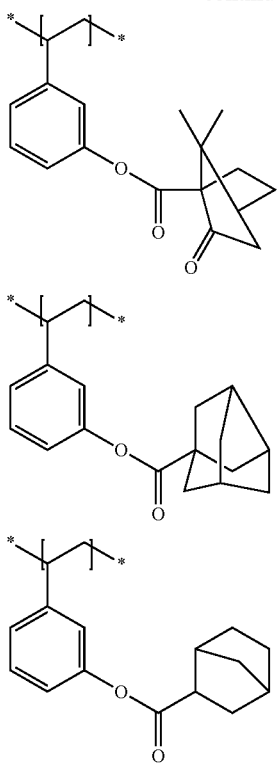

[Chem. 22]

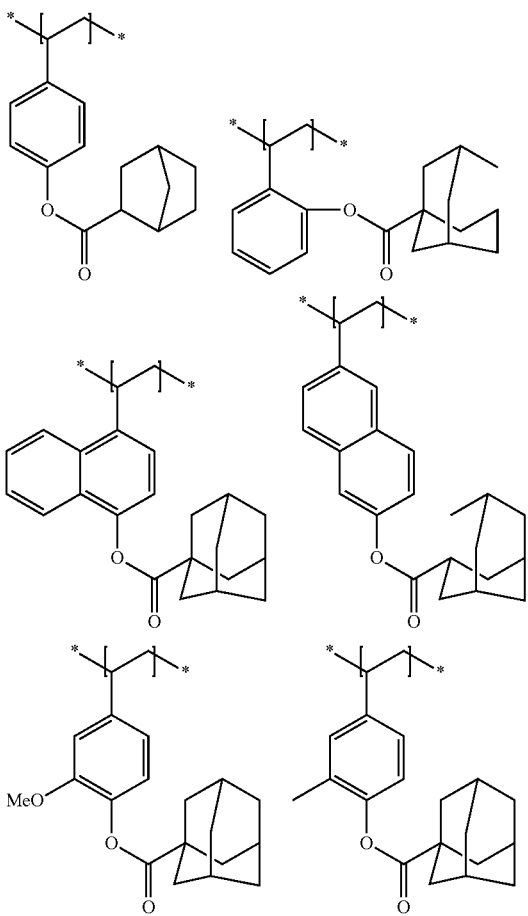

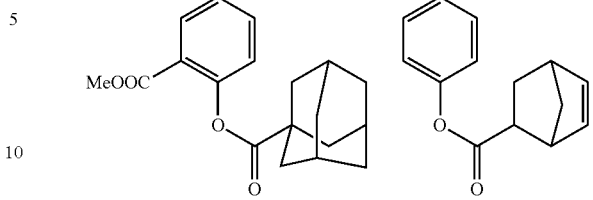

Compound (B) is a resin, and in a case in which a repeating unit including a structure in which the hydrogen atom of the phenolic hydroxyl group is substituted by a group including the nonacid degradable polycyclic alicyclic hydrocarbon structure described above is further contained, the content of the repeating unit with respect to all the repeating units of the compound (B) as a resin is preferably 1 mol % to 40 mol %, and more preferably 2 mol % to 30 mol %.

The compound (B) as a resin used in the present invention may preferably further include the repeating units described below (hereinafter, referred to as "other repeating unit") as a repeating unit other than the above repeating units.

Examples of a polymerizable monomer for forming these other repeating units include styrene, an alkyl-substituted styrene, an alkoxy-substituted styrene, a halogen substituted styrene, an O-alkylated styrene, an O-acylated styrene, hydrogenated hydroxystyrene, maleic anhydride, an acrylic acid derivative (acrylic acid, an acrylic acid ester, or the like), a methacrylic acid derivative (methacrylic acid, a methacrylic acid ester, or the like), an N-substituted maleimide, acrylonitrile, methacrylonitrile, vinylnaphthalene, vinylanthracene, and indene which may has a substituent.

The compound (B) as a resin may or may not contain these other repeating units; however, in a case where contained, the content of these other repeating units in the compound (B) as a resin with respect to all the repeating units constituting the compound (B) as a resin is ordinarily 1 mol % to 30 mol %, is preferably 1 mol % to 20 mol %, and is more preferably 2 mol % to 10 mol %.

The compound (B) as a resin can be synthesized by a known radical polymerization method, anion polymerization method or a living radical polymerization method (iniferter method or the like). For example, in the anion polymerization method, a polymer can be obtained by dissolving a vinyl monomer in an appropriate organic solvent, and causing the vinyl monomer to react, usually under cooling conditions, by using a metal compound (butyllithium or the like) as an initiator.

As the compound (B) as a resin, a polyphenol compound produced by a condensation reaction between an aromatic ketone or an aromatic aldehyde, and a compound containing 1 to 3 phenolic hydroxyl groups (for example, JP2008-145539A), a calixarene derivative (for example, JP2004-18421A), a Noria derivative (for example, JP2009-222920A), a polyphenol derivative (for example, JP2008-94782A) can also be applied, and the polymer compound (B) may also be synthesized by modifying these compounds by polymer reactions.

The compound including a (B) phenolic hydroxyl group used in the present invention is a resin including a repeating unit including at least one type of phenolic hydroxyl group, and, moreover, is preferably a resin including a repeating unit as described below as a repeating unit other than the repeating unit represented in General Formula (1).

For example, in a case in which the chemical amplification resist composition of the present invention is used as a positive resist composition, the compound including a (B) phenolic hydroxyl group is a resin including a repeating unit including at least one type of phenolic hydroxyl group, and, further, it is necessary to include a repeating unit including a group (hereinafter, referred to as an "acid degradable group") which decomposes due to the action of an acid, and forms an alkali soluble group (hereinafter, compound (B) in this case is referred to as "a resin in which solubility in alkali developer increases by decomposition due to the action of an acid" or "acid degradable resin").

The acid degradable group is preferably a group in which a hydrogen atom of the alkali soluble group such as —COOH group and an —OH group are substituted with a group leaving due to the action of an acid. The group leaving due to the action of an acid is particularly preferably an acetal group or a tertiary ester group.

Examples of the matrix resin in the case of these acid degradable groups bonding as a side chain include alkali soluble resins including an —OH or —COOH group in the side chain. Examples of such alkali soluble resins are described below.

The alkali dissolution rate of these alkali soluble resins is preferably 17 nm/sec or higher measured in 0.261N tetramethylammonium hydroxide (TMAH)(23° C.). The rate is particularly preferably 33 nm/sec or higher.

From such a viewpoint, examples of particularly preferable alkali soluble resins include resins including a hydroxystyrene structural unit, such as an o-, m- and p-poly(hydroxystyrene) as well as copolymers thereof, hydrogenated poly(hydroxystyrene), halogen or alkyl substituted poly(hydroxystyrene), a partial O-alkylated or O-acylated poly(hydroxystyrene), a styrene hydroxystyrene copolymer, an α-methylstyrene hydroxystyrene copolymer and hydrogenated novolak resin; as well as resins including a repeating unit including a carboxyl group such as (meth)acrylic acid and norbornenecarboxylic acid.

Examples of the preferred repeating units including an acid degradable group include t-butoxycarbonyloxystyrene, 1-alkoxyethoxystyrene and (meth)acrylic acid tertiary alkyl ester. As the repeating unit, 2-alkyl-2-adamantyl(meth)acrylate or dialkyl(1-adamantyl)methyl(meth)acrylate are more preferable.

The resin in which solubility in alkali developer increases by decomposition due to the action of an acid, such as disclosed in EP254853B, JP1990-25850A (JPH2-25850A), JP1991-223860A (JPH3-223860A), and JP1992-251259A (JPH4-251259A) or the like, may be obtained by reacting a precursor of a group leaving due to the action of an acid with a resin, or by co-polymerizing an alkali soluble resin monomer bonded to a group leaving due to the action of an acid with various monomers.

In the composition of the present invention, in a case of irradiation of KrF excimer laser light, an electron beam, x-rays or a high energy light beam with a wavelength of 50 nm or less (for example, EUV), the resin preferably includes a hydroxystyrene repeating unit. Further preferably, the resin is a copolymer of hydroxystyrene and hydroxystyrene protected by a group leaving due to the action of an acid, or a copolymer of hydroxystyrene and (meth)acrylic acid tertiary alkyl ester.

Examples of such a resin include, specifically, resins including a repeating unit represented by the General Formula (A) described below as a repeating unit including an acid degradable group. By using a resin including the repeating unit, the dry etching resistance of the formed pattern improves.

[Chem. 23]

(A)

wherein, $R_{01}$, $R_{02}$ and $R_{03}$ each independently represent a hydrogen atom, an alkyl group, a cycloalkyl group, a halogen atom, a cyano group or an alkoxy carbonyl group. $Ar_1$ represents, for example, an aromatic ring group. Moreover, $R_{03}$ and $Ar_1$ are an alkylene group, and may form a 5- or 6-membered ring and a —C—C— chain, by being bonded to one another.

Each of n Y's independently represents a hydrogen atom or a group leaving due to action of an acid. However, at least one Y represents a group leaving due to action of an acid.

n represents an integer of 1 to 4, preferably 1 to 2, and more preferably 1.

The alkyl group of $R_{01}$ to $R_{03}$ is an alkyl group having 20 or fewer carbon atoms, and is preferably a methyl group, an ethyl group, a propyl group, an isopropyl group, an n-butyl group, a sec-butyl group, a hexyl group, a 2-ethylhexyl group, and octyl group or a dodecyl group. More preferably, these alkyl groups are alkyl groups with 8 or fewer carbon atoms. Moreover, these alkyl groups may include a substituent.

As the alkyl group included in the alkoxy carbonyl group are preferably the same as the alkyl groups in the above $R_{01}$ to $R_{03}$.

The cycloalkyl group may be a monocyclic cycloalkyl group or may be a polycyclic cycloalkyl group. Preferably, examples include monocyclic cycloalkyl groups having 3 to 8 carbon atoms such as a cyclopropyl group, a cyclopentyl group and a cyclohexyl group. Moreover, these cycloalkyl groups may include a substituent.

Examples of the halogen atom include a fluorine atom, a chlorine atom, a bromine atom and an iodine atom, and a fluorine atom is preferable.

In a case where $R_{03}$ represents an alkylene group, examples of the alkylene group preferably have 1 to 8 carbon atoms, such as a methylene group, an ethylene group, a propylene group, a butylene group, a hexylene group, and an octylene group.

The aromatic ring group of $Ar_1$ preferably has 6 to 14 carbon atoms, and examples include a benzene ring, a toluene ring and a naphthalene ring. Moreover, these aromatic ring groups may include a substituent.

Examples of the group Y leaving due to action of an acid include groups represented by —C($R^{36}$)($R^{37}$)($R^{38}$), —C(=O)—O—C($R^{36}$)($R^{37}$)($R^{38}$), —C($R^{01}$)($R^{02}$)($R^{39}$), —C($R^{01}$)($R^{02}$)—C(=O)—O—C($R^{36}$)($R^{37}$)($R^{38}$) and —CH ($R^{36}$)(Ar).

In the formulae, $R^{36}$ to $R^{39}$ each independently represent an alkyl group, a cycloalkyl group, an aryl group, an aralkyl group or an alkenyl group. $R^{36}$ and $R^{37}$ may combine with each other to form a ring structure.

$R^{01}$ and $R^{02}$ each independently represent a hydrogen atom, an alkyl group, a cycloalkyl group, an aryl group, an aralkyl group, or an alkenyl group.

Ar represents an aryl group.

The alkyl group of $R^{36}$ to $R^{39}$ and $R^{01}$ and $R^{02}$ is preferably an alkyl group having 1 to 8 carbon atoms, and examples thereof include a methyl group, an ethyl group, a propyl group, an n-butyl group, a sec-butyl group, a hexyl group, an octyl group, and the like.

The cycloalkyl group of $R^{36}$ to $R^{39}$, $R^{01}$ or $R^{02}$ may be a monocyclic cycloalkyl group or may be a polycyclic cycloalkyl group. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, a cyclooctyl group, and the like. The polycyclic cycloalkyl group is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, an androstanyl group, and the like. Moreover, a portion of the carbon atoms in the cycloalkyl group may be substituted with hetero atoms such as oxygen atoms.

The aryl group of $R^{36}$ to $R^{39}$, $R^{01}$ and $R^{02}$ is preferably an aryl group having 6 to 10 carbon atoms, and examples thereof include a phenyl group, a naphthyl group, an anthryl group and the like.

The aralkyl group of $R^{36}$ to $R^{39}$, $R^{01}$ and $R^{02}$ or Ar is preferably an aralkyl group having 7 to 12 carbon atoms, and examples thereof include a benzyl group, a phenethyl group, a naphthylmethyl group, and the like.

The alkenyl group of $R^{36}$ to $R^{39}$, $R^{01}$ and $R^{02}$ is preferably an alkenyl group having 2 to 8 carbon atoms, and examples thereof include a vinyl group, an allyl group, a butenyl group, a cyclohexenyl group, and the like.

A ring able to be formed by combining $R^{36}$ and $R^{37}$ with each other may be a monocyclic type or may be a polycyclic type. The monocyclic type is preferably a cycloalkane structure having 3 to 8 carbon atoms, and examples thereof include a cyclopropane structure, a cyclobutane structure, a cyclopentane structure, a cyclo hexane structure, a cycloheptane structure, and a cyclooctane structure. The polycyclic type is preferably a cycloalkane structure having 6 to 20 carbon atoms, and examples thereof include an adamantane structure, a norbornane structure, a dicyclopentane structure, a tricyclodecane structure, and a tetracyclododecane structure. Moreover, a portion of the carbon atoms in the cyclic structure may be substituted with hetero atoms such as oxygen atoms.

Each of the groups may include a substituent. Examples of the substituent include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxy carbonyl group, a cyano group, and a nitro group. These substituents preferably have 8 or fewer carbon atoms.

The group Y leaving due to the action of an acid more preferably has a structure represented by General Formula (B) described below.

[Chem. 24]

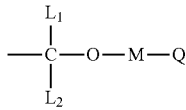

(B)

wherein, $L_1$ and $L_2$ each independently represent a hydrogen atom, an alkyl group, a cycloalkyl group, an aryl group or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group or an aldehyde group. Moreover, the cyclic aliphatic group and the aromatic ring group may contain a hetero atom.

Moreover, at least two of Q, M and $L_1$ may bond with each other to form a 5 or 6 membered ring.

The alkyl group of $L_1$ and $L_2$ is an alkyl group having 1 to 8 carbon atoms and specific examples thereof include a methyl group, an ethyl group, a propyl group, an isopropyl group, an n-butyl group, a sec-butyl group, a t-butyl group, a hexyl group and an octyl group.

The cycloalkyl group of $L_1$ and $L_2$ is a cycloalkyl group having 3 to 15 carbon atoms, and specific examples thereof include a cyclopentyl group, a cyclohexyl group, a norbornyl group and an adamantyl group.

The aryl group of $L_1$ and $L_2$ is an aryl group having 6 to 15 carbon atoms, and specific examples thereof include a phenyl group, a tolyl group, a naphthyl group and an anthryl group.

The aralkyl group of $L_1$ and $L_2$ is an aralkyl group having 6 to 20 carbon atoms, and specific examples thereof include a benzyl group and a phenethyl group.

The divalent linking group of M is, for example, an alkylene group (for example, a methylene group, an ethylene group, a propylene group, a butylene group, a hexylene group or an octylene group), a cycloalkylene group (for example, a cyclopentylene group or a cyclohexylene group), an alkenylene group (for example, an ethylene group, a propenylene group or a butenylene group), an arylene group (for example, a phenylene group, a tolylene group or a naphthylene group), —S—, —O—, —CO—, —SO$_2$—, —N ($R_0$) or a combination of two or more thereof. Here, $R_0$ is a hydrogen atom or an alkyl group. The alkyl group of $R_0$ is an alkyl group having 1 to 8 carbon atoms, and specific examples thereof include a methyl group, an ethyl group, a propyl group, an n-butyl group, a sec-butyl group, a hexyl group and an octyl group.

The alkyl group and cycloalkyl group of Q are the same as the respective groups of $L_1$ and $L_2$ described above.

Examples of the cyclic aliphatic group or aromatic ring group of Q include the cycloalkyl group and aryl group of $L_1$ and $L_2$ described above. These cycloalkyl groups and aryl groups are preferably groups having 3 to 15 carbon atoms.

Examples of the cyclic aliphatic group or aromatic ring group including a hetero atom of Q include groups having a heterocyclic ring structure such as thiirane, cyclothiorane, thiophene, furan, pyrrole, benzothiophene, benzofuran, benzopyrrole, triazine, imidazole, benzimidazole, triazole, thiadiazole, thiazole and pyrrolidone. However, if the ring is formed by carbon and a hetero atom or the ring is formed by a hetero atom alone, there is no limitation thereto.

Examples of a ring structure formed by bonding at least two of Q, M and $L_1$ with each other include a 5 or 6 membered ring structures formed of a propylene group or a butylene group. Moreover, the 5 or 6 membered ring structure contains an oxygen atom.

Each group represented by $L_1$, $L_2$, M and Q in General Formula (2) may include a substituent. Examples of the substituent include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxy carbonyl group, a cyano group, and a nitro group. These substituents preferably have 8 or fewer carbon atoms.

The group represented by -(M-Q) is preferably a group having 1 to 30 carbon atoms, and more preferably a group having 5 to 20 carbon atoms. In particular, from the viewpoint of suppressing outgas, a group having 6 or more carbon atoms is preferable.

The acid degradable resin may be a resin including a repeating unit represented by the General Formula (X) described below as the repeating unit including an acid decomposable group.

[Chem. 25]

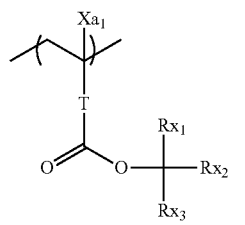

(X)

In General Formula (X), $Xa_1$ represents a hydrogen atom, a methyl group, a trifluoromethyl group, or a hydroxymethyl group.

T represents a single bond or a divalent linking group.

Examples of $Rx_1$ to $Rx_3$, each independently, include a straight chain or branched alkyl group or a monocyclic or polycyclic cycloalkyl group. Moreover, two of $Rx_1$ to $Rx_3$ may bond with each other to form a monocyclic or polycyclic cycloalkyl group.

Examples of the divalent linking group of T include an alkylene group, a —(COO-Rt)- group, and an —(O-Rt)- group. Here, Rt represents an alkylene group or a cycloalkylene group.

T is preferably a single bond or a —(COO-Rt)- group. Rt is preferably an alkylene group having 1 to 5 carbon atoms, and more preferably a —CH$_2$— group or a —(CH$_2$)$_3$— group.

The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group or a t-butyl group.

The cycloalkyl group of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

The cycloalkyl group formed by bonding two of $Rx_1$ to $Rx_3$ with each other is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

In particular, an embodiment is preferred where $Rx_1$ is a methyl group or ethyl group, and $Rx_2$ and $Rx_3$ are bonded together to form the cycloalkyl group described above.

Specific examples of the repeating units having acid degradability are shown below; however, the present invention is not limited thereto.

[Chem. 26]

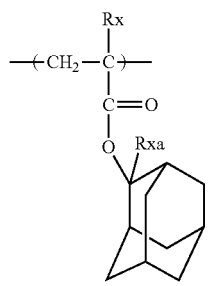

1

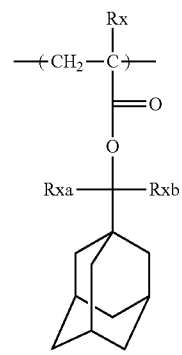

2

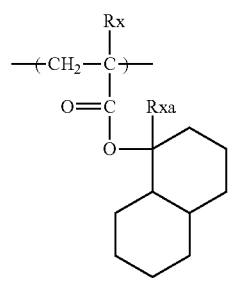

3

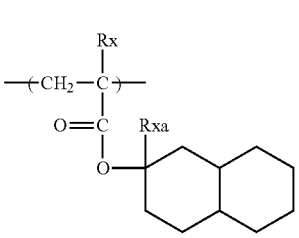

4

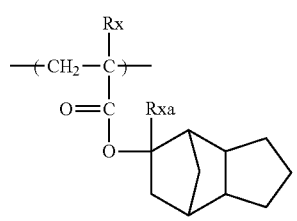

5

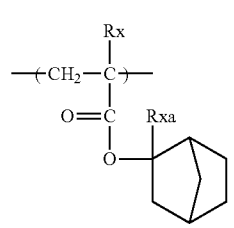

6

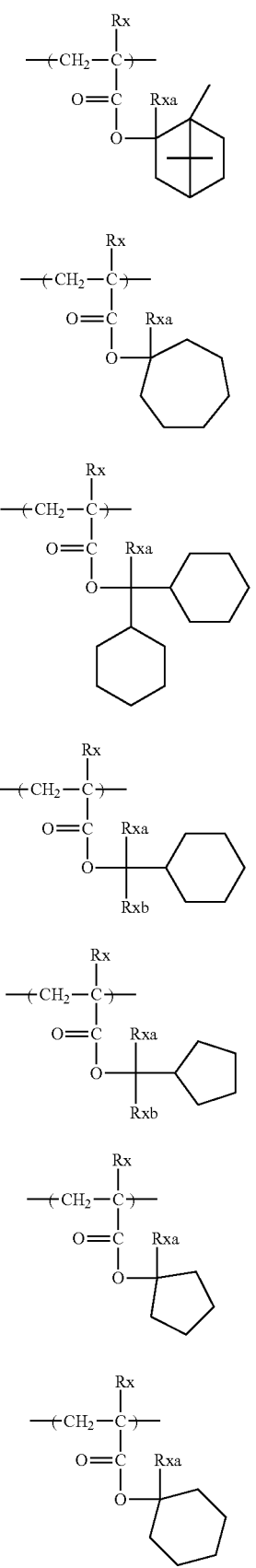
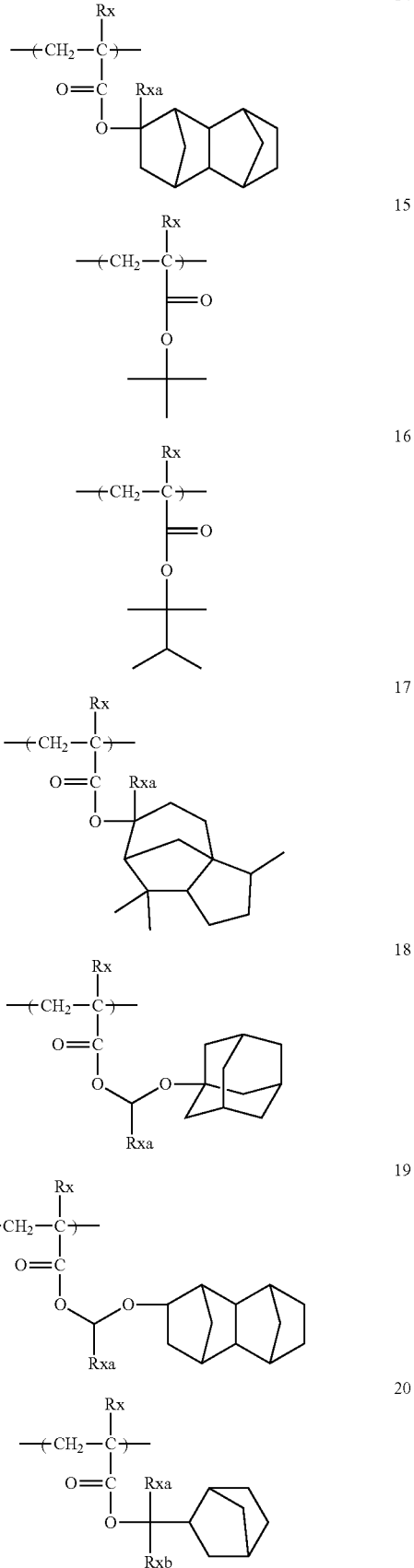

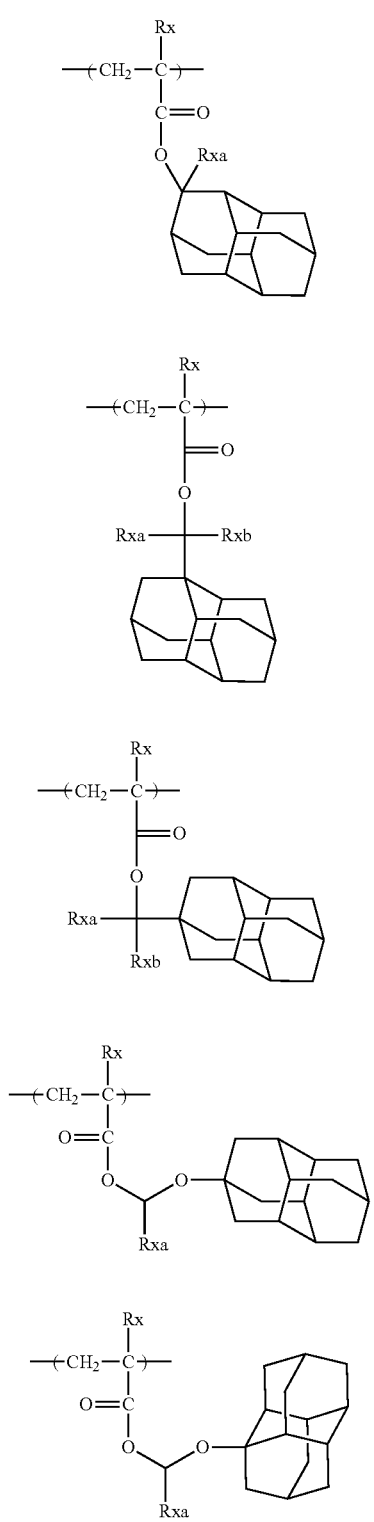

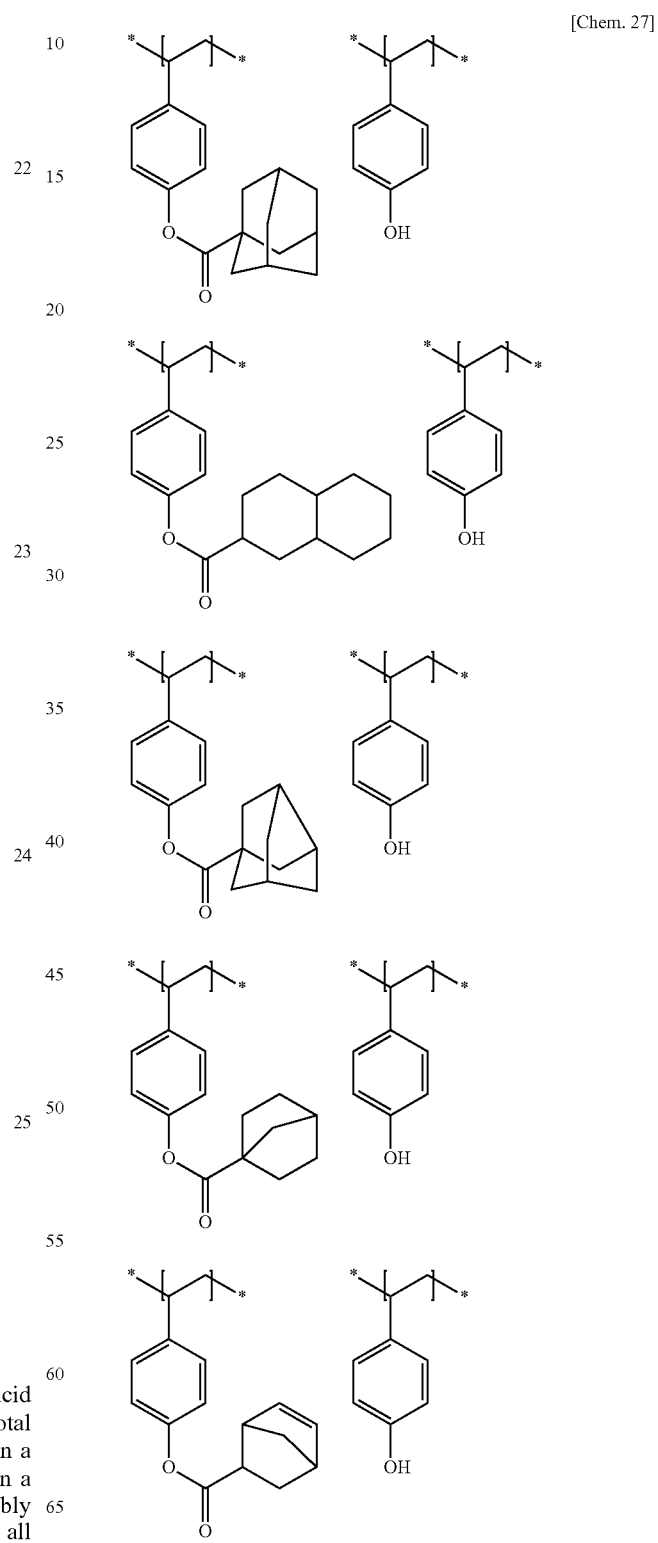

In the description above, specific examples of the compound (B) of the compound including a structure in which the hydrogen atom of the phenolic hydroxyl group is substituted with a group including a nonacid degradable polycyclic alicyclic hydrocarbon structure are shown below, however the present invention is not limited thereto.

[Chem. 27]

The content of the repeating unit including an acid degradable group in the acid degradable resin (the total thereof when including plural types) is preferably within a range of 3 mol % to 90 mol %, more preferably within a range of 5 mol % to 80 mol %, and even more preferably within a range of 7 mol % to 70 mol %, with respect to all repeating units of the acid degradable resin.

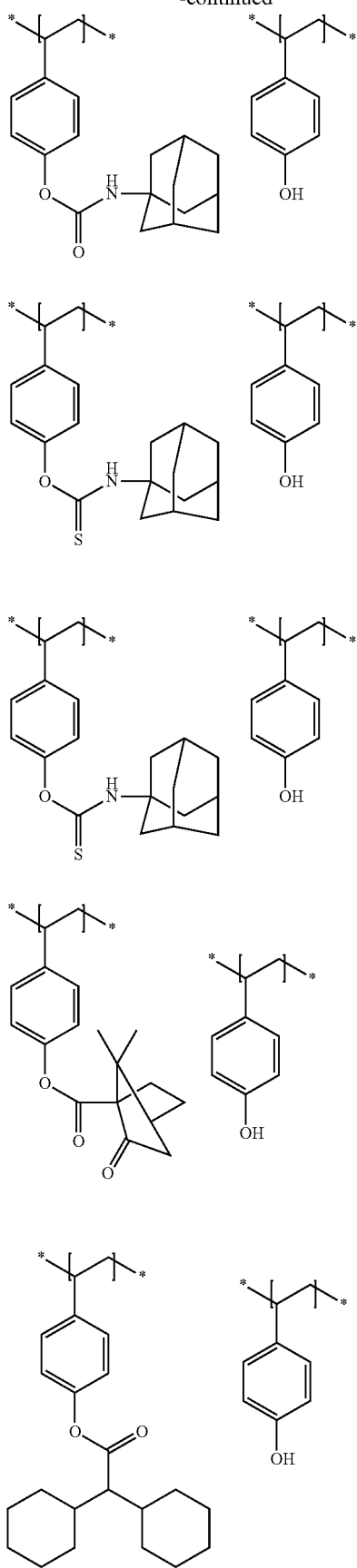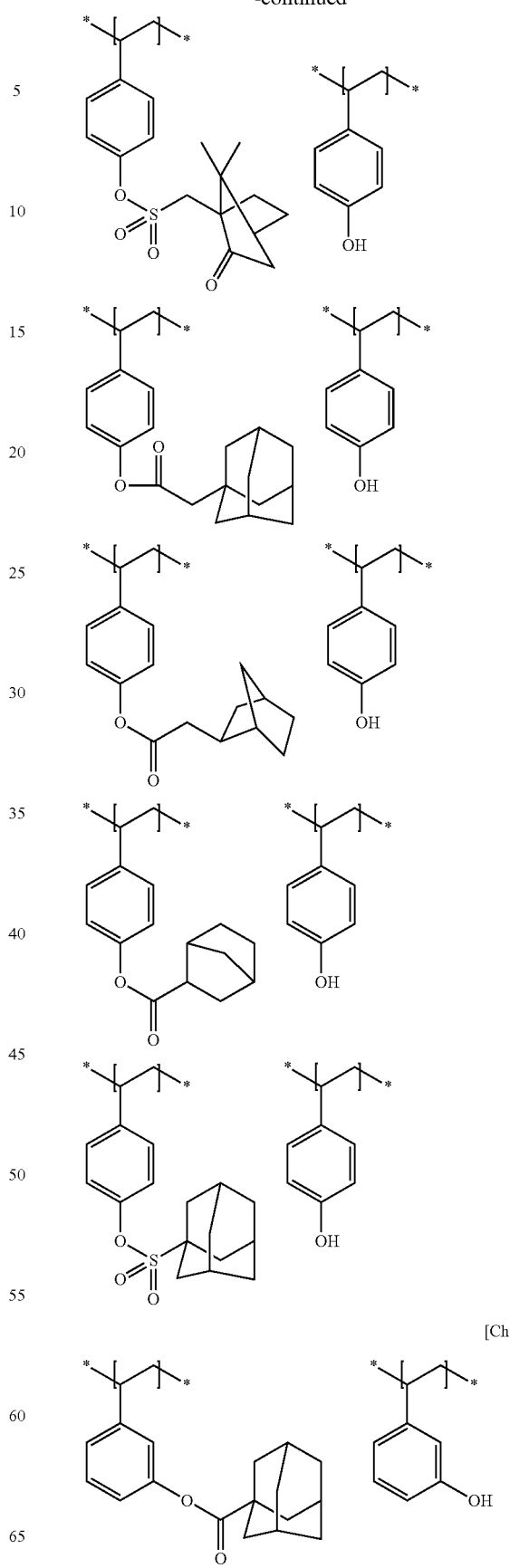

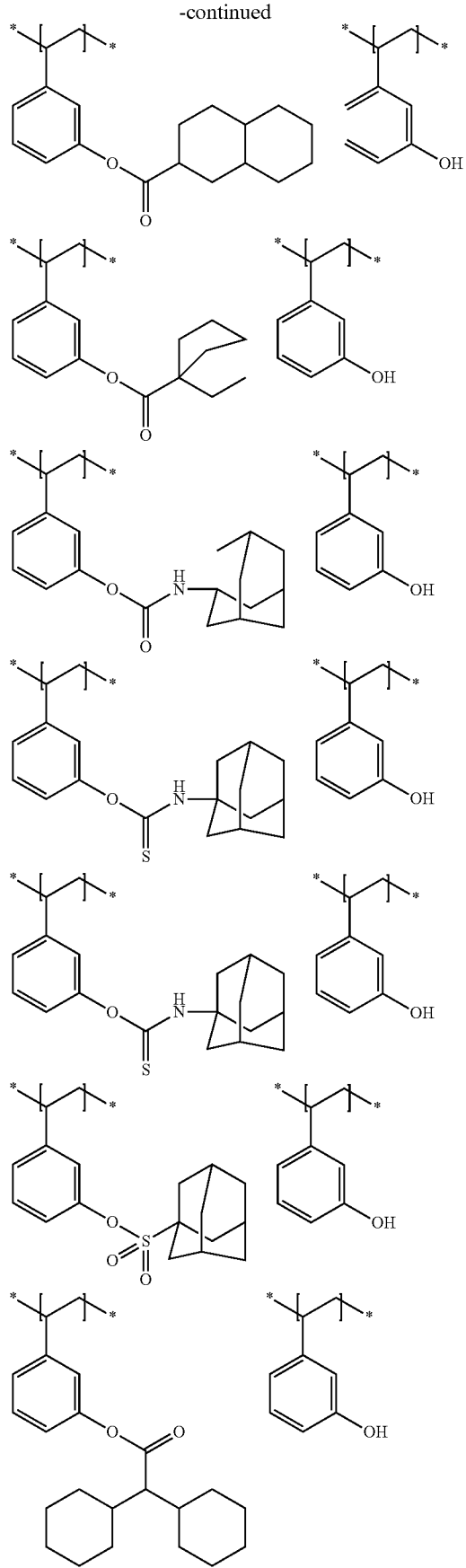
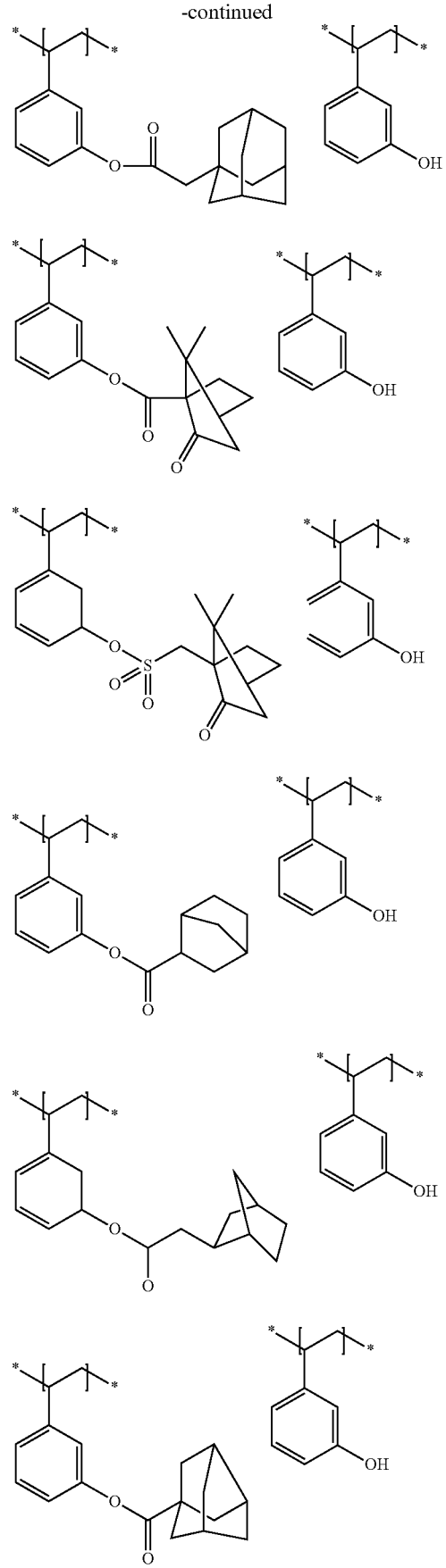

[Chem. 29]
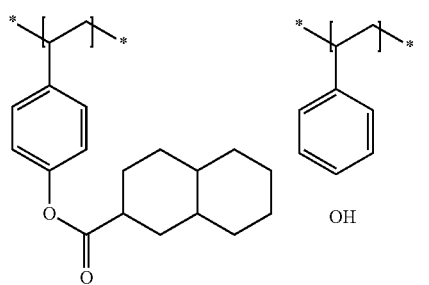
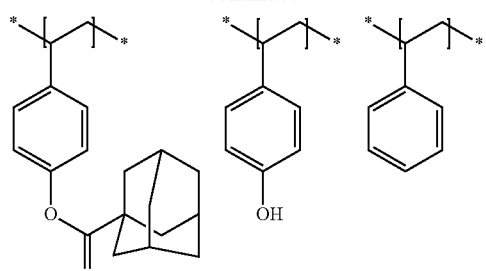
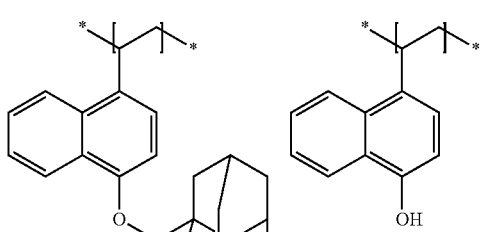
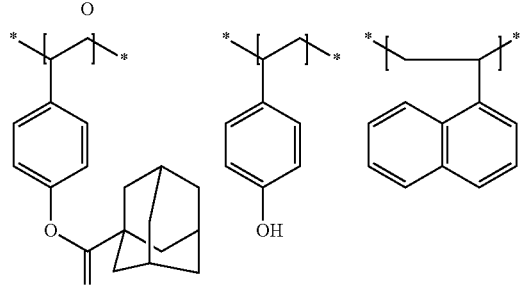
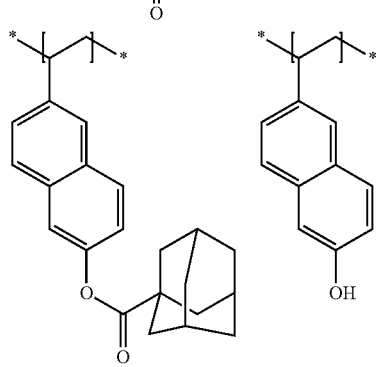
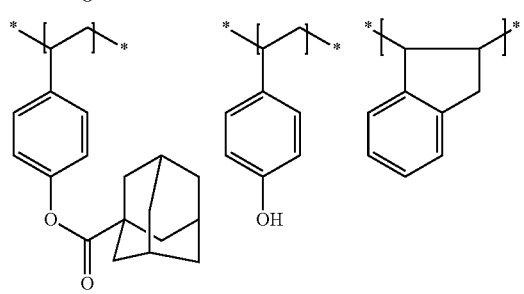
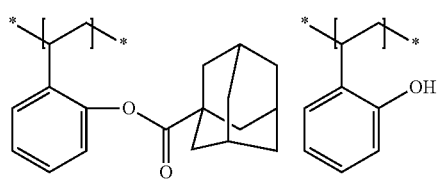
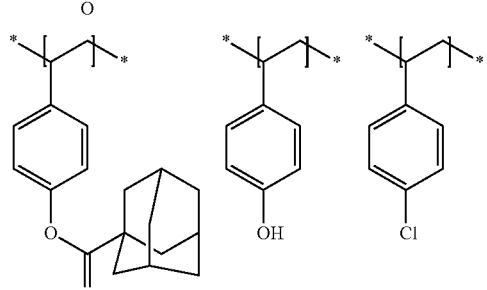
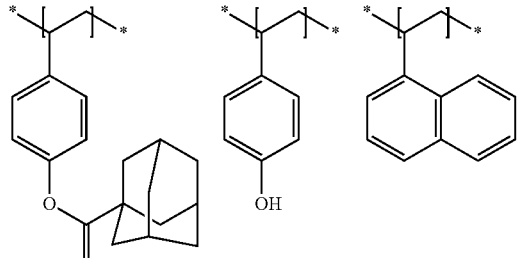
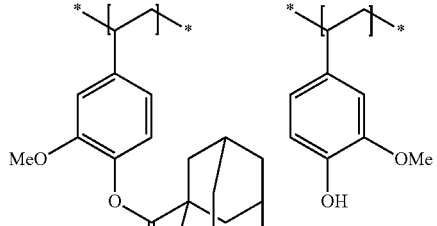
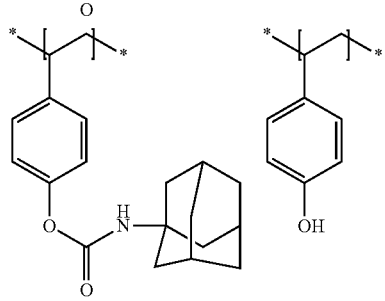
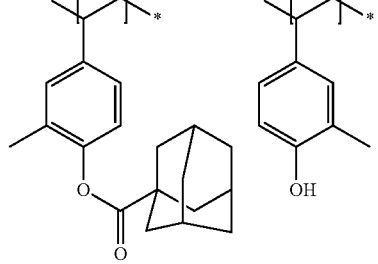

-continued

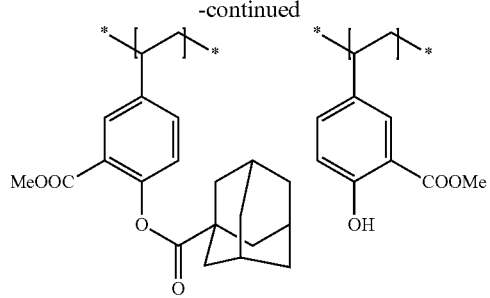

[Chem. 30]

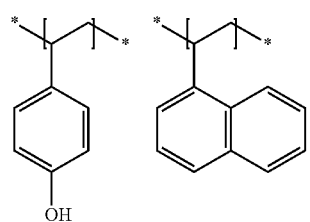

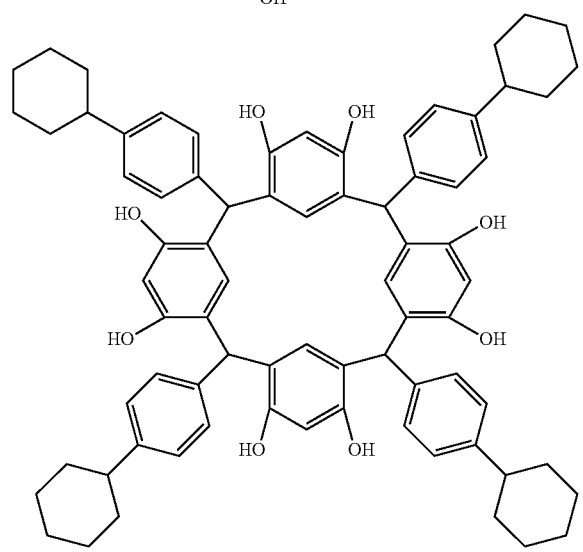

The compound (B) of the present invention may include a repeating unit provided with a ionic structural site generating an acid on a side chain of a resin by being degraded by irradiation of active rays or radiation. Examples of such a repeating unit include repeating units represented by General Formula (4) described below.

[Chem. 31]

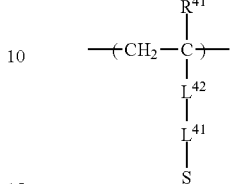

$R^{41}$ represents a hydrogen atom or a methyl group; $L^{41}$ represents a single bond or a divalent linking group. $L^{42}$ represents a divalent linking group. S represents a structural moiety causing an acid to be generated on a side chain by being degraded by irradiation of active rays or radiation.

Specific examples of compound (B) as the acid degradable resin described above are shows below; however, the present invention is not limited thereto.

[Chem. 32]

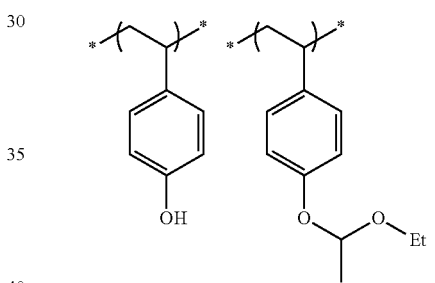
(R-1)

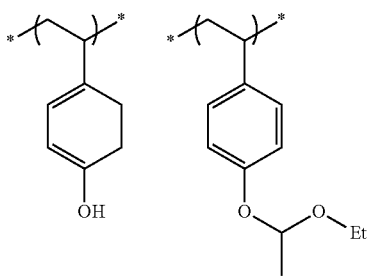
(R-2)

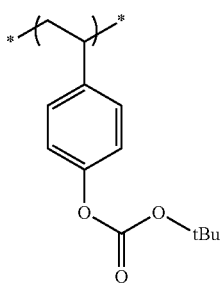

-continued
(R-3)
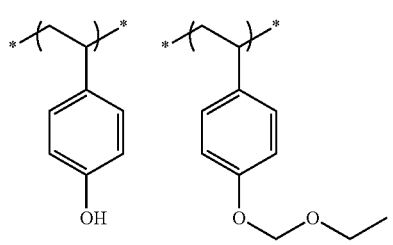
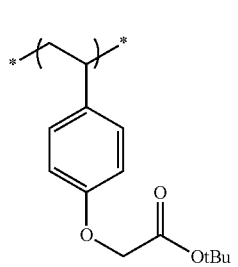
(R-4)
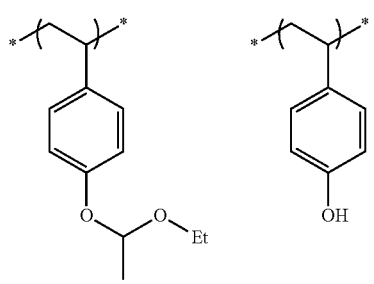
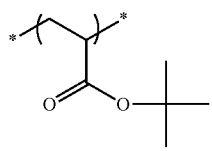
(R-5)
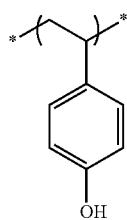
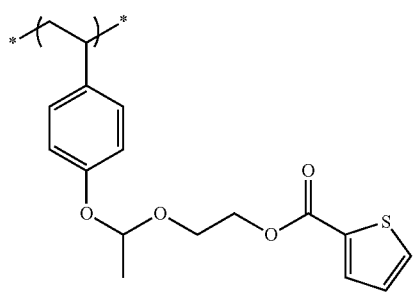
-continued
(R-6)
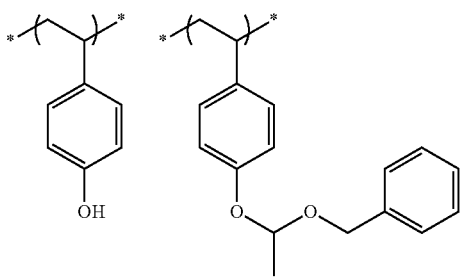
(R-7)
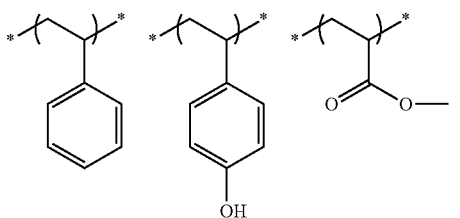
(R-8)
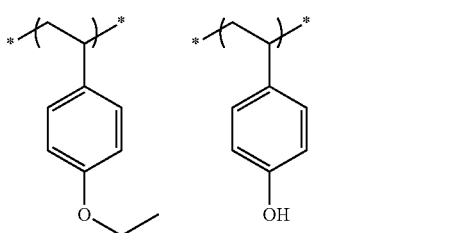
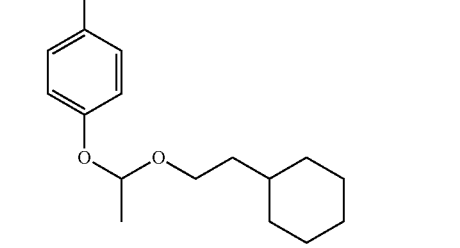
(R-9)

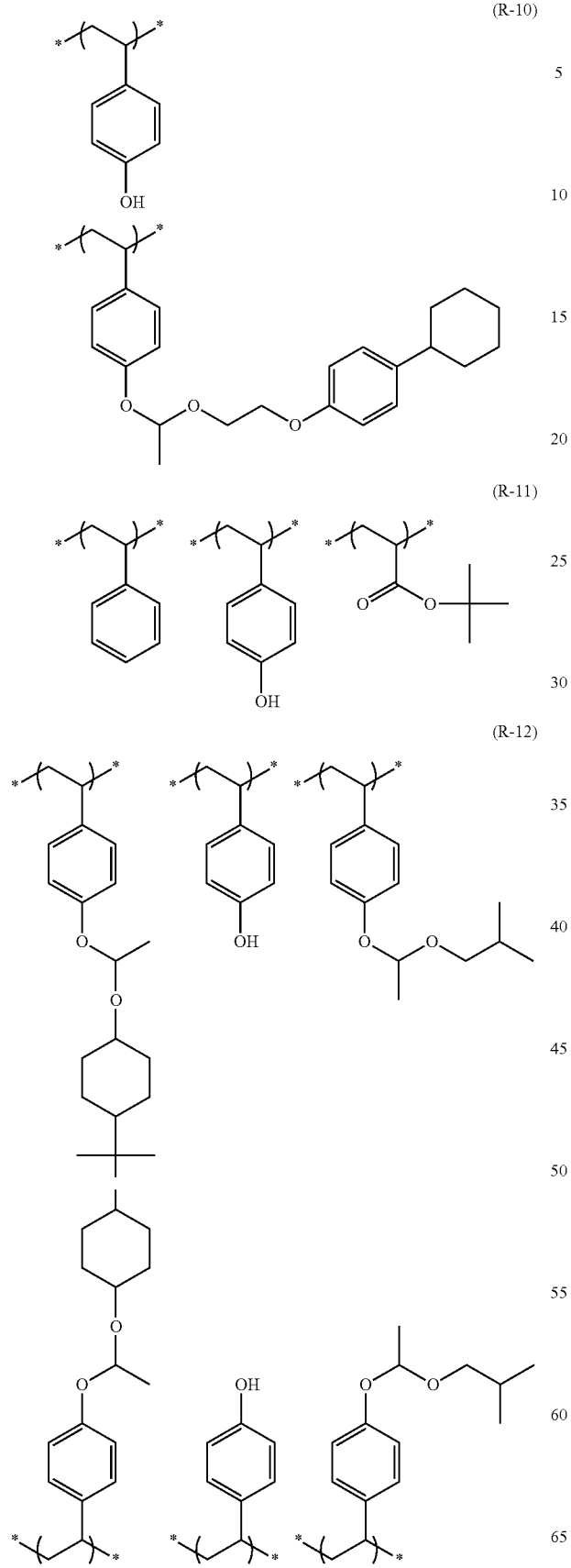

[Chem. 33]
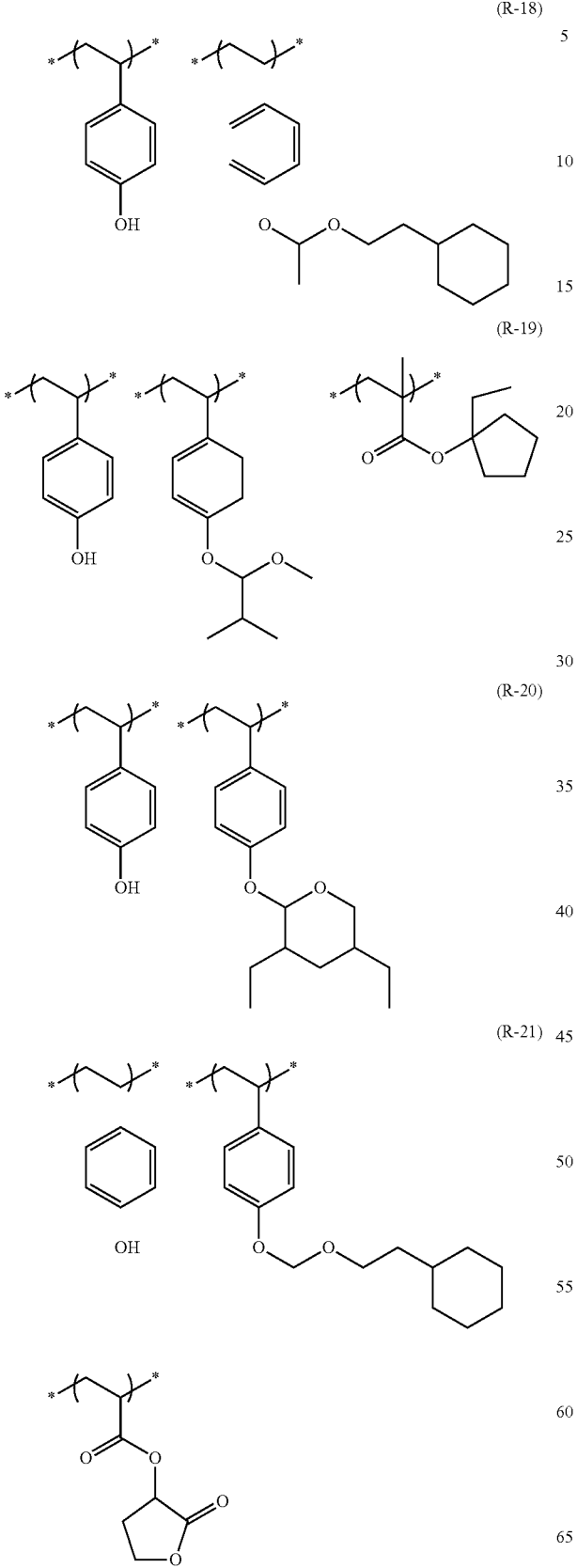
[Chem. 34]
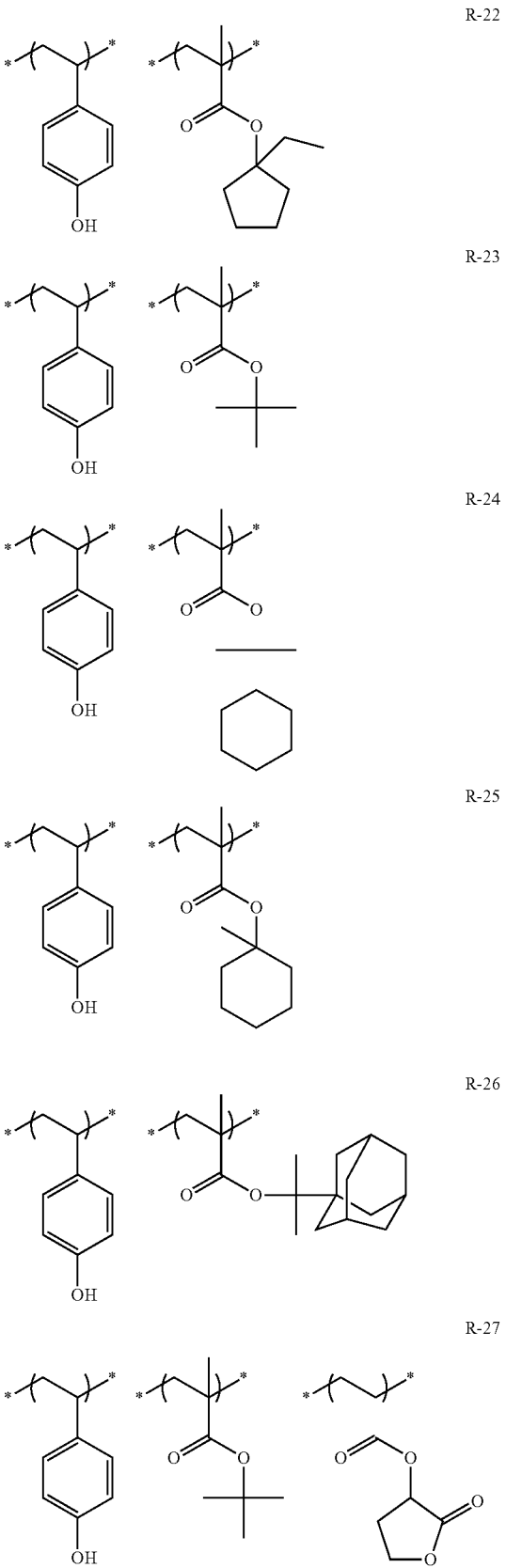

[Chem. 35]
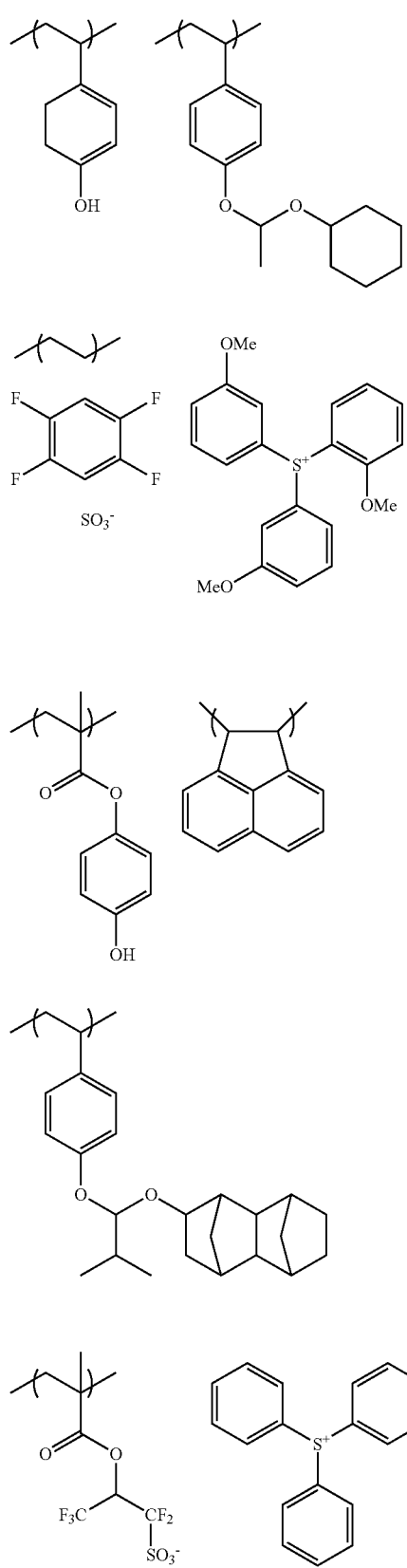
R-28
[Chem. 36]
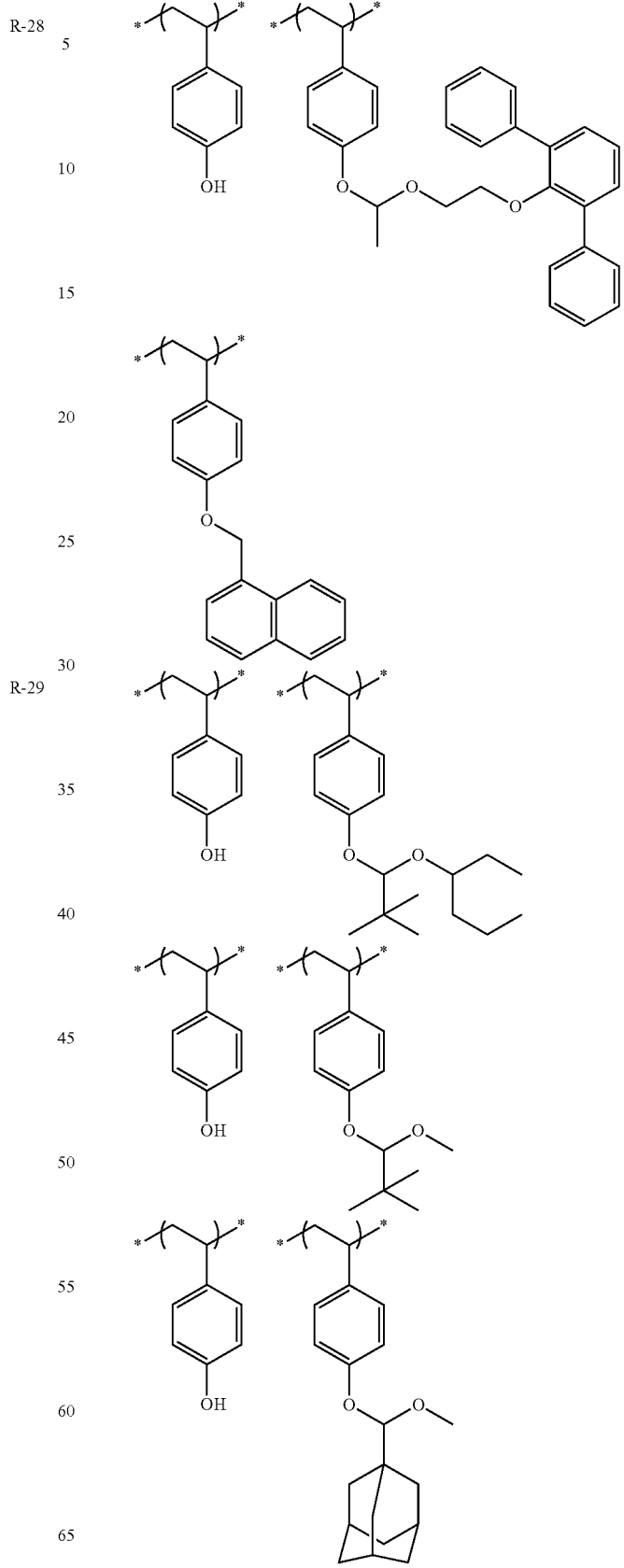
R-29

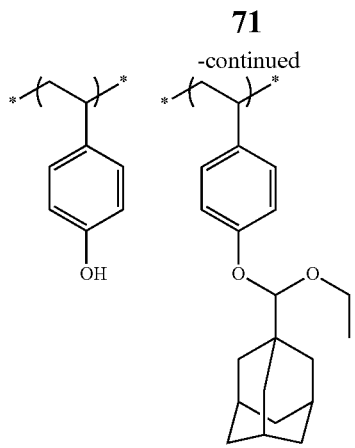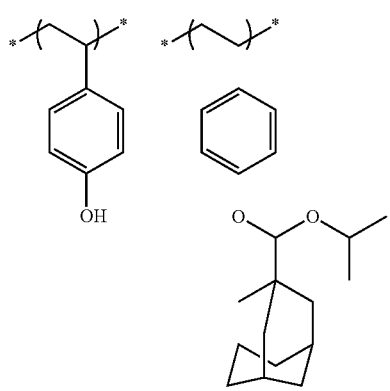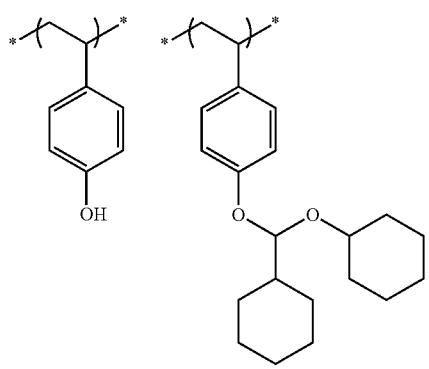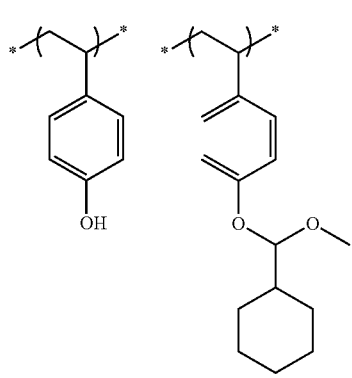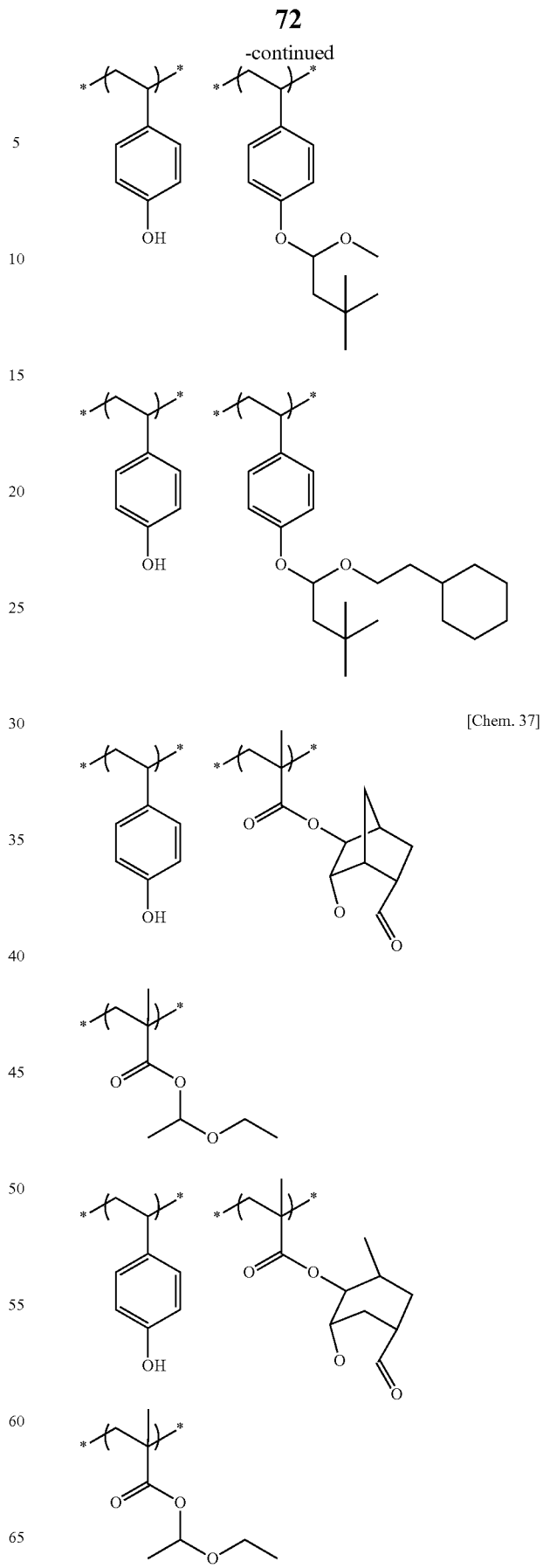

-continued
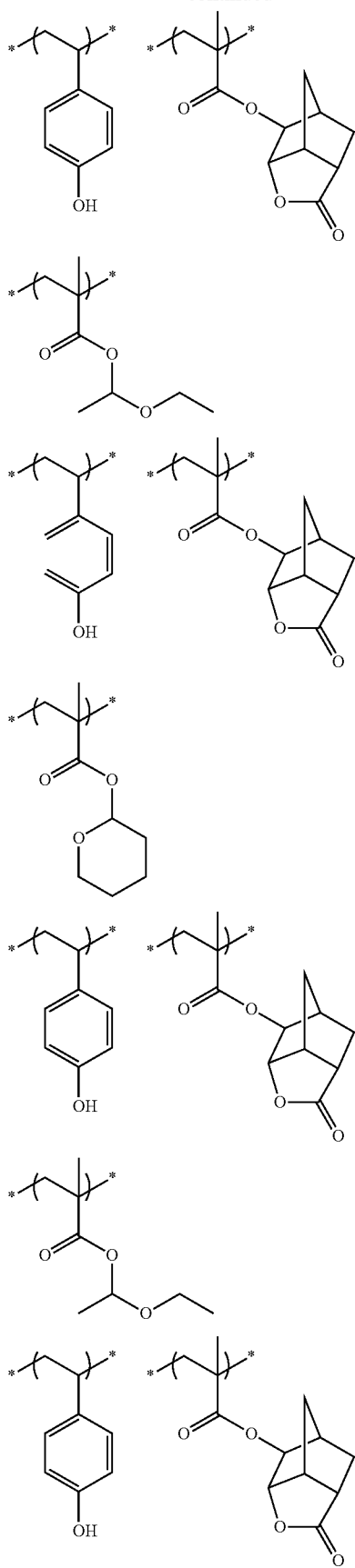
-continued
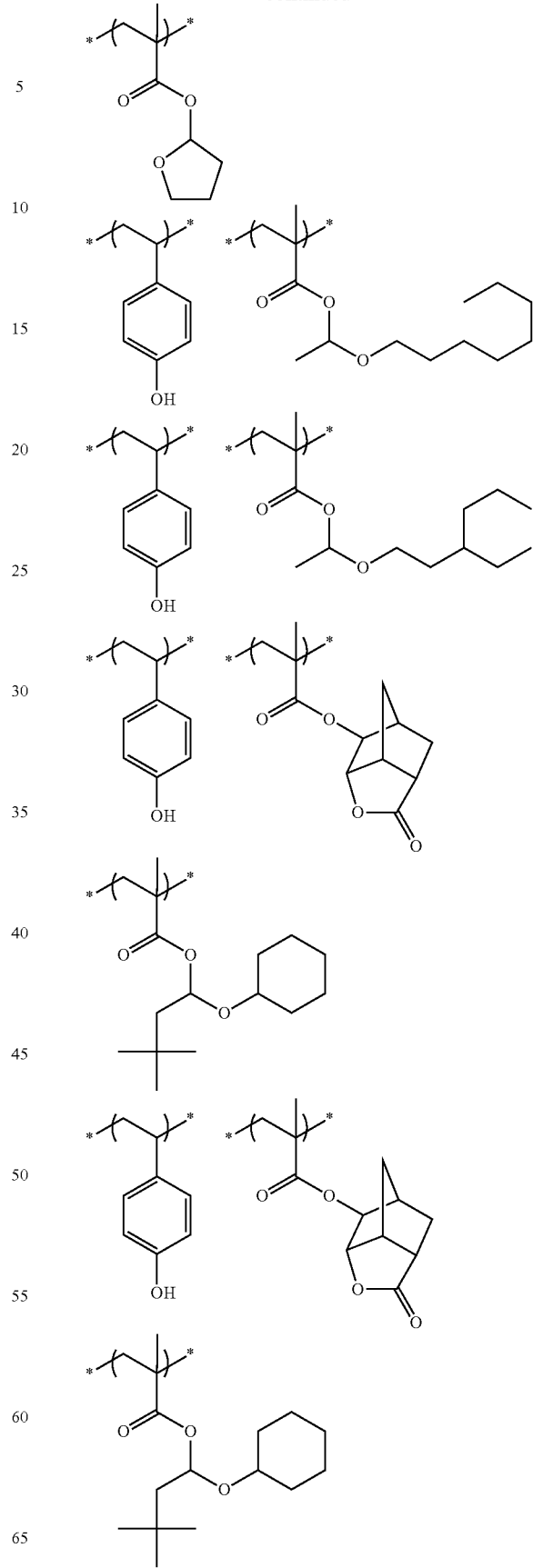

75
-continued
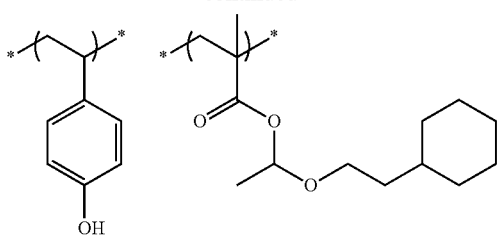
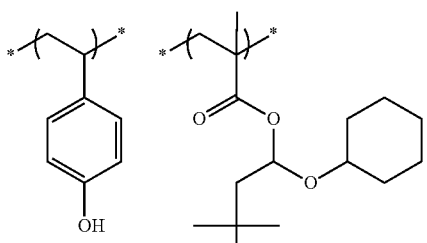
[Chem. 38]
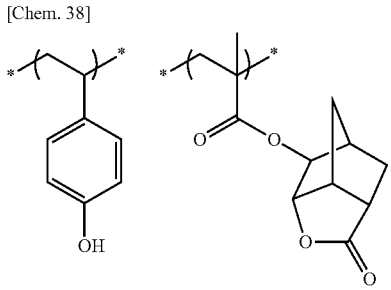
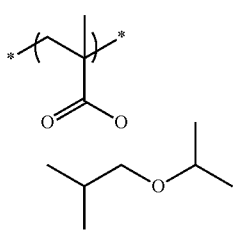
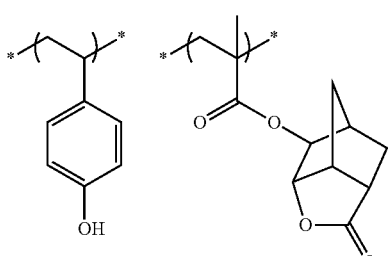
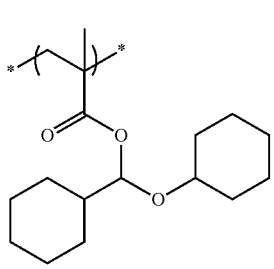
76
-continued
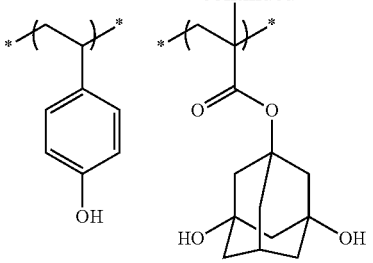
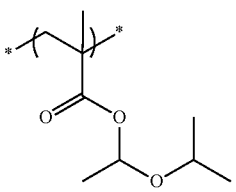
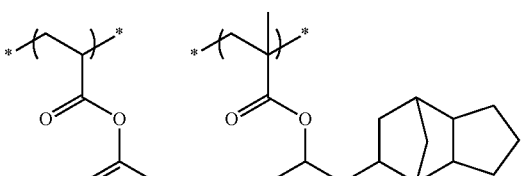
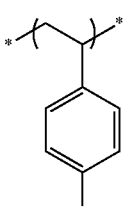
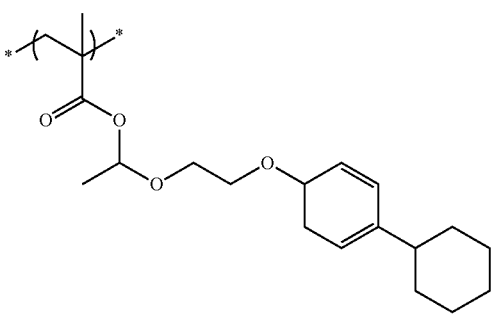
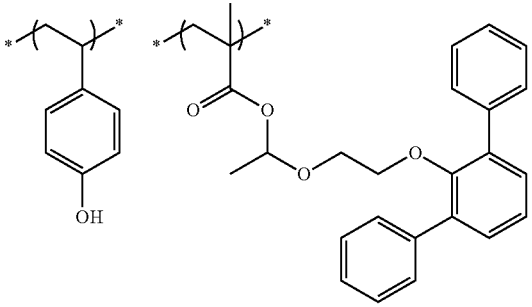

77
-continued
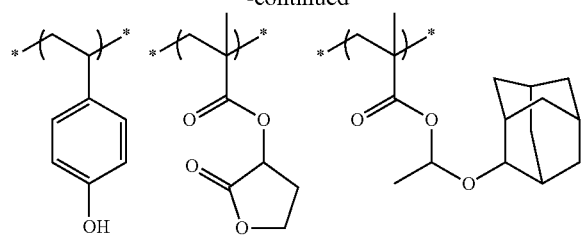
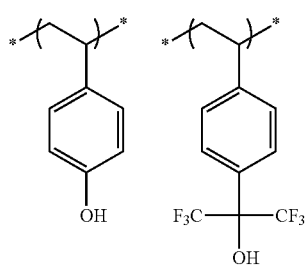
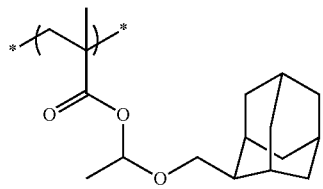
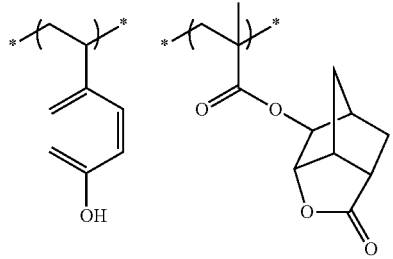
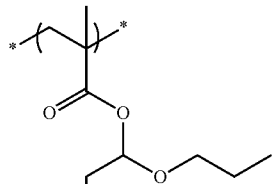
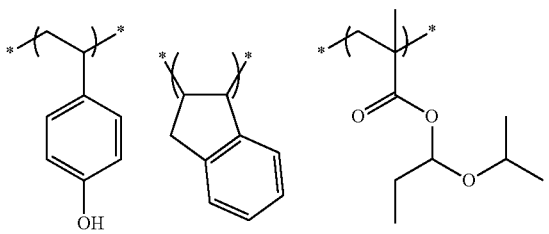
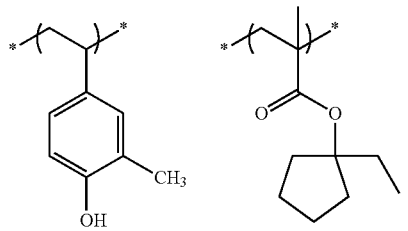
78
-continued
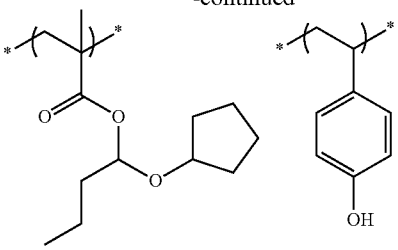
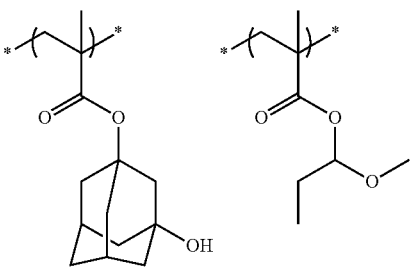
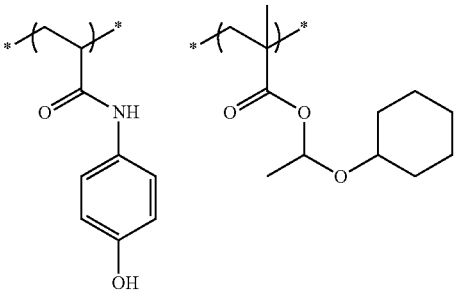
[Chem. 39]
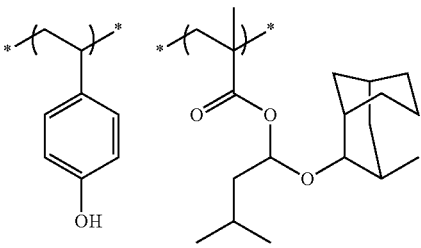
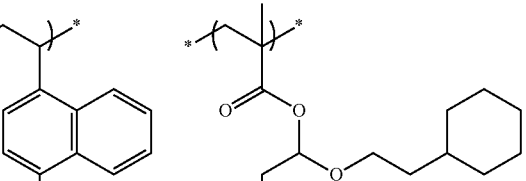
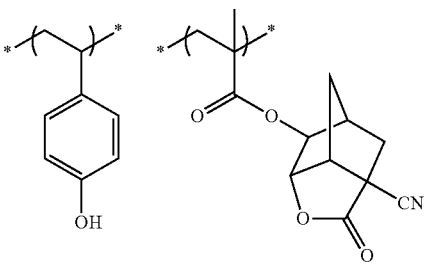

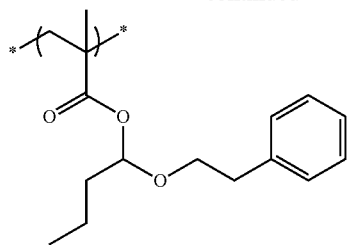
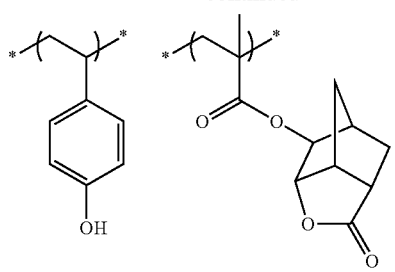
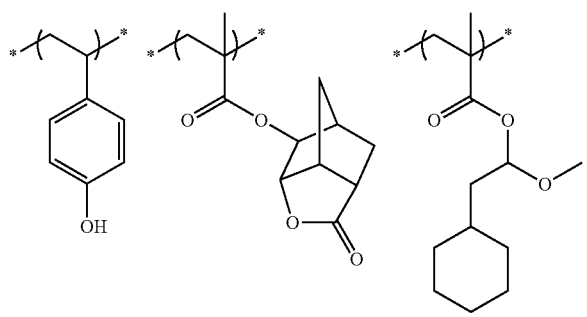
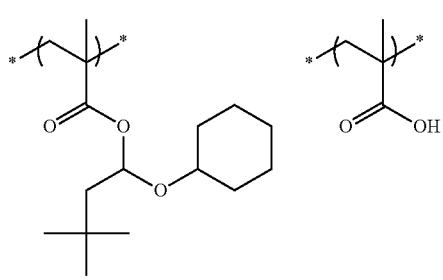
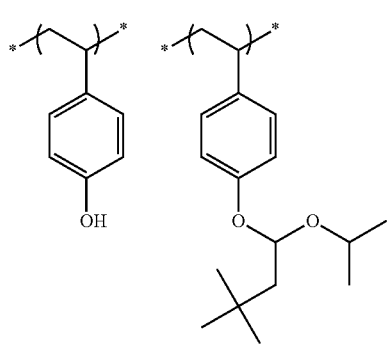
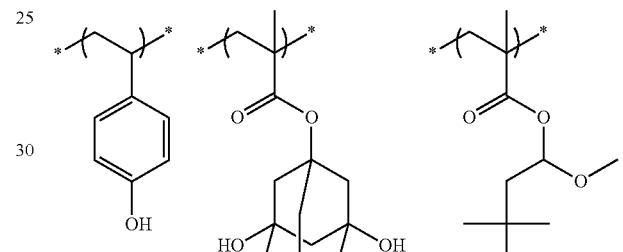
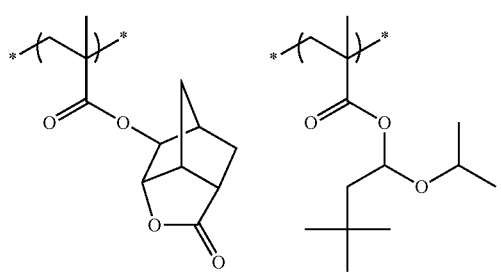
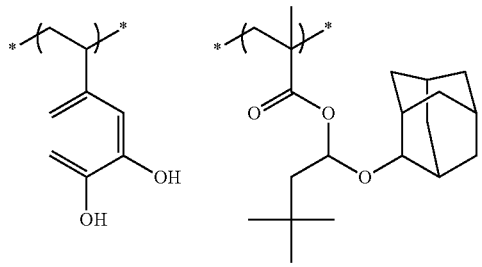
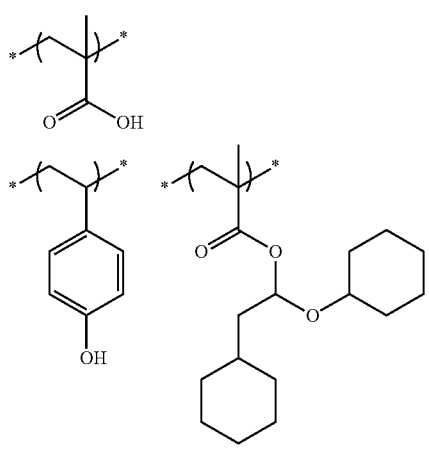
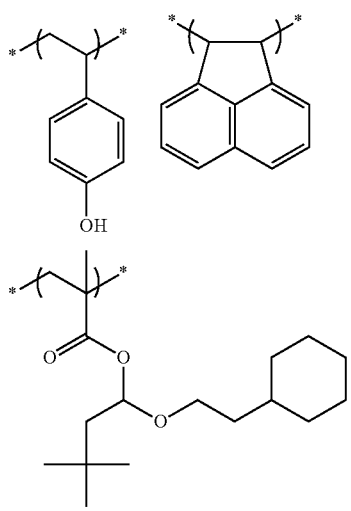

81
-continued
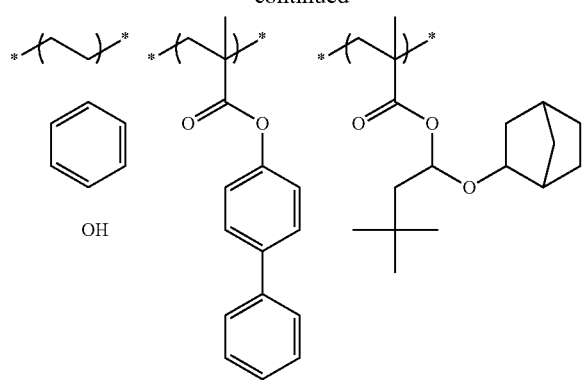
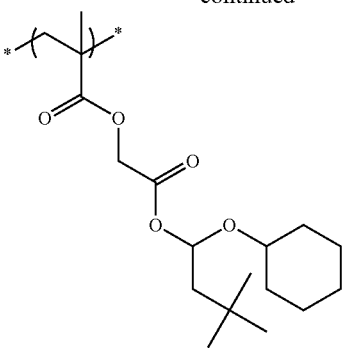
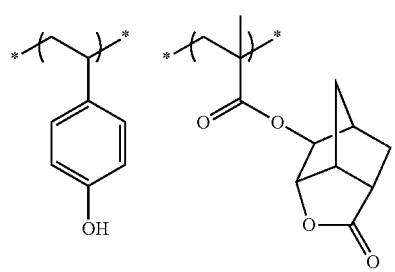
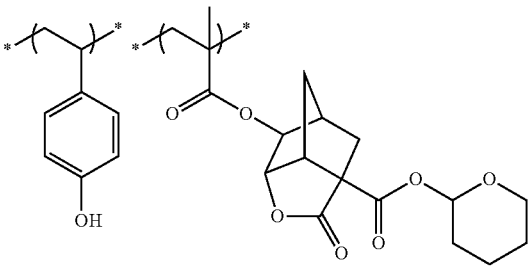
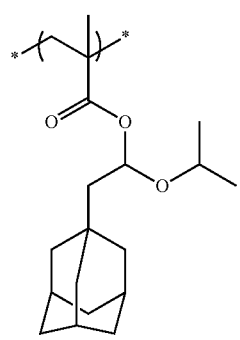
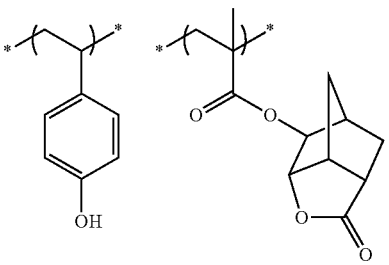
[Chem. 40]
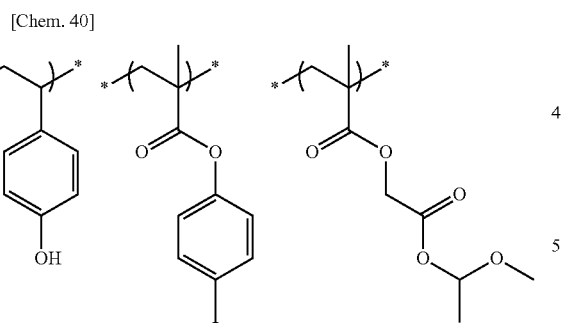
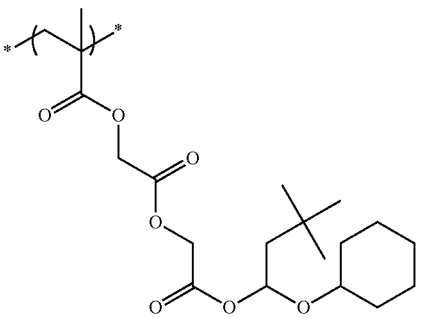
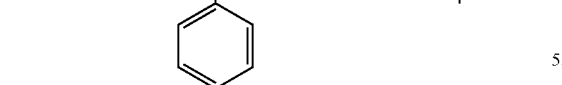
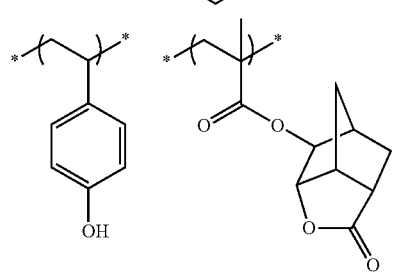
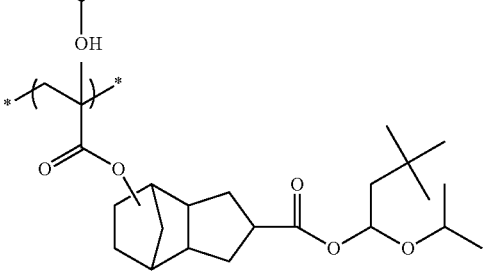
82
-continued

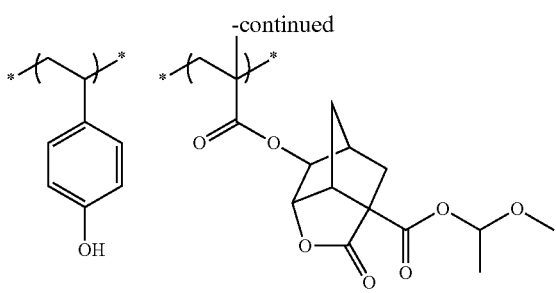
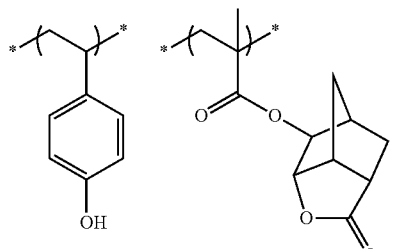
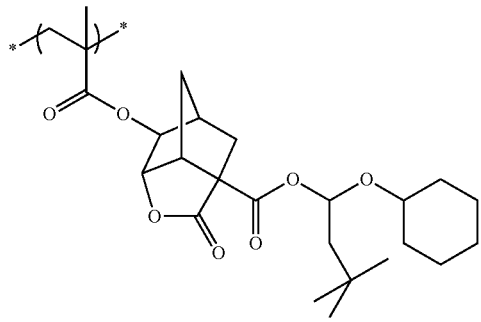
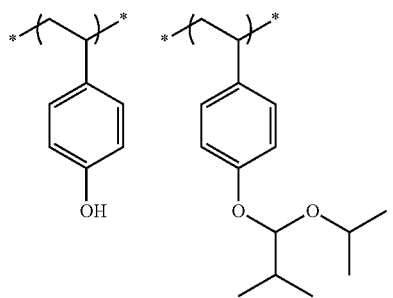
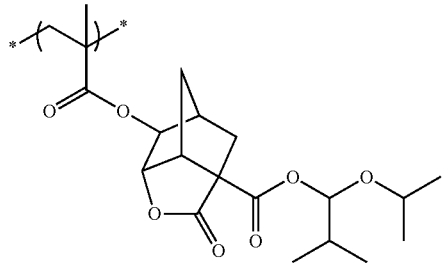
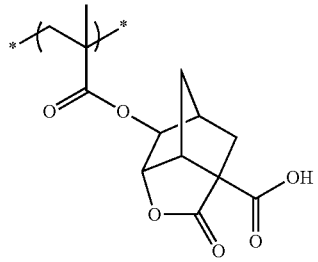
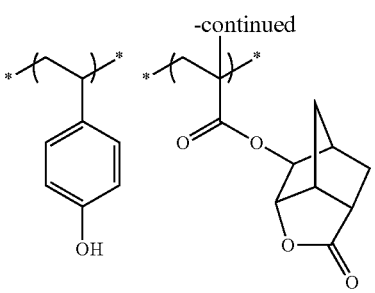
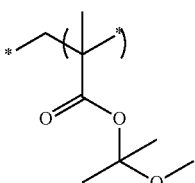
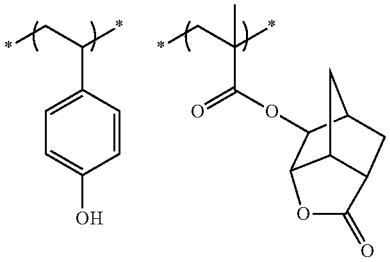
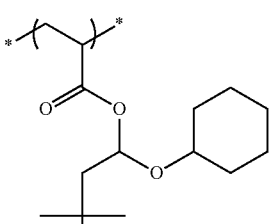
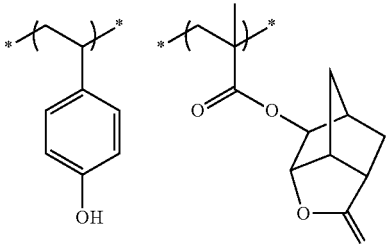
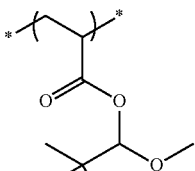
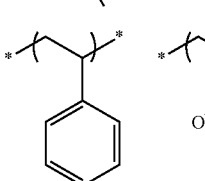

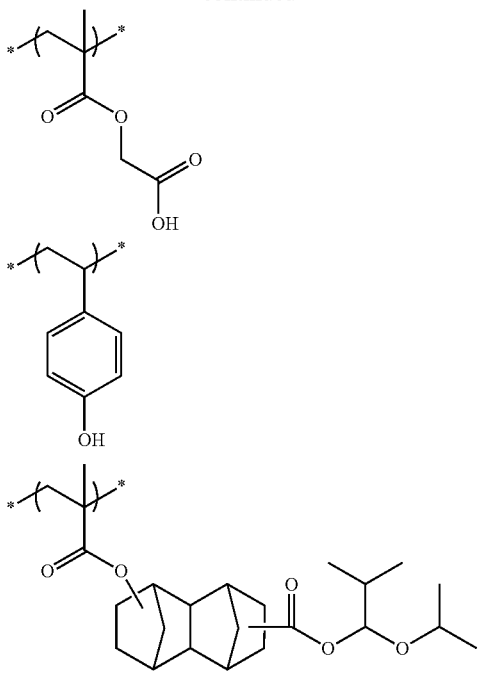

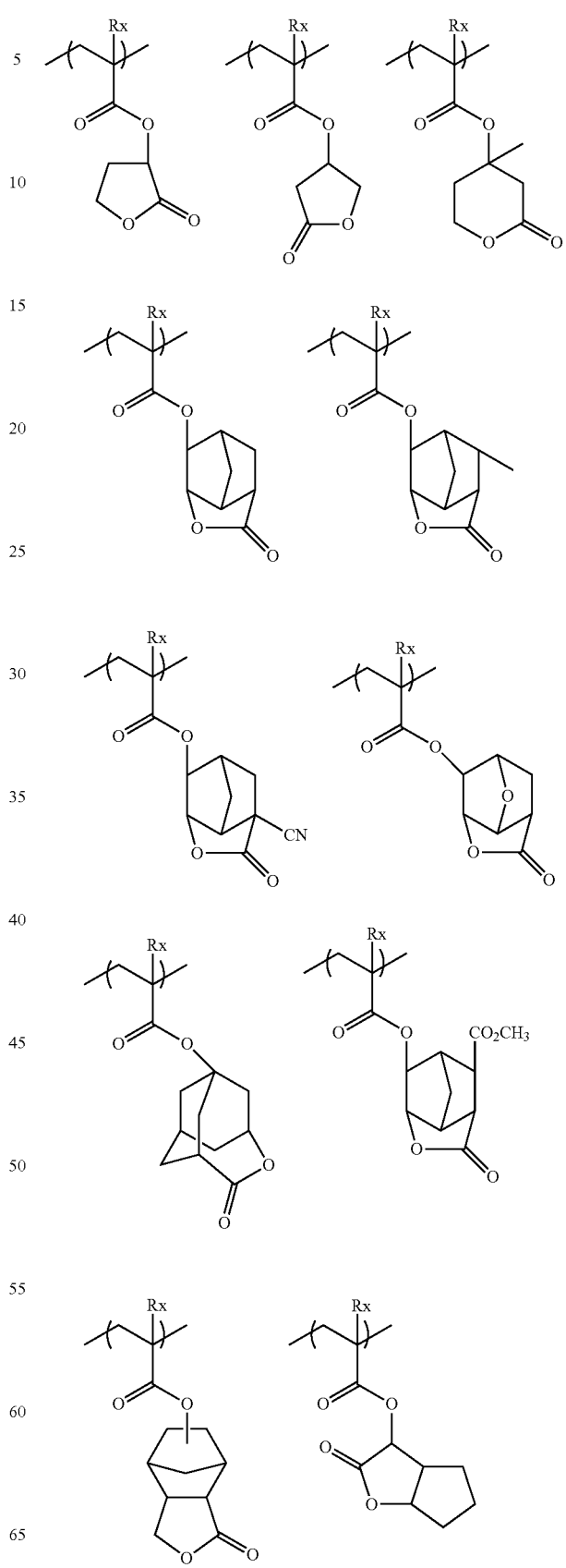

In the specific examples above, tBu represents a t-butyl group. The content rate of the group degradable by acid is calculated by Formula B/(B+S) according to the number (B) of groups degradable by acid in the resin and the number (S) of alkali soluble groups not protected by a group leaving by acid. This content rate is preferably from 0.01 to 0.7, more preferably from 0.05 to 0.50, and most preferably from 0.05 to 0.40.

This resin may include a monocyclic or polycyclic alicyclic hydrocarbon structure. In particular, in a case where the composition of the present invention is irradiated with ArF excimer laser light, including such an alicyclic hydrocarbon structure is preferable.

This resin may include a repeating unit including at least one type selected from a lactone group and a sultone group. In particular, in a case where the composition of the present invention is irradiated with ArF excimer laser light, including a repeating unit including at least one type selected from a lactone group and a sultone group is preferable. The lactone group is preferably a group including a 5 to 7 membered ring lactone structure, and in particular, another ring structure is condensed in a form forming a bicyclo structure or a Spiro structure in a 5 to 7 membered ring lactone structure.

Moreover, in a repeating unit including a lactone structure, an optical isomer is ordinarily present; however, any optical isomer may be used. In addition, one optical isomer may be used alone or a mixture of a plurality of optical isomers may be used. In a case where one optical isomer is mainly used, the optical purity thereof is preferably 90% ee or higher, and more preferably 95% ee or higher.

In particular, examples of repeating units including preferable lactone groups include the following repeating units. By selecting the optimal lactone group, the pattern profile and density dependence become excellent. In the Formulae, Rx and R represent H, $CH_3$, $CH_2OH$ or $CF_3$.

87
-continued
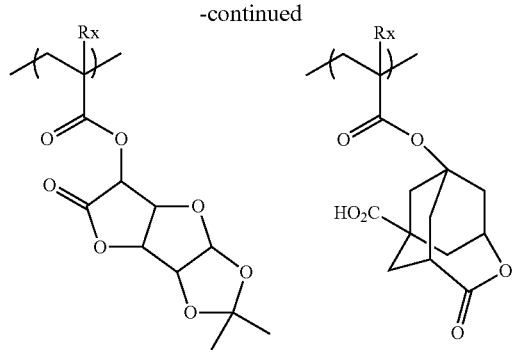
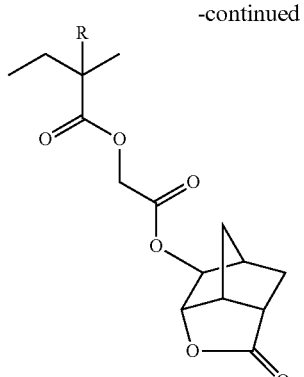
88
-continued
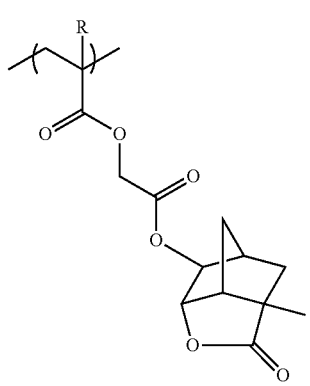
[Chem. 42]
[Chem. 43]
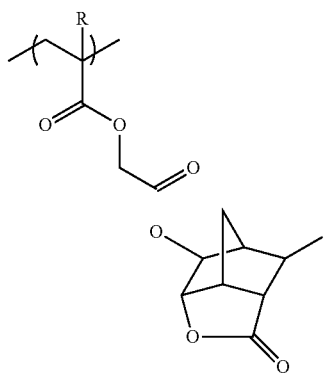
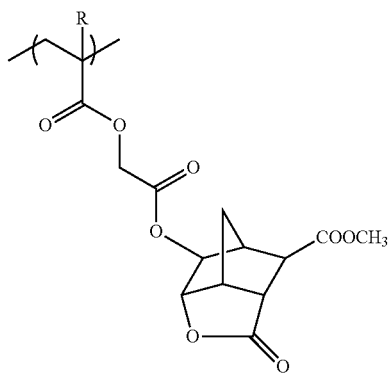

89
-continued
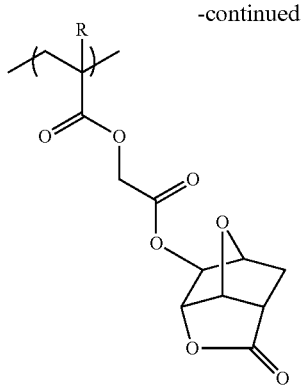
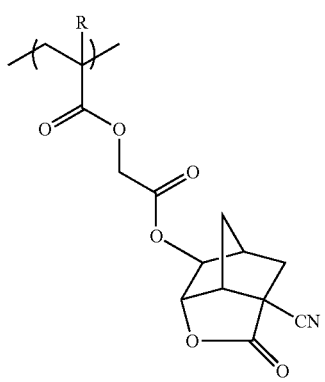
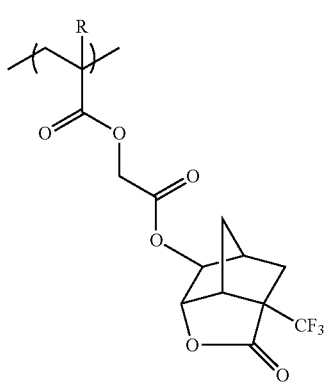
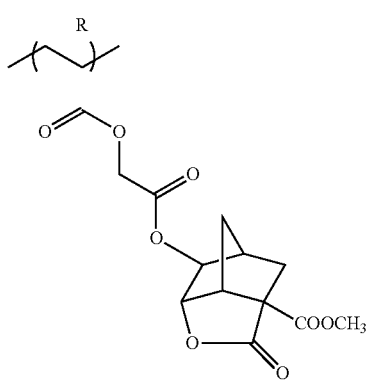
90
-continued
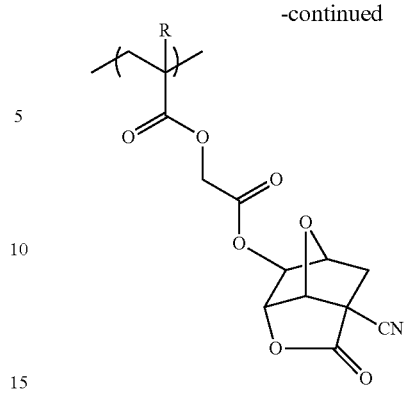
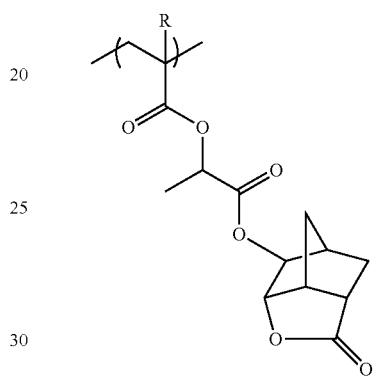
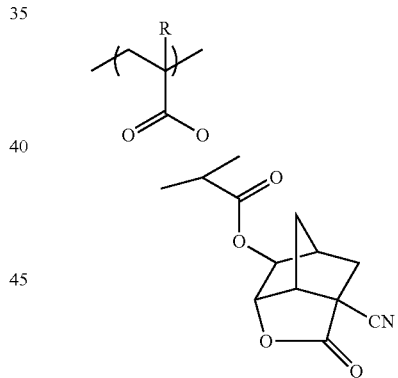
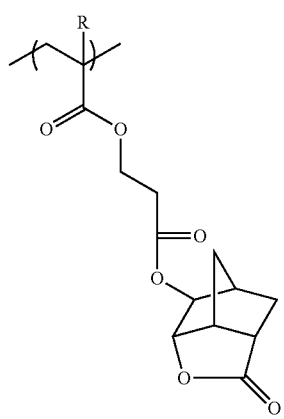

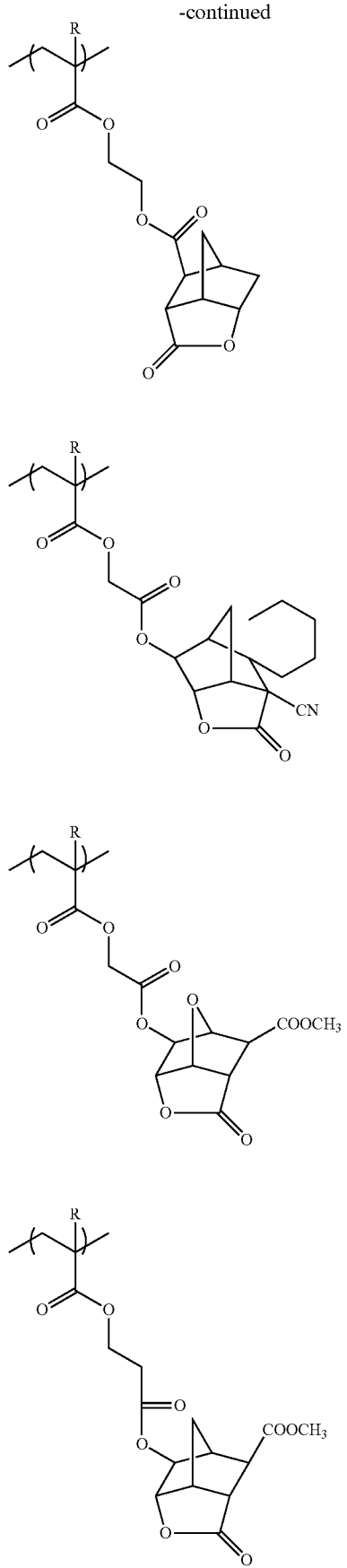
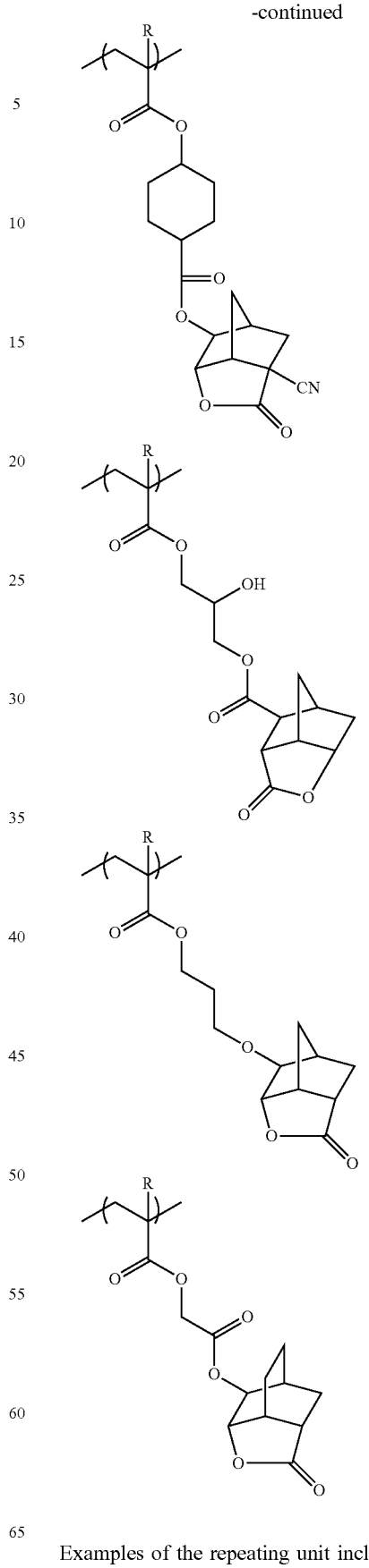
Examples of the repeating unit including this resin preferably include a repeating unit in which a lactone group is substituted with a sultone group in the repeating unit including a lactone group described above.

The weight average molecular weight of the resin in which solubility in alkali developer increases by decomposition due to the action of an acid is preferably within a range of 2000 to 200,000 calculated by the GPC method as a polystyrene conversion value. By setting the weight average molecular weight to 2000 or more, the heat resistance and dry etching resistance may be particularly improved. By setting the weight average molecular weight to 200,000 or less, the film forming properties thereof may also be improved by causing a lowering in the viscosity of the composition, along with a particular improvement in the developability.

A more preferable molecular weight is within a range of 1000 to 200,000, more preferably within a range of 2000 to 50,000 and even more preferably 2000 to 10,000. In addition, in fine pattern formation in which an electron beam, X-rays or a high energy beam with a wavelength of 50 nm or less (for example, EUV) is used, the weight average molecular weight is most preferably set within a range of 3000 to 6000. By adjusting the average molecular weight, the heat resistance and resolving power of the composition may be improved and a reduction of developing defects or the like may be achieved at the same time.

The molecular weight of the compound (C2) of a comparatively low molecular compound such as a molecular resist is preferably 3000 or less, preferably 300 to 2000 and more preferably 500 to 1500.

The degree of dispersion (Mw/Mn) of the resin in which solubility in alkali developer increases by decomposition due to the action of an acid is preferably 1.0 to 3.0, more preferably 1.0 to 2.5, and even more preferably 1.0 to 1.6. By adjusting the degree of dispersion, the line edge roughness performance may be improved.

The combination ratio of the resin accounted for by the composition of the present invention is preferably 30 mass % to 99.9 mass %, more preferably 50 mass % to 99 mass %, and still more preferably 60 mass % to 99 mass % with the total solid content as a standard.

[3] (C) Acid Cross-Linking Compound

The chemical amplification resist composition of the present invention may contain a (C) acid cross-linking compound. In a case where the chemical amplification resist composition of the present invention is used as a negative chemical amplification resist composition, it is preferable to contain a compound (below, appropriately referred to as acid cross-linking agent or simply cross-linking agent) including two or more of a hydroxymethyl group or an alkoxymethyl group in the molecule, as the (C) acid cross-linking compound.

Examples of preferable cross-linking agent include a hydroymethylated or alkoxymethylated phenol compound, an alkoxymethylated melamine-based compound, an alkoxymethyl glycoluril-based compound and an alkoxymethylated urea-based compound. Among these, a hydroxymethylated or alkoxymethylated phenol compound is preferred from the point of obtaining an excellent pattern shape. Particularly preferred examples of the compound (C) as a cross-linking agent include a phenol derivative which contains 3 to 5 benzene rings in the molecule, has two or more hydroxymethyl groups or alkoxymethyl groups in total, and has a molecular weight of 1200 or less; and a melamine-formaldehyde derivative or an alkoxymethyl glycoluril derivative, which has at least two free N-alkoxymethyl groups.

From the viewpoint of pattern shape, the chemical amplification resist composition of the present invention as a crosslinking compound (C) more preferably contains at least two types of compounds including two or more alkoxymethyl groups in the molecule, more preferably contains at least two types of phenol compound including two or more alkoxymethyl groups in the molecule, and at least one type of the at least two types of phenol compound is particularly preferably a phenol derivative with a molecular weight of 1200 or less including 3 to 5 benzene rings in the molecule and further including two or more alkoxymethyl groups.

The alkoxymethyl group is preferably a methoxymethyl group or an ethoxymethyl group.

Among the cross-linking agents, the phenol derivative having a hydroxymethyl group can be obtained by allowing a corresponding phenol compound which does not have a hydroxymethyl group and formaldehyde to react in the presence of a base catalyst. Furthermore, the phenol derivative having an alkoxymethyl group can be obtained by allowing a corresponding phenol derivative having a hydroxymethyl group and an alcohol to react in the presence of an acid catalyst.

Among such synthesized phenol derivatives, a phenol derivative including an alkoxymethyl group is particularly preferable from the point of sensitivity and storage stability.

Other preferred examples of the cross-linking agent include compounds having N-hydroxymethyl groups or N-alkoxymethyl groups, such as alkoxymethylated melamine-based compounds, alkoxymethyl glycoluril-based compounds, and alkoxymethylated urea-based compounds.

Examples of these compounds include hexamethoxymethyl melamine, hexaethoxymethyl melamine, tetramethoxymethyl glycoluril, 1,3-bismethoxymethyl-4,5-bismethoxyethylene urea, and bismethoxymethyl urea, and these are disclosed in EP0,133,216A, German Patent 3,634,671, German Patent 3,711,264, and EP0, 212, 482A.

Particularly preferred examples among these cross-linking agents will be shown below.

[Chem. 44]

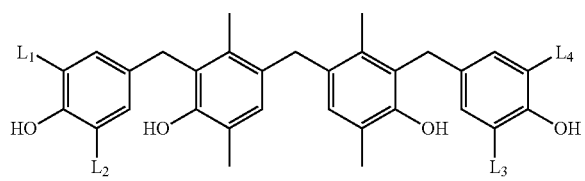

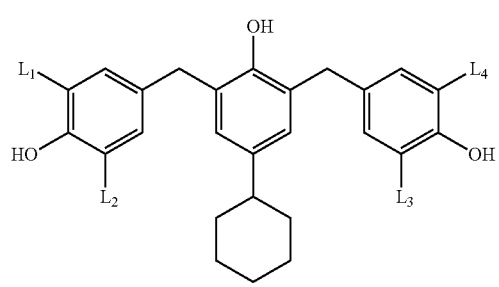

-continued

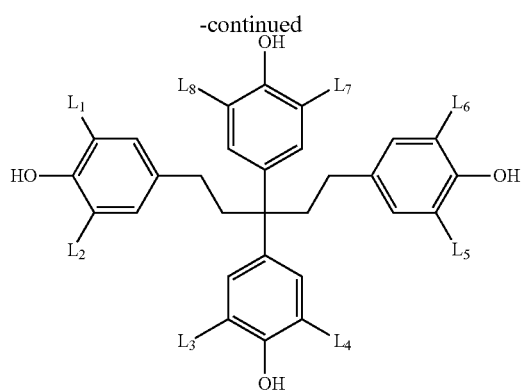

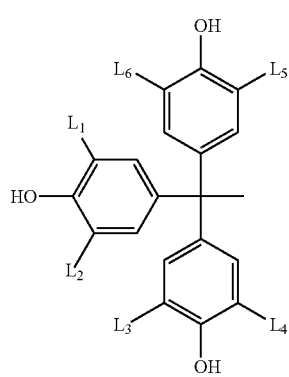

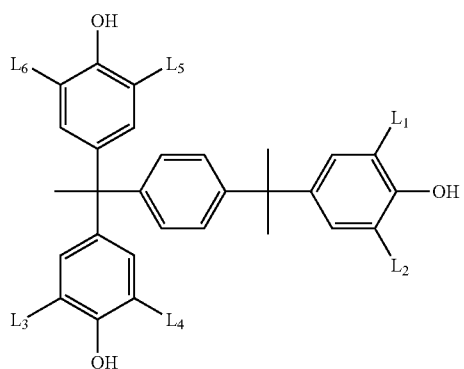

-continued

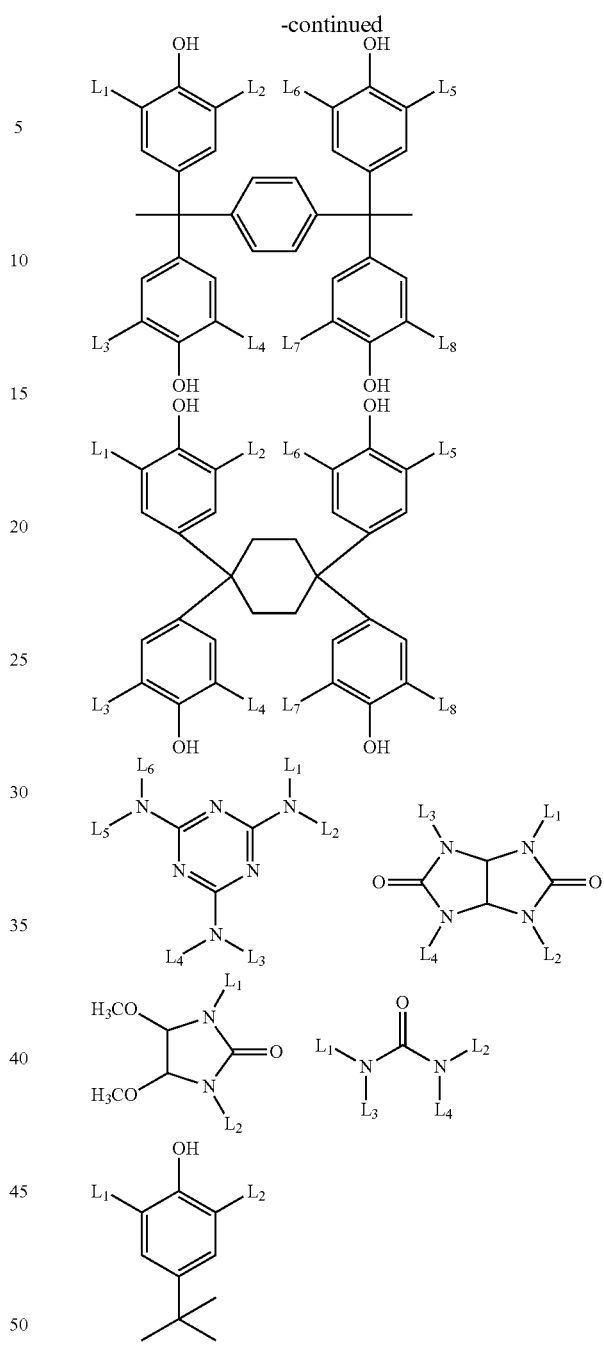

wherein $L_1$ to $L_8$ each independently represent a hydrogen atom, a hydroxymethyl group, a methoxymethyl group, an ethoxymethyl group, or an alkyl group having 1 to 6 carbon atoms.

In the solid content of the chemical amplification resist composition, the cross-linking agent in the present invention is preferably used at an addition amount of 3 mass % to 65 mass %, and more preferably 5 mass % to 50 mass %. When the addition amount of the cross-linking agent is set to 3 mass % to 65 mass %, decreases in the residual film ratio and resolving power are prevented, and the stability upon storage of the resist liquid can be satisfactorily maintained.

According to the present invention, the cross-linking agent may be used alone, or two or more kinds may be used in combination. From the viewpoint of the pattern shape, it is preferable to use two or more kinds in combination.

For example, when another cross-linking agent, for example, such as, the aforementioned compound having an N-alkoxymethyl group, is used in combination with the phenol derivative described above, the proportion of the phenol derivative and the other cross-linking agent is, as a molar ratio, 100/0 to 20/80, preferably 90/10 to 40/60, and more preferably 80/20 to 50/50.

The acid cross-linking compound (C) may be resin including a repeating unit including the acid cross-linking group (hereinafter, referred to resin (C″)). In a case where the acid cross-linking compound (C) is the resin (C″), since the repeating unit in the resin (C″) includes an acid cross-linking group, the cross-linking reactivity is high and a hard film can be formed compared to a chemical amplification resist composition containing a resin not including a repeating unit including an acid cross-linking group. As a result, it is thought that dry etching resistance improves. In addition, since diffusion of acid in portions exposed to active rays or radiation is suppressed, it is thought that the resolving power improves in a case where a fine pattern is formed, the pattern shape improves, and the line edge roughness (LER) is further reduced as a result. In addition, in a case in which the reaction point of the resin and the reaction point of the cross-linking group are in close proximity as in the repeating unit represented by General Formula (1) below, it is thought that the sensitivity of the chemical amplification resist composition improves.

Examples of the resin (C″) include resins including the repeating unit represented by General Formula (1) below. The repeating unit represented by the General Formula (1) has a structure including at least one methylol group which may include a substituent.

Here, the term "methylol group" is a group represented by General Formula (M) below, and in one embodiment of the present invention is preferably a hydroxymethyl group or an alkoxymethyl group.

[Chem. 45]

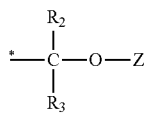

(M)

$R_2$ and $R_3$ represent a hydrogen atom, an alkyl group or a cycloalkyl group.

Z represents a hydrogen atom or a substituent.

Below, General Formula (1) will be described.

[Chem. 46]

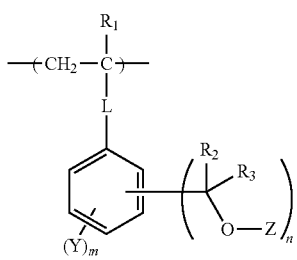

(1)

In General Formula (1), $R_2$, $R_3$ and Z are defined as in the General Formula (M) described above.

$R_1$ represents a hydrogen atom, a methyl group or a halogen atom.

L represents a divalent linking group or a single bond.

Y represents a substituent other than a methylol group.

m represents an integer of 0 to 4.

n represents an integer of 1 to 5.

m+n is 5 or less.

In a case where m is 2 or higher, a plurality of Ys may be the same as each other or may be different.

In a case where n is 2 or higher, a plurality of $R_2$, $R_3$ and Z may be the same as each other, or may be different. In addition, two or more of Y, $R_2$, $R_3$ and Z may be combined together to form a ring structure.

$R_1$, $R_2$, $R_3$, L and Y may each include a substituent.

The content rate of the repeating unit including an acid cross-linking group in the resin (C″) with respect to all of the repeating units of the resin (C″) is preferably 3 mol % to 40 mol % and more preferably 5 mol % to 30%.

The content of the resin (C″) is preferably 5 mass % to 50 mass % and more preferably 10 mass % to 40 mass % in the total solid content of the negative resist composition.

The resin (C″) may include 2 or more types of repeating unit including an acid cross-linking group, or two or more types of resin (C″) may be combined and used. In addition, the compound (C) and resin (C″) may be combined and used.

Specific examples of the repeating unit including an acid cross-linking group included in the resin (C″) include the following structures.

[Chem. 47]

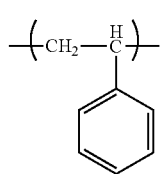

(Q-1)

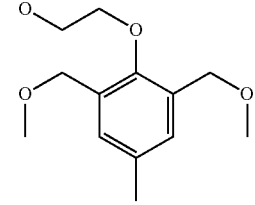

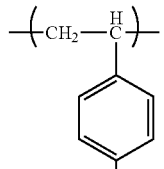

(Q-2)

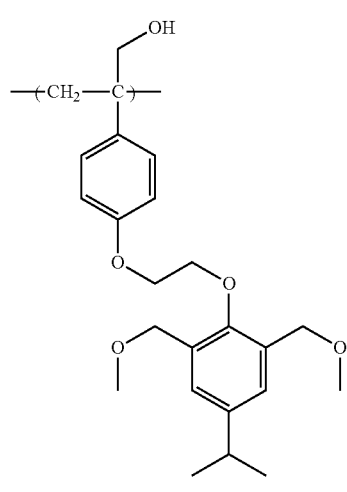
(Q-3)
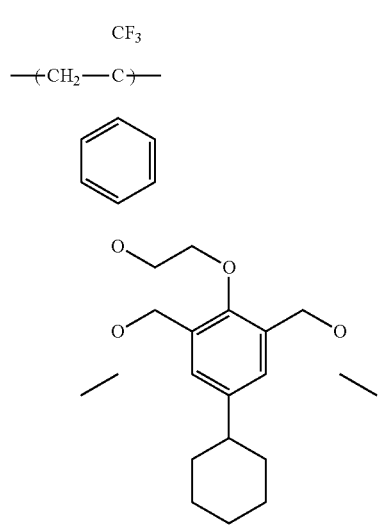
(Q-4)
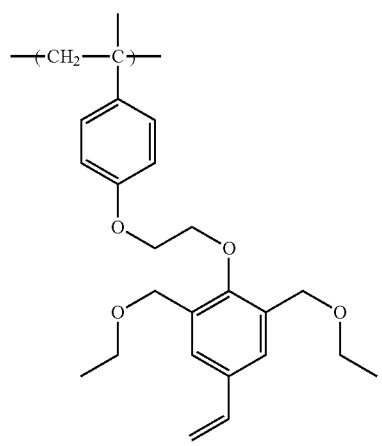
(Q-5)
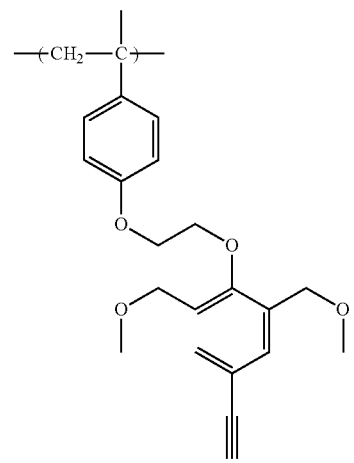
(Q-6)
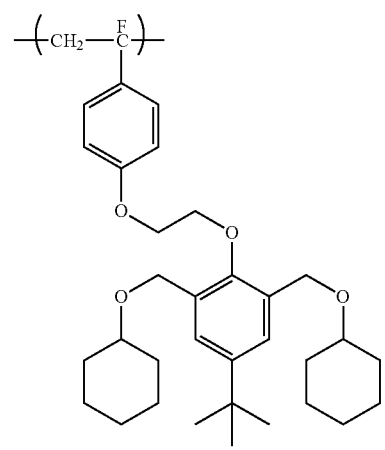
(Q-7)
[Chem. 48]
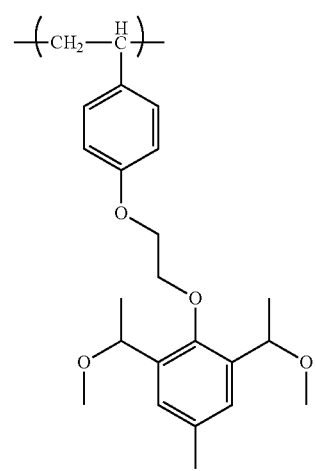
(Q-8)

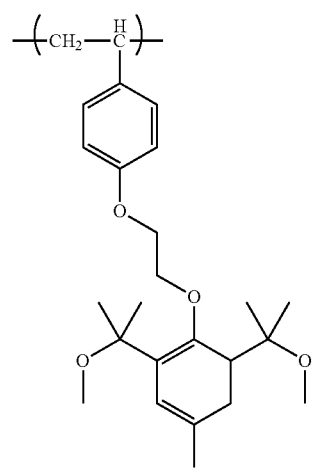
(Q-9)
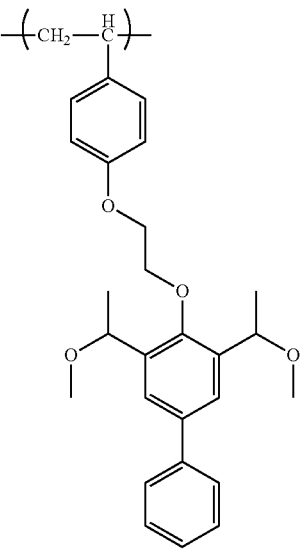
(Q-12)
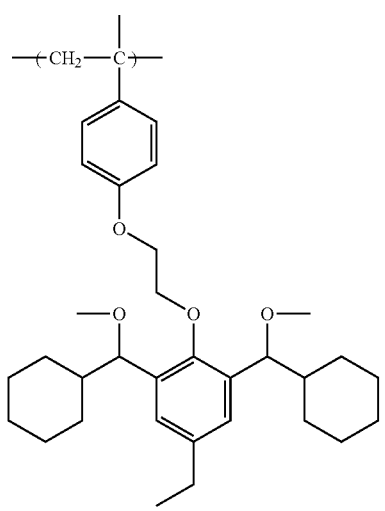
(Q-10)
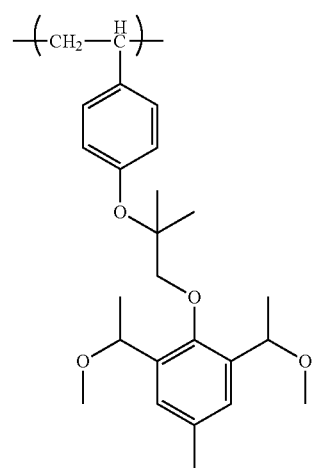
(Q-13)
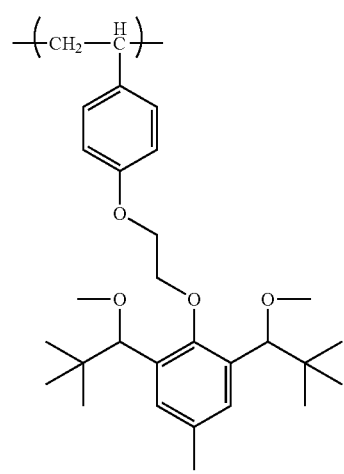
(Q-11)
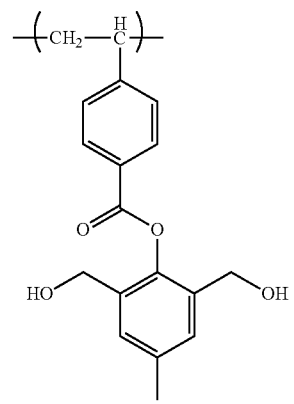
(Q-14)

-continued
(Q-15)
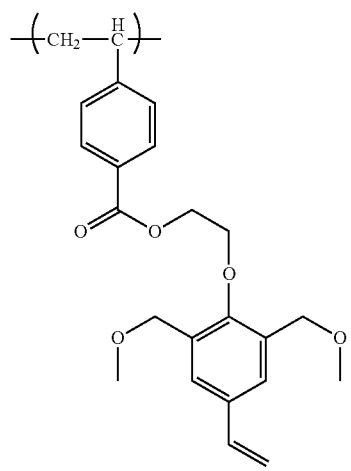
[Chem. 49]
(Q-16)
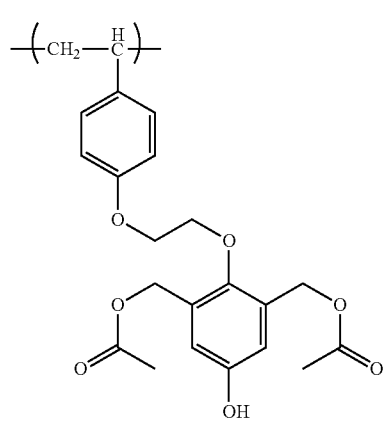
(Q-17)
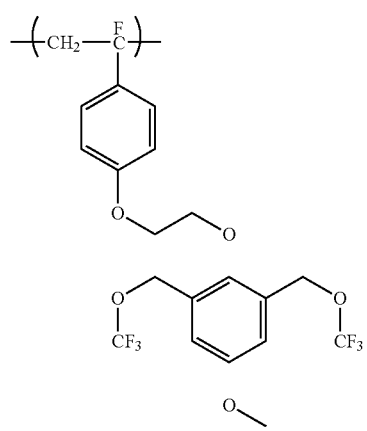
-continued
(Q-18)
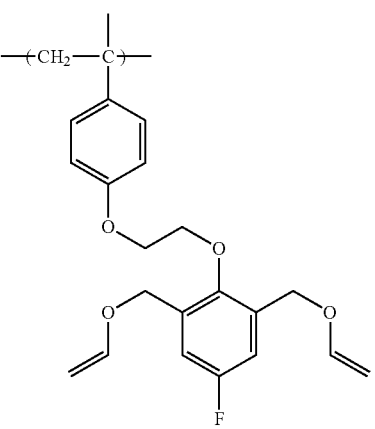
(Q-19)
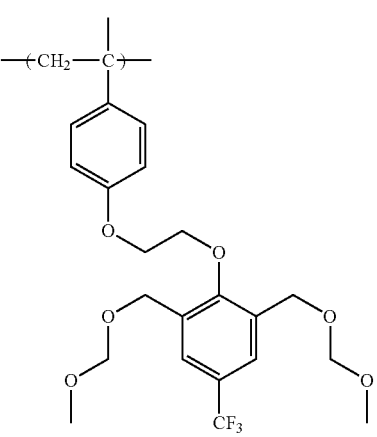
(Q-20)
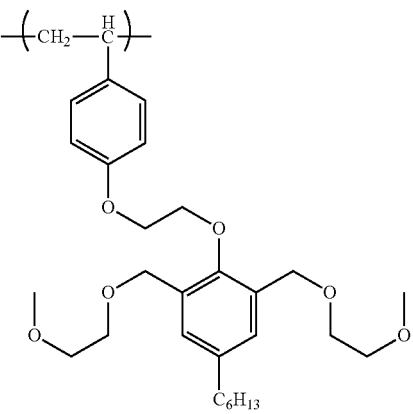

(Q-21) 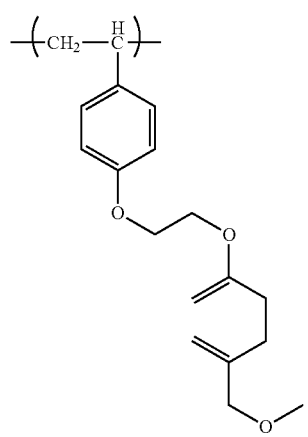
(Q-22) 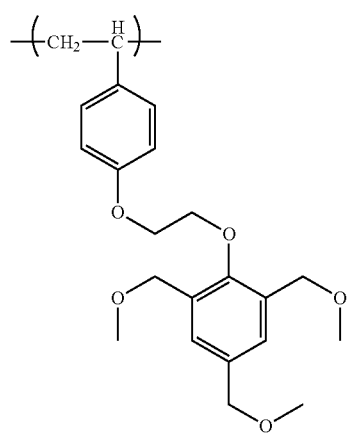
[Chem. 50]
(Q-23) 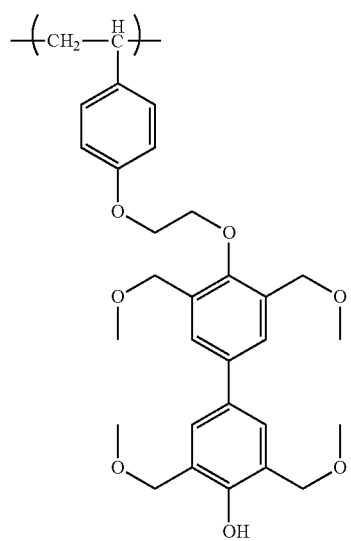
(Q-24) 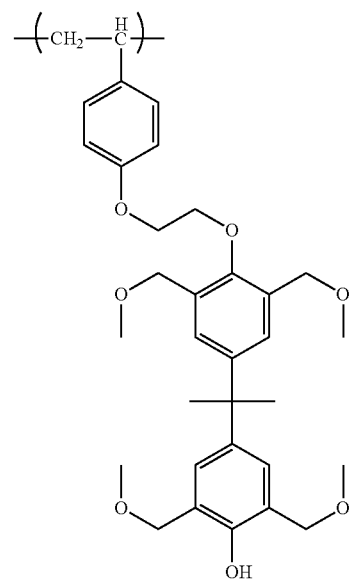
(Q-25) 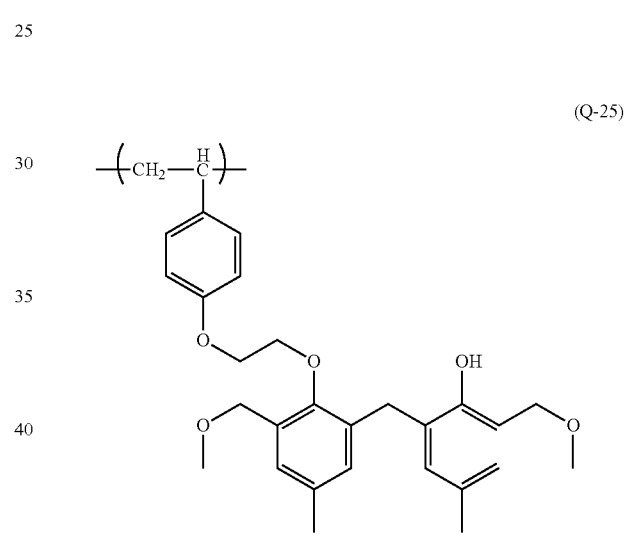
(Q-26) 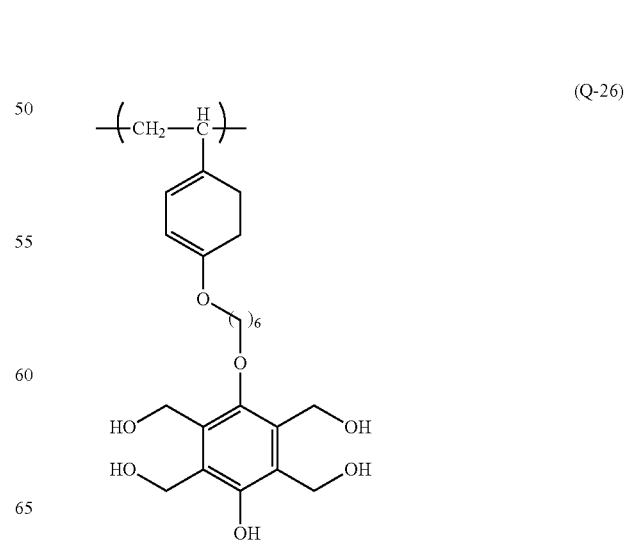

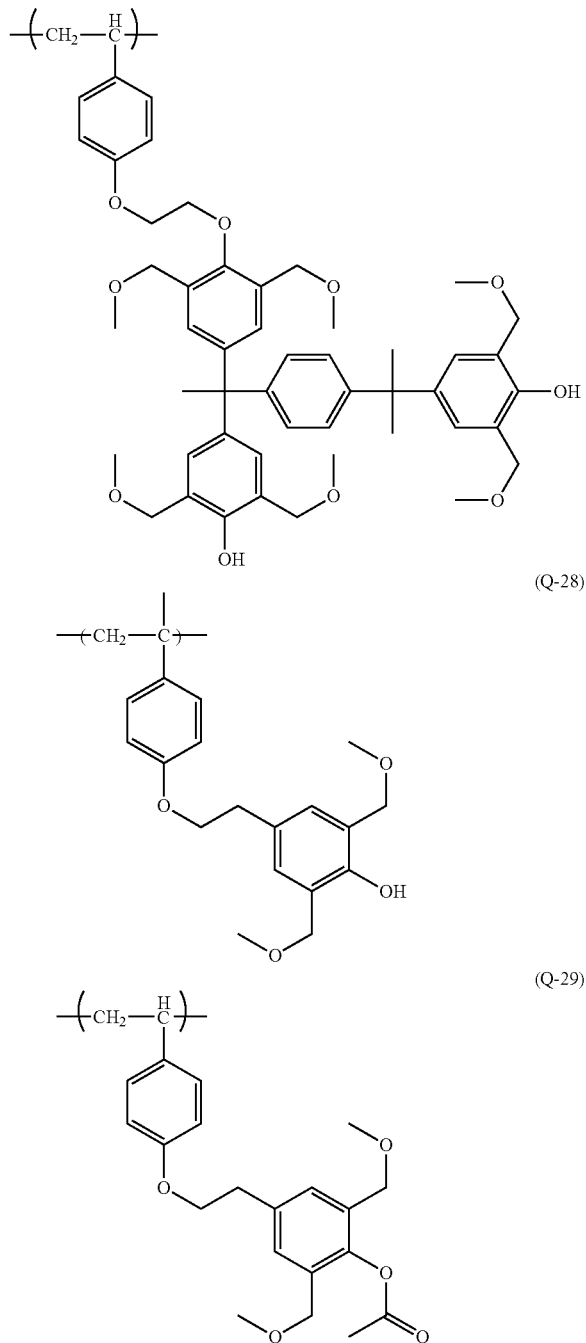

[4] Basic Compound

The chemical amplification resist composition of the present invention preferably contains a basic compound as an acid complement agent, in addition to the components described above. When a basic compound is used, the performance change due to the passage of time from the exposure to the later heating can be reduced. Such a basic compound is preferably an organic basic compound, and more specific examples thereof include aliphatic amines, aromatic amines, heterocyclic amines, nitrogen-containing compounds having carboxyl groups, nitrogen-containing compounds having sulfonyl groups, nitrogen-containing compounds having hydroxyl groups, nitrogen-containing compounds having hydroxyphenyl groups, alcoholic nitrogen-containing compounds, amide derivatives, and imide derivatives. An amine oxide compound (preferably including either or both of a methyleneoxy unit and an ethyleneoxy unit. Examples include compounds disclosed in JP2008-102383A) and an ammonium salt (preferably a hydroxide or carboxylate. More specifically, a tetra-alkylammonium hydroxide represented by tetra-butyl ammonium hydroxide is preferable from the viewpoint of LER) are also appropriately used.

Furthermore, a compound which has an increased basicity under the action of an acid can also be used as one kind of basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine; the compounds exemplified in line 60 in column 3 of US6040112; 2-[2-{2-(2,2-dimethoxyphenoxyethoxy)ethyl}-bis-(2-methoxyethyl)]-amine; and compounds (C1-1) to (C3-3) exemplified in paragraph <0066> of US2007/0224539A1. Examples of the compounds having nitrogen-containing heterocyclic structures include 2-phenylbenzoimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-none-5-ene, 1,8-diazabicyclo[5.4.0]-undeca-7-ene, and tetrabutylammonium hydroxide.

Furthermore, a photodegradable basic compound (a compound in which a basic nitrogen atom initially acts as a base and thereby the compound exhibits basicity, but as the compound is degraded by irradiation of active rays or radiation and generates a zwitterionic compound having a basic nitrogen atom and an organic acid moiety, these moieties are neutralized in the molecule, and basicity is decreased or lost. For example, the onium salts described in JP3577743B, JP2001-215689A, JP2001-166476A, and JP2008-102383A), and a photobase generator (for example, the compounds described in JP2010-243773A) are also appropriately used.

Even among these basic compounds, since excellent LER is obtained, an ammonium salt or a photodegradable basic compound is preferred.

According to the present invention, the basic compound may be used alone, or two or more kinds may be used in combination.

The content of the basic compound used in the present invention is preferably 0.01 mass % to 10 mass %, more preferably 0.03 mass % to 5 mass %, and particularly preferably 0.05 mass % to 3 mass %, relative to the total solid content of the chemical amplification resist composition.

[5] Surfactant

The chemical amplification resist composition of the present invention may further contain a surfactant for improving coatability. The surfactant is not particularly limited, and specific examples thereof include nonionic surfactants, such as polyoxyethylene alkyl ethers, polyoxyethylene alkylaryl ethers, polyoxyethylene polyoxypropylene block copolymers, sorbitan fatty acid esters, polyoxyethylene sorbitan fatty acid esters; fluorine-based surfactants, such as Megaface F171 and F176 (manufactured by Dainippon Ink & Chemicals, Inc.), Florad FC 430 (manufactured by Sumitomo 3M, Ltd.) or Surfynol E1004 (manufactured by ASAHI GLASS CO., LTD.), PF656 and PF6320 manufactured by OMNOVA Solutions Inc, and organosiloxane polymers, such as polysiloxane polymer KP-341 (manufactured by Shin-Etsu Chemical Co., Ltd.).

In a case where the chemical amplification resist composition contains a surfactant, the usage amount of the surfactant with respect to the total amount of chemical amplification resist composition (excluding solvent) is preferably 0.0001 mass % to 2 mass %, and more preferably 0.0005 mass % to 1 mass %.

[6] Organic Carboxylic Acid

In addition to the components above, an organic carboxylic acid is preferably contained in the chemical amplification resist composition of the present invention from the viewpoint of scum characteristics. Examples of such an organic carboxylic acid compound include aliphatic carboxylic acids, alicyclic carboxylic acids, unsaturated aliphatic carboxylic acids, oxycarboxylic acids, alkoxycarboxylic acids, ketocarboxylic acids, benzoic acids, benzoic acid derivatives, phthalic acid, terephthalic acid, isophthalic acid, 2-naphthoic acid, 1-hydroxy-2-naphthoic acid, and 2-hydroxy-3-naphthoic acid. However, since there is a risk that when exposure to an electron beam is carried out in a vacuum, the organic carboxylic acid compound may evaporate from the resist film surface and contaminate the inside of the drawing chamber, preferred compounds include aromatic organic carboxylic acids, and among them, for example, benzoic acid, 1-hydroxy-2-naphthoic acid, and 2-hydroxy-3-naphthoic acid are suitable.

The blending amount of the organic carboxylic acid with respect to 100 parts by mass of the compound (B) including a phenolic hydroxyl group is preferably within a range of 0.01 to 10 parts by mass, more preferably 0.01 parts by mass to 5 parts by mass, and still more preferably 0.01 parts by mass to 3 parts by mass.

The negative chemical amplification resist composition of the present invention may further contain a dye, a plasticizer, an acid proliferating agent (described in WO95/29968A, WO98/24000A, JP1996-305262A (JP-H08-305262A), JP1997-034106A (JP-H09-34106A), JP1996-248561A (JP-H08-248561A), JP1996-503082A (JP-H08-503082A), U.S. Pat. No. 5,445,917A, JP1996-503081A (JP-H08-503081A), U.S. Pat. No. 5,534,393A, U.S. Pat. No. 5,395,736A, U.S. Pat. No. 5,741,630A, U.S. Pat. No. 5,334,489A, U.S. Pat. No. 5,582,956A, U.S. Pat. No. 5,578,424A, U.S. Pat. No. 5,453,345A, U.S. Pat. No. 5,445,917A, EP665,960B, EP757,628B, EP665,961B, U.S. Pat. No. 5,667,943A, JP1998-001508A (JP-H10-1508A), JP1998-282642A (JP-H10-282642A), JP1997-512498A (JP-H09-512498), JP2000-062337A, JP-2005-017730A, JP2008-209889A, and the like), and the like, if necessary. Examples of these compounds include the respective compounds described in JP2008-268935A.

[Carboxylic Acid Onium Salt]

The chemical amplification resist composition of the present invention may contain a carboxylic acid onium salt. Examples of the carboxylic acid onium salt include a carboxylic acid sulfonium salt, a carboxylic acid iodonium salt, a carboxylic acid ammonium salt or the like. Particularly, the carboxylic acid onium salt is preferably a carboxylic acid iodonium salt or a carboxylic acid sulfonium salt. Furthermore, according to the present invention, it is preferable that the carboxylate residue of the carboxylic acid onium salt not contain an aromatic group or a carbon-carbon double bond. As a particularly preferred anionic moiety, a linear or branched, monocyclic or polycyclic cyclic alkyl-carboxylic acid anion having 1 to 30 carbon atoms is preferred. More preferably, an anion of a carboxylic acid in which a part or all of these alkyl groups are fluorine-substituted, is preferred. Also, the carboxylic acid onium may contain an oxygen atom in the alkyl chain. Thereby, transparency to light having a wavelength of 220 nm or less is secured, and sensitivity and resolving power are enhanced, while the density dependence and exposure margin are improved.

[7] Compound Generating Acid by Degrading Due to Action of Acid

The chemical amplification resist composition of the present invention may further include one or two or more types of compound generating acid by degrading due to the action of an acid. The acid generated by the compound generating an acid by degrading due to the action of an acid is preferably a sulfonic acid, a methide acid, or an imide acid.

Below, examples of the compound which can be used in the present invention are shown; however, the present invention is not limited thereto.

[Chem. 51]

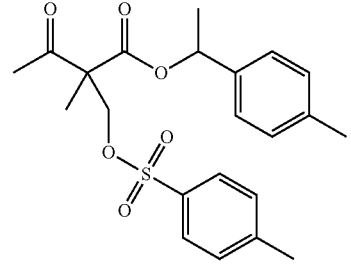

(PA-1)

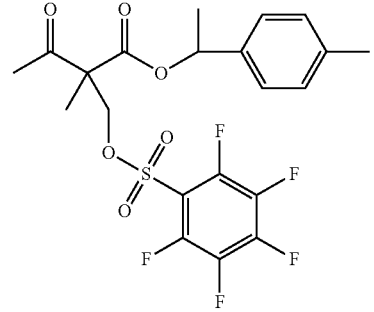

(PA-2)

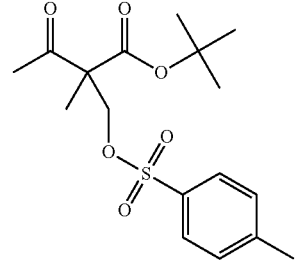

(PA-3)

-continued
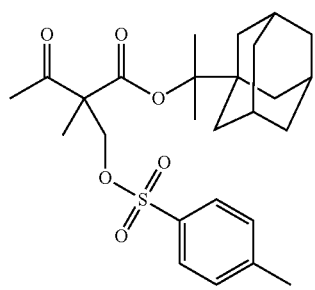
(PA-4)
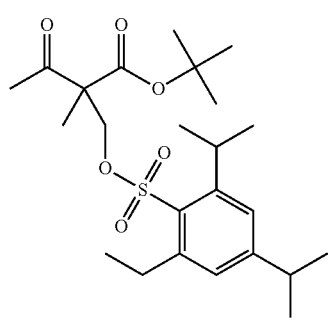
(PA-5)
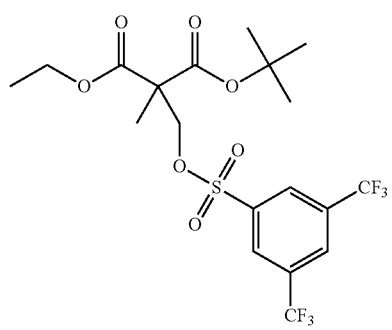
(PA-6)
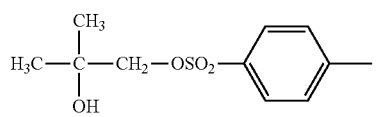
(PA-7)
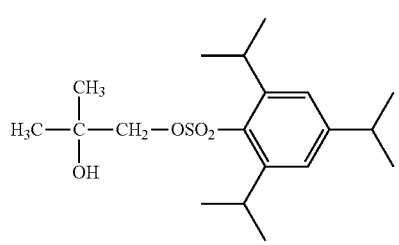
(PA-8)
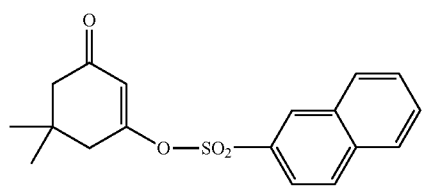
(PA-9)
-continued
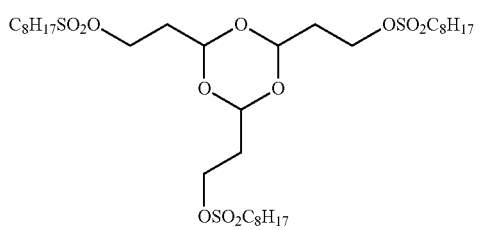
(PA-10)
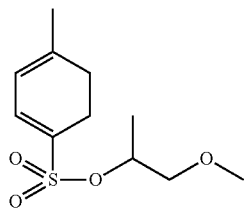
(PA-11)
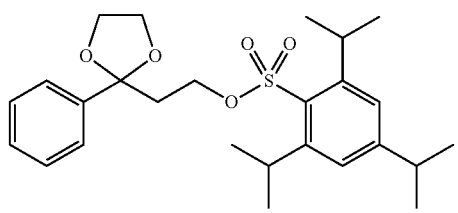
(PA-12)
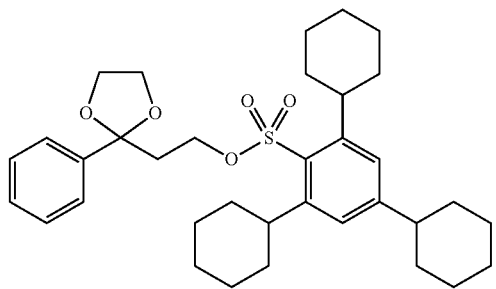
(PA-13)
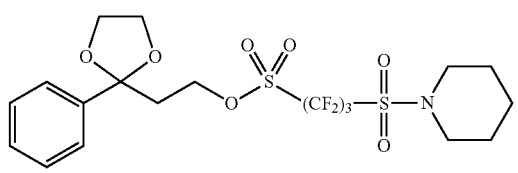
(PA-14)
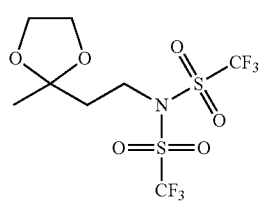
(PA-15)

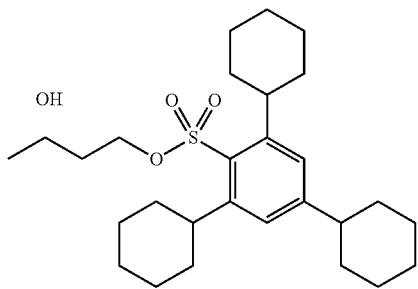
(PA-16)

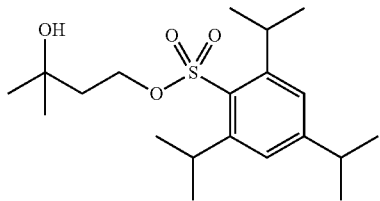
(PA-17)

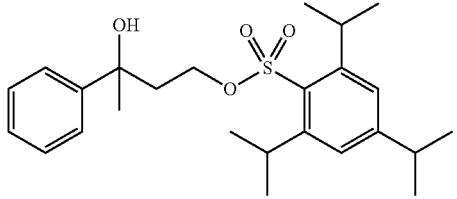
(PA-18)

The solvent used in the chemical amplification resist composition of the present invention is preferably, for example, ethylene glycol monoethyl ether acetate, cyclohexanone, 2-heptanone, propylene glycol monomethyl ether (PGME, also known as 1-methoxy-2-propanol), propylene glycol monomethyl ether acetate (PGMEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutanate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, α-butyrolactone, N,N-dimethylacetamide, propylene carbonate, ethylene carbonate or the like. These solvents may be used individually or in combination.

The solid content of the chemical amplification resist composition, as the solid concentration, is preferably 1 mass % to 40 mass %, more preferably 1 mass % to 30 mass %, and still more preferably 3 mass % to 20 mass %.

The present invention relates to a resist film formed of a chemical amplification resist composition of the present invention, and such a resist film is formed by a chemical amplification resist composition being coated on a support, such as a substrate. The thickness of the resist film is preferably 0.02 μm to 0.1 μm. Regarding the method of applying the resist composition on a substrate, the resist composition is applied on a substrate by an appropriate coating method such as spin coating, roll coating, flow coating, dip coating, spray coating, or doctor coating, but spin coating is preferred, and the speed of rotation is preferably 1000 rpm to 3000 rpm. The coating film is prebaked for 1 minute to 20 minutes at 60° C. to 150° C., and preferably for 1 minute to 10 minutes at 80° C. to 120° C., to form a thin film.

As the material that constitutes the substrate to be processed and its outermost layer, for example, in the case of a semiconductor wafer, a silicon wafer can be used. Examples of the material that forms the outermost layer include Si, $SiO_2$, SiN, SiON, TiN, WSi, BPSG, SOG, and organic antireflection films.

In addition, the present invention relates to a resist-coated mask blank on which the resist film thus obtained is coated. In the case of forming a resist pattern on a photomask blank for photomask production in order to obtain such resist-coated mask blanks, examples of a transparent substrate to be used include transparent substrates of quartz and calcium fluoride. Generally, a light-shielding film, an antireflection film, and a phase shift film, with any necessary one of additional functional films such as an etching stopper film and an etching mask film are laminated on the substrate. As the material of the functional films, films containing silicon or a transition metal such as chromium, molybdenum, zirconium, tantalum, tungsten, titanium, or niobium are laminated. Furthermore, examples of the material to be used in the outermost layer include a material which has, as a main constituent material, a material containing silicon or silicon with oxygen and/or nitrogen; and a silicon compound material which has, as a main constituent material, a material containing transition metals in addition thereto; and a transition metal compound material which has, as a main constituent material, transition metals, in particular, at least one selected from chromium, molybdenum, zirconium, tantalum, tungsten, titanium and niobium, or a material further containing at least one element selected from oxygen, nitrogen and carbon in addition thereto.

The light-shielding film may be a single layer, but a multilayer structure including the laminated plural materials is more preferable. In a case of the multilayer structure, the film thickness per layer is not particularly limited, but the thickness is preferably 5 nm to 100 nm, and more preferably 10 nm to 80 nm. The thickness of the entire light-shielding film is not particularly limited, but the thickness is preferably 5 nm to 200 nm, and more preferably 10 nm to 150 nm.

Among these materials, generally, when pattern formation is carried out on photomask blanks which have a material containing oxygen or nitrogen together with chromium in the outermost layer, by using the chemical amplification resist composition, a so-called undercut shape by which a constricted shape is formed near the substrate is likely to be produced. However, in the case of using the composition of the present invention, the problem of undercut can be decreased as compared with those of the related art.

Subsequently, the active rays or radiation (an electron beam, or the like) are irradiated to this resist film, preferably baking (usually 80° C. to 150° C., and more preferably 90° C. to 130° C., for usually 1 minute to 20 minutes, and preferably 1 minute to 10 minutes) is carried out, and thereafter the resist film is developed. Thereby, a satisfactory pattern can be obtained. Thus, a semiconductor fine circuit and a mold structure for imprint, a photomask or the like are produced by using this pattern as a mask, and conducting an appropriate etching treatment, ion implantation and the like.

Meanwhile, the process in the case of producing the mold for imprint by using the composition of the present invention is disclosed in, for example, JP4109085B, JP2008-162101A, and "Fundamentals and Technological Development and Application Deployment of Nanoimprint— Nanoimprint Substrate Technology and Recent Technology Deployment, edited by Hirai, Yoshihiko, published by Frontier Publishing Co., Ltd."

The usage mode of the chemical amplification resist composition and the method of forming a pattern of the present invention will be described next.

The present invention also relates to a method for forming a pattern, which includes exposing the resist film or the resist-coated mask blanks, and developing the exposed resist film or the exposed resist-coated mask blanks. In the present invention, the exposure is preferably performed using ArF light, KrF light, an electron beam or extreme ultraviolet light.

In the production of precision integrated circuit elements and the like, first, it is preferable to conduct the exposure onto the resist film (a pattern forming process) by irradiating patternwise the resist film of the present invention with an electron beam or extreme ultraviolet rays (EUV). The exposure amount is, in the case of an electron beam, about 0.1 $\mu C/cm^2$ to 20 $\mu C/cm^2$, and preferably about 3 $\mu C/cm^2$ to 15 $\mu C/cm^2$, and in the case of extreme ultraviolet rays, about 0.1 $mJ/cm^2$ to 20 $mJ/cm^2$, preferably about 3 $mJ/cm^2$ to 15 $mJ/cm^2$. Subsequently, a resist pattern is formed by performing heating after exposure (post-exposure baking) on a hot plate at 60° C. to 150° C. for 1 minute to 20 minutes, and preferably at 80° C. to 120° C. for 1 minute to 10 minutes, and developing, rinsing and drying the resist pattern. The developer is a 0.1 mass % to 5 mass %, and more preferably 2 mass % to 3 mass % alkaline aqueous solution of tetramethylammonium hydroxide (TMAH), tetrabutylammonium hydroxide (TBAH) or the like, and development is carried out by a routine method such as a dipping method, a puddle method or a spray method, for preferably 0.1 minutes to 3 minutes, and more preferably 0.5 minutes to 2 minutes. The alkali developer may also contain an appropriate amount of an alcohol and/or a surfactant. The pH of the alkali developer is usually from 10.0 to 15.0. Particularly, a 2.38 mass % aqueous solution of tetramethylammonium hydroxide is preferred.

In the developing step, a developer containing an alkali developer or an organic solvent (hereinafter, referred to as an organic developer) is ordinarily used. Examples of the alkali developer include inorganic alkalis, such as sodium hydroxide, potassium hydroxide, sodium carbonate, sodium silicate, sodium metasilicate and ammonia water; primary amines, such as ethylamine and n-propylamine; secondary amines such as diethylamine and di-n-butylamine; tertiary amines such as triethylamine and methyl diethylamine; alcohol amines, such as dimethylethanolamine and triethanolamine; quaternary ammonium salts, such as tetramethylammonium hydroxide and tetraethylammonium hydroxide; or alkaline aqueous solutions containing cyclic amines, such as pyrrole and piheridine.

An appropriate amount of either or both of alcohols and/or a surfactant may be added to the alkali developer.

The concentration of the alkali developer is usually from 0.1 mass % to 20 mass %. The pH of the alkali developer is usually from 10.0 to 15.0.

In a case where the developer is an alkali developer, pure water is used as the rinsing solution, and may also be used by adding an appropriate amount of a surfactant.

The organic developer uses a composition including a resin increasing solubility with respect to the alkali developer due to the action of an acid (in other words, a resin including a group increasing in polarity due to the action of an acid), and is particularly preferably used when a negative pattern is obtained. As the organic developer, a polar solvent, such as an ester-based solvent (butyl acetate, propylene glycol monomethyl ether, or the like), a ketone-based solvent (2-heptanone, cyclohexanone, or the like), an alcohol-based solvent, an amide-based solvent, an ether-based solvent and a hydrocarbon-based solvent can be used. The moisture content of the organic developer as a whole is preferably less than 10 mass %, and more preferably moisture is not practically contained.

In other words, the usage amount of the organic solvent with respect to the organic developer is preferably 90 mass % or higher to 100 mass % or less, and is more preferably 95 mass % or more to 100 mass % or less, with respect to the total amount of the developer.

The developer may contain an appropriate amount of an alcohol and/or a surfactant as necessary.

The surfactant is not particularly limited, but for example, ionic or nonionic fluorine-based and/or silicone-based surfactants can be used. Examples of such fluorine-based and/or silicone-based surfactants include the surfactants described in, for example, JP1987-36663A (JP-S62-36663A), R1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and preferably nonionic surfactants are used. The nonionic surfactants are not particularly limited, but it is more preferable to use a fluorine-based surfactant or a silicone-based surfactant.

The amount of the surfactant used is usually 0.001 mass % to 5 mass %, preferably 0.005 mass % to 2 mass %, and more preferably 0.01 mass % to 0.5 mass %, relative to the total amount of the developer.

The developer used in the present invention may include a basic compound. Specific and preferred examples of the basic compound which may be included in the developer used in the present invention include the compounds illustrated as basic compounds which may be included in the chemical amplification resist composition described above.

Regarding the developing method, for example, a method of immersing the substrate in a bath filled with a developer for a fixed time (dipping method); a method of performing development by raising the developer on the substrate surface by means of surface tension, and making the developer suspended for a fixed time (puddle method); a method of spraying the developer on the substrate surface (spray method); and a method of continuously ejecting the developer while scanning the developer ejection nozzle at a fixed rate on the substrate which is rotating at a fixed rate (dynamic dispensing method); and the like can be applied.

When the various developing methods include a process of ejecting a developer from the developing nozzle of a developing apparatus toward a resist film, the ejection pressure of the developer that is ejected (flow rate per unit area of the developer that is ejected) is preferably 2 mL/sec/mm$^2$ or less, more preferably 1.5 mL/sec/mm$^2$ or less, and even more preferably 1 mL/sec/mm$^2$ or less. The lower limit of the flow rate is not particularly limited, but in consideration of the throughput, the flow rate is preferably 0.2 mL/sec/mm$^2$ or greater.

When the ejection pressure of the developer that is ejected is adjusted to the range described above, the defects of the pattern originating from resist scum after the development can be significantly reduced.

The details of this mechanism is not clearly known, but it is speculated that when the ejection pressure is adjusted to the range described above, the pressure exerted by the developer to the resist film is decreased, and the resist film and the resist pattern are prevented from being carelessly cut out or destroyed.

The ejection pressure (mL/sec/mm$^2$) of the developer is the value at the developing nozzle outlet in the developing apparatus.

Examples of the method of adjusting the ejection pressure of the developer include a method of adjusting the ejection pressure with a pump or the like, and a method of changing the pressure by adjusting the pressure through the supply from a pressurized tank.

Furthermore, a process of suspending development while exchanging the solvent may be carried out after the process of developing by using a developer.

As the rinsing liquid for the rinsing treatment carried out after alkali development, pure water is used, and an appropriate amount of a surfactant can also be added to the water used.

In a case where the developer is an organic developer, a rinsing solution is preferably used which contains at least one type of organic solvent selected from a group formed of a ketone based solvent, an ester based solvent, an alcohol based solvent and an amide based solvent.

In the method of forming a pattern of the present invention, a process of development using a developer including an organic solvent (organic solvent developing step) and a process forming a resist pattern by performing development using an alkali aqueous solution (alkali developing step) can be combined and performed. In so doing, a finer pattern can be formed.

In the present invention, parts for which the exposure strength is weak in the organic solvent developing process are removed, and parts in which the exposure strength is strong are also further removed by performing the alkali developing process. Through a multi-developing process in which such developing is performed plural times, since pattern formation is performed without dissolving only the regions of intermediate exposure strength, a finer pattern than usual may be formed (the same mechanism as paragraph <0077> of JP2008-292975A).

In the method of forming a pattern of the present invention, the order of the alkali developing process and the organic solvent developing step is not particularly limited; however, the alkali developing is preferably performed before the organic solvent developing process.

Thus, for the resist film formed from the chemical amplification resist composition of the present invention, since the unexposed part of the resist film is dissolved in the developer, the exposed part in which the compound including the phenolic hydroxyl group is crosslinked is difficult to dissolve, and a target pattern is formed on the substrate.

Furthermore, the present invention also relates to a photomask obtainable by exposing and developing the resist-coated mask blanks. Regarding the exposure and development, the processes described above are applied. The photomask is suitably used for the manufacture of semiconductors.

The photomask according to the present invention may be a light-transmissive mask used for ArF excimer lasers and the like, or may be a light-reflective mask used in reflection lithography using EUV light as the light source.

In addition, the present invention relates to a method of manufacturing an electronic device, including the method of forming a pattern of the present invention as described above, and an electronic device manufactured by the method of manufacturing thereof The electronic device of the present invention is suitably mounted in electric and electronic instruments (electrical appliances, OA and media-related equipment, optical instruments, and communication devices).

EXAMPLES

Below, the present invention will be described in further detail using examples; however, the content of the present invention is not limited thereto.

Synthesis of Compound (A)

Synthesis Example 1: Synthesis of Compound (A1)

The compound (A0) below was synthesized according to the disclosure in Synthesis, 2004, 10, pp 1648 to 1654.

Furthermore, the compound (B0) below was synthesized according to the disclosure of Bulletin of the Chemical Society of the Japan, Vol. 66 (1993), No. 9, pp 2590 to 2602.

10 g of compound (A0) was dissolved in 30 ml of methanol, and, 7.7 g of compound (B0) was added thereto and stirred for one hour at room temperature. Thereafter, 100 ml of ethyl acetate and 100 ml of distilled water were added thereto and an organic layer was separated. After the obtained organic layer was washed with 100 ml of an aqueous solution of 0.1 N—NaOH, the organic layer was washed with 100 ml of an aqueous solution of 0.1 N—HCl, and further washed three times with 100 ml of distilled water. Thereafter, the organic solvent was evaporated under reduced pressure, precipitated liquid crystal was filtered, and, after drying with a vacuum pump, 12.2 g of compound (A1) was obtained.

[Chem. 52]

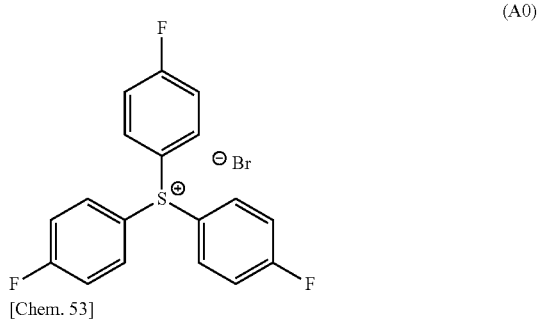

(A0)

[Chem. 53]

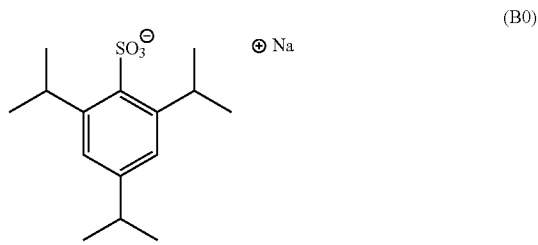

(B0)

The chemical shift of $^1$H-NMR of compound (A1) is shown below.

$^1$H-NMR (d6-DMSO: ppm) δ: 1.17 to 1.77 (30H, m), 2.40 to 2.38 (1H, m), 4.21 to 4.17 (2H, m), 6.88 (2H, s), 7.69 to 7.63 (6H, m), 7.96 to 7.91 (6H, m)

Synthesis of Compounds (A2) to (A14)

Synthesis Examples 2 to 13: Synthesis of Compounds (A2) to (A14)

By the same method as the synthesis of compound (A1), compounds (A2) to (A14) were synthesized by performing salt exchange of sulfonium bromide and sodium sulfonate. Below, the chemical shift of $^1$N-NMR of compounds (A2) to (A9), (A11) and (A12) is shown.

Compound (A2)
1H-NMR (d6-DMSO: ppm) δ: 1.17 to 1.09 (18H, m), 2.81 to 2.76 (1H, m), 4.61 to 4.55 (2H, m), 6.94 (2H, s), 7.69 to 7.63 (6H, m), 7.96 to 7.91 (6H, m)

Compound (A3)
$^1$H-NMR (d6-DMSO: ppm) δ: 1.17 to 1.09 (18H, m), 2.81 to 2.76 (1H, m), 4.61 to 4.55 (2H, m), 6.94 (2H, s), 7.60 to 7.55 (3H, m), 8.02 to 7.95 (6H, m)

Compound (A4)
$^1$H-NMR (d6-DMSO: ppm) δ: 1.17 to 1.09 (18H, m), 2.83 to 2.76 (1H, m), 4.61 to 4.55 (2H, m), 6.94 (2H, s), 7.65 (2H, d, J=8.4 Hz), 8.02 (2H, d, J=8.4 Hz), 8.67 (4H, s), 8.71 (2H, s)

Compound (A5)
$^1$H-NMR (d6-DMSO: ppm) δ: 1.17 to 1.09 (18H, m), 2.81 to 2.76 (1H, m), 3.87 (3H, s), 4.62 to 4.55 (2H, m), 6.94 (2H, s), 7.12 (1H, s), 7.16 (1H, s), 7.77 to 7.71 (2H, m), 7.98 to 7.92 (2H, m), 8.45 (2H, d, J=7.6 Hz), 8.53 to 8.49 (2H, m)

Compound (A6)
H-NMR (d6-DMSO: ppm) δ: 1.24 to 1.79 (30H, m), 2.51 to 2.50 (1H, m), 2.88 to 2.84 (2H, m), 7.14 (2H, s), 7.69 to 7.63 (6H, m), 7.96 to 7.91 (6H, m)

Compound (A7)
$^1$H-NMR (d6-DMSO: ppm) δ: 1.53 to 1.50 (6H, m), 1.70 to 1.57 (6H, m), 1.95 to 1.91 (3H, m), 3.81 (2H, s), 7.69 to 7.63 (6H, m), 7.96 to 7.91 (6H, m)

Compound (A8)
$^1$H-NMR (d6-DMSO: ppm) δ: 1.72 to 1.63 (6H, m), 1.85 to 1.83 (6H, m), 2.00 to 1.95 (3H, m), 4.50 (d, 1H, J=15.6 Hz), 4.54 (d, 1H, J=15.6 Hz), 7.69 to 7.63 (6H, m), 7.96 to 7.91 (6H, m)

Compound (A9)
$^1$H-NMR (d6-DMSO: ppm) δ: 1.10 to 0.88 (2H, m), 1.26 to 1.12 (5H, m), 1.74 to 1.51 (5H, m), 2.81 to 2.73 (1H, m), 3.18 to 3.07 (1H, m), 3.65 (1H, d, J=12.8 Hz), 3.82 (1H, d, J=12.8 Hz), 7.69 to 7.63 (6H, m), 7.96 to 7.91 (6H, m)

Compound (A11)
$^1$H-NMR (d6-DMSO: ppm) δ: 1.17 to 1.09 (18H, m), 2.81 to 2.76 (1H, m), 4.61 to 4.55 (2H, m), 6.94 (2H, s), 7.64 to 7.70 (4H, m), 7.76 to 7.89 (5H, m), 7.96 to 7.91 (4H, m)

Compound (A12)
$^1$H-NMR (d6-DMSO: ppm) δ: 1.75 to 1.38 (6H, m), 3.71 to 3.21 (4H, m), 7.07 to 7.65 (2H, m), 7.89 to 7.77 (10H, m), 7.97 to 7.92 (2H, m)

In addition, Comparative Compounds 1 to 4 including the chemical structures below were prepared.

Below, the volume of sulfonic acid generated by these compounds are shown in Tables 1 and 2 below as the value of the volume of acid generated the compound calculated by the above method using "WinMOPAC" manufactured by Fujitsu, Ltd. along with the structures of these compounds.

TABLE 1

| Compound | Chemical Formula | Volume of Acid Generated ($Å^3$) |
| --- | --- | --- |
| Compound (A1) | | 303 |
| Compound (A2) | | 437 |

TABLE 1-continued
| Compound | Chemical Formula | Volume of Acid Generated (Å³) |
|---|---|---|
| Compound (A3) | 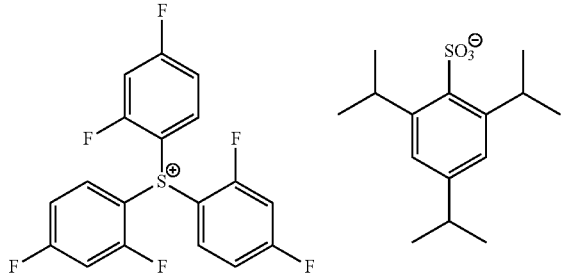 | 303 |
| Compound (A4) | 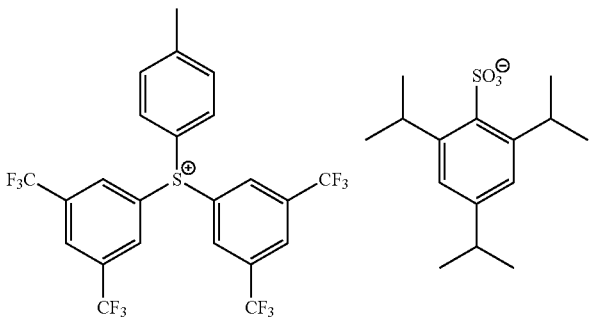 | 303 |
| Compound (A5) | 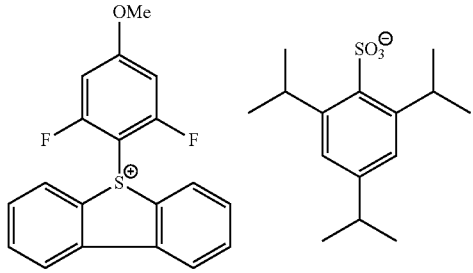 | 303 |
| Compound (A6) | 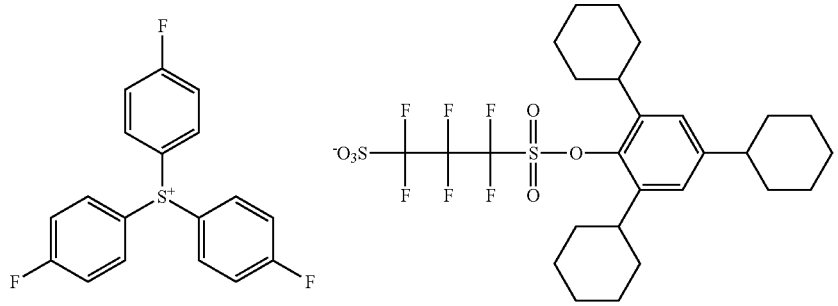 | 535 |
| Compound (A7) | 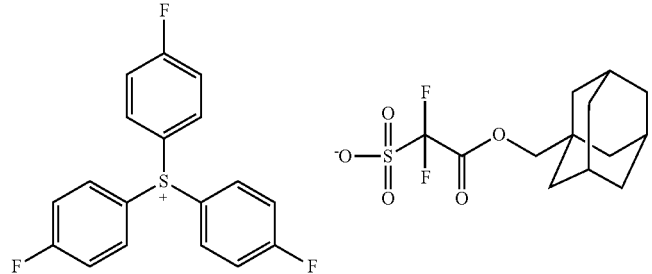 | 271 |

TABLE 1-continued

| Compound | Chemical Formula | Volume of Acid Generated (Å³) |
|---|---|---|
| Compound (A8) | | 270 |
| Compound (A9) | | 311 |
| Compound (A10) | | 291 |
| Compound (A11) | | 437 |
| Compound (A12) | | 244 |

TABLE 1-continued

| Compound | Chemical Formula | Volume of Acid Generated (Å³) |
|---|---|---|
| Compound (A13) | | 303 |
| Compound (A14) | | 303 |

TABLE 2

| Compound | Chemical Formula | Volume of Acid Generated (Å³) |
|---|---|---|
| Comparative Compound 1 | | 186 |
| Comparative Compound 2 | | 311 |

TABLE 2-continued

| Compound | Chemical Formula | Volume of Acid Generated (Å³) |
|---|---|---|
| Comparative Compound 3 | 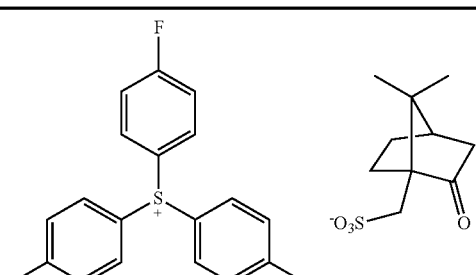 | 216 |
| Comparative Compound 4 | 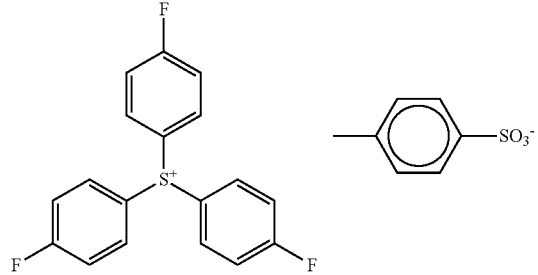 | 186 |

Example 1P (1) Preparation of Support

A 6-inch wafer on which Cr oxide is deposited (object subjected to shielding film treatment using ordinary photomask blanks) was prepared.

(2) Preparation of Resist Coating Solution (Solution Composition of Positive Resist Composition 1D)

| | |
|---|---|
| Acid Degradable resin (P-4) | 0.60 g |
| Photoacid generator A1 (structural formula is above) | 0.12 g |
| Tetrabutylammonium hydroxide (basic compound) | 0.002 g |
| Surfactant PF6320 (manufactured by Omnova Solutions, Inc.) | 0.001 g |
| Propylene glycol monomethyl ether acetate (solvent) | 5.4 g |
| Propylene glycol monomethyl ether (solvent) | 3.6 g |

A solution of the composition described above was precision filtered through a polytetrafluoroethylene filter having a pore size of 0.04 μm, and thus a resist coating solution was obtained.

(3) Production of Resist Film

The resist coating solution was applied on the 6-inch wafer by using a spin coater Mark 8 manufactured by Tokyo Electron, Ltd., and the wafer was dried on a hot plate at 110° C. for 90 seconds. Thus, a resist film having a thickness of 50 nm was obtained. That is, resist-coated mask blanks were obtained.

(4) Preparation of Positive Resist Pattern

This resist film was subjected to patternwise irradiation by using an electron beam lithographic apparatus (manufactured by Elionix, Inc.; ELS-7500, acceleration voltage: 50 KeV). After irradiation, the film was heated on a hot plate at 120° C. for 90 seconds, and after immersion for 60 seconds using a 2.38 mass % tetramethylammonium hydroxide (TMAH) aqueous solution, was rinsed for 30 seconds with water and dried.

(5) Evaluation of Resist Pattern

The pattern thus obtained was evaluated for sensitivity, resolving power, pattern shape, line edge roughness (LER) and dry etching resistance, PEB temperature dependence and PED by the methods described below.

[Sensitivity]

The cross-sectional shape of the pattern thus obtained was observed by using a scanning electron microscope (S-4300 manufactured by Hitachi, Ltd.). The exposure amount (electron beam irradiation amount) when resolving a 1:1 line and space resist pattern with a 50 nm line width was set as the sensitivity. A smaller value of this amount of exposure indicates higher sensitivity.

[Evaluation of LS Resolving Power]

The limiting resolving power (minimum line width separating and resolving the line and space) in the exposure amount (electron beam irradiation amount) showing the sensitivity was set as the LS resolving power.

[Evaluation of IL Resolving Power]

The limiting resolving power (minimum line width separating and resolving the line and space) in the minimum exposure amount when resolving an independent line pattern (line:space=1:>50) with a line width of 50 nm was set as the IL resolving power (nm).

[Pattern Shape]

The cross-sectional shape of a 1:1 line and space resist pattern having a line width of 50 nm in the exposure amount (electron beam irradiation amount) showing the above sensitivity was observed using a scanning electron microscope (S-4300 manufactured by Hitachi, Ltd.). In the cross-sectional shape of the line pattern, a ratio represented by [line width in the bottom portion of the line pattern/line width in the center portion (half height position of the height of the line pattern) of the line pattern] less than 0.8 was evaluated as "reverse tapered", a ratio of 0.8 or higher and less than 0.95 was evaluated as "slightly reverse tapered", and a ratio of 0.95 or higher was evaluated as "rectangular".

[Line Edge Roughness (LER)]

A 1:1 line and space resist pattern with a line width 50 nm was formed with an exposure amount (electron beam irradiation amount) showing the above sensitivity. At any arbitrary 30 points included in 10 μm along the length direction, the distance from a reference line at which an edge should exist was measured by using a scanning electron microscope (S-9220 manufactured by Hitachi, Ltd.). The standard deviation of this distance was determined, and 3δ was calculated. A smaller value indicates satisfactory performance.

[Evaluation of Dry Etching Resistance]

Dry etching was performed on the unexposed resist film for 30 seconds with a Hitachi U-621 with $Ar/C_4F_6/O_2$ gas (mixed gas with a volume ratio of 100/4/2). Thereafter, the resist residual film ratio was measured and was used as an indicator for dry etching resistance.

Very satisfactory: a residual film ratio of 95% or greater
Satisfactory: a residual film ratio of greater than or equal to 90% and less than 95%
Poor: a residual film ratio of less than 90%

[PEB Temperature Dependency]

After the exposure amount reproducing a 1:1 line and space with a 50 nm mask size when post-exposure baking (PEB) was performed at 120° C. for 90 seconds was set to the optimal exposure amount and then exposure was performed at the optimal exposure amount, post baking was performed at the two temperatures of +2° C. and −2° C. (122° C., 118° C.) with respect to the post-baking temperature, length measurement was performed on the respectively obtained lines and spaces, and these were determined as line widths L1 and L2. The PEB temperature dependency (PEBS) was defined as the change in line width for each 1° C. PEB temperature change, and calculated by the following Formula.

PEB temperature dependency (nm/° C.)=$|L1-L2|/4$

The smaller the value, the smaller and more favorable the performance change with respect to the temperature change shown.

[Evaluation of PED (Post Exposure Time Delay)]

After exposure in the exposure amount in which the dimensions of a line and space 1:1 pattern with a 50 nm line width become 50 nm, the line width dimensions on the wafer quickly after PEB treatment (0h) and the line width dimension on the wafer two hours after PEB treatment (2.0h) were measured, and the line width change ratio was calculated with the Formula below.

Line width change ratio (%)=$\Delta CD(2.0h-0h)$nm/50 nm

The smaller the value, the more satisfactory the performance shown, and this was set as an indicator of PED stability.

[Example 2P] to [Example 24P] and [Comparative Example 1P] to [Comparative Example 4P]

Preparation of a resist coating solution (positive resist compositions 2D to 24D, positive resist comparative compositions 1D to 4D), positive pattern formation and evaluation thereof were performed in the same manner as Example 1P other than using the components disclosed in Table 3. Moreover, the usage amount of solvent (total thereof, in the case of using plural types) is 9.0 g.

TABLE 3

(Electron Beam Exposure: Positive-tone)

| Composition Example | Photoacid Generator | Resin | Basic Compound (0.002 g) | Surfactant (0.001 g) | Solvent (mass ratio) |
|---|---|---|---|---|---|
| 1D | A1 (0.12 g) | P-4 (0.6 g) | B1 | W-1 | S1/S2 (6/4) |
| 2D | A2 (0.12 g) | P-4 (0.6 g) | B1 | W-1 | S1/S2 (6/4) |
| 3D | A3 (0.12 g) | P-4 (0.6 g) | B1 | W-1 | S1/S2 (6/4) |
| 4D | A4 (0.12 g) | P-4 (0.6 g) | B1 | W-1 | S1/S2 (6/4) |
| 5D | A5 (0.12 g) | P-4 (0.6 g) | B1 | W-1 | S1/S2 (6/4) |
| 6D | A6 (0.12 g) | P-4 (0.6 g) | B1 | W-1 | S1/S2 (6/4) |
| 7D | A7 (0.12 g) | P-4 (0.6 g) | B1 | W-1 | S1/S2 (6/4) |
| 8D | A8 (0.12 g) | P-4 (0.6 g) | B1 | W-1 | S1/S2 (6/4) |
| 9D | A9 (0.12 g) | P-4 (0.6 g) | B1 | W-1 | S1/S2 (6/4) |
| 10D | A10 (0.12 g) | P-4 (0.6 g) | B1 | W-1 | S1/S2 (6/4) |
| 11D | A11 (0.12 g) | P-4 (0.6 g) | B1 | W-1 | S1/S2 (6/4) |
| 12D | A12 (0.12 g) | P-4 (0.6 g) | B1 | W-1 | S1/S2 (6/4) |
| 13D | A2 (0.12 g) | P-5 (0.6 g) | B1 | W-1 | S1/S4 (6/4) |
| 14D | A2 (0.12 g) | P-6 (0.6 g) | B5 | W-1 | S1/S3 (6/4) |
| 15D | A9 (0.12 g) | P-9 (0.6 g) | B2 | W-1 | S1/S5 (6/4) |
| 16D | A9 (0.12 g) | P-11 (0.6 g) | B2 | W-1 | S1/S2/S6 (6/3/1) |
| 17D | A9 (0.12 g) | P-10 (0.6 g) | B2 | W-2 | S1/S7 (6/4) |
| 18D | A2 (0.12 g) | P-2 (0.6 g) | B3 | W-2 | S1/S2 (6/4) |
| 19D | A2 (0.12 g) | P-3 (0.6 g) | B4 | W-3 | S1/S2 (6/4) |
| 20D | A2 (0.12 g) | P-7 (0.6 g) | B5 | W-1 | S1/S2 (6/4) |
| 21D | A2 (0.12 g) | P-8 (0.6 g) | B3 | W-3 | S1/S2 (6/4) |
| 22D | A2 (0.06 g)/A1 (0.06 g) | P-2 (0.3 g)/P-5 (0.3 g) | B6 | None | S1/S2 (6/4) |
| 23D | A13 (0.12 g) | P-4 (0.6 g) | B1 | W-1 | S1/S2 (6/4) |

TABLE 3-continued (Electron Beam Exposure: Positive-tone)

| Composition Example | Photoacid Generator | Resin | Basic Compound (0.002 g) | Surfactant (0.001 g) | Solvent (mass ratio) |
|---|---|---|---|---|---|
| 24D | A14 (0.12 g) | P-4 (0.6 g) | B1 | W-1 | S1/S2 (6/4) |
| Comparative Example 1D | Comparative Compound 1 (0.12 g) | P-1 (0.6 g) | B2 | W-1 | S1/S2 (6/4) |
| Comparative Example 2D | Comparative Compound 2 (0.12 g) | P-1 (0.6 g) | B2 | W-1 | S1/S2 (6/4) |
| Comparative Example 3D | Comparative Compound 3 (0.12 g) | P-1 (0.6 g) | B2 | W-1 | S1/S2 (6/4) |
| Comparative Example 4D | Comparative Compound 4 (0.12 g) | P-1 (0.6 g) | B2 | W-1 | S1/S2 (6/4) |

Abbreviations of components other than those shown above used in the Examples and Comparative Examples are disclosed below.

[Acid Degradable Resin]

The structure, compositional ratio (molar ratio), weight average molecular weight and degree of dispersion of the acid degradable resin used in the Examples and Comparative Examples are shown below.

[Chem. 54]

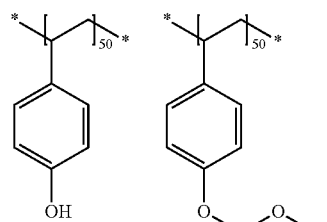

Mw = 12000
Mw/Mn = 1.2

P-1

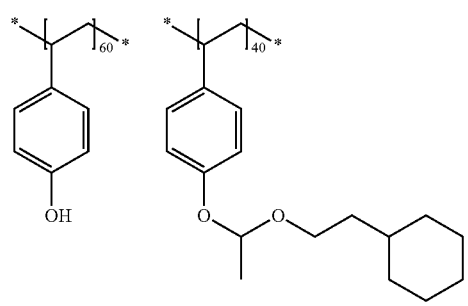

Mw = 4800
Mw/Mn = 1.2

P-2

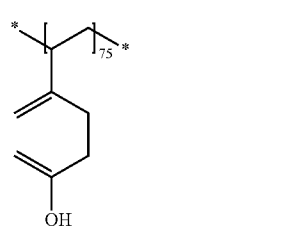

P-3

-continued

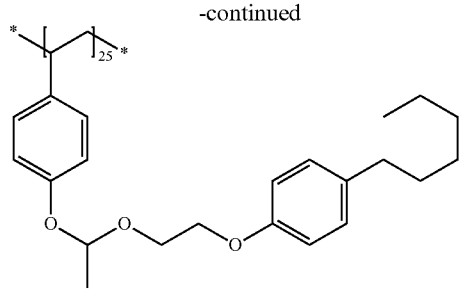

Mw = 11000
Mw/Mn = 1.1

P-4

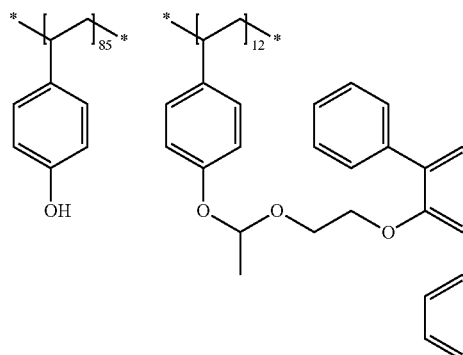

Mw = 11000
Mw/Mn = 1.1

P-5
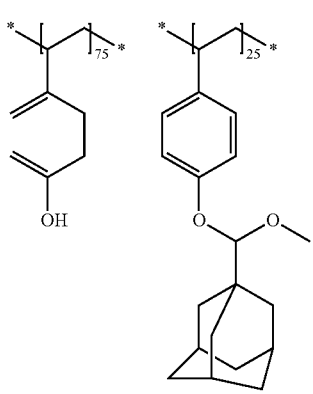
Mw = 4800
Mw/Mn = 1.2
P-6
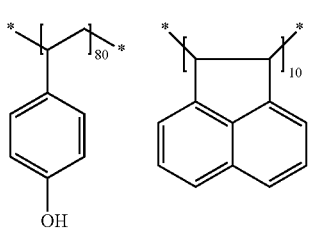
P-7
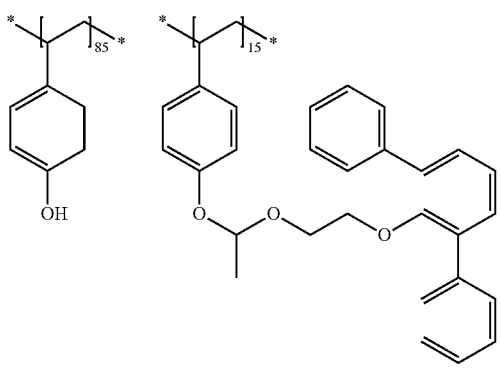
Mw = 10000
Mw/Mn = 1.1
P-8
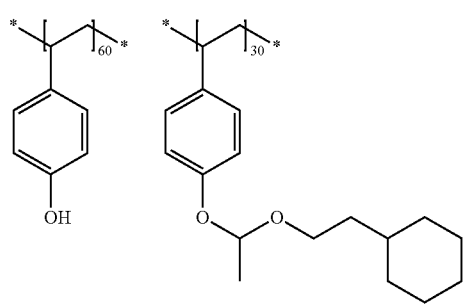
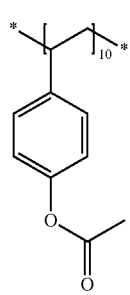
Mw = 4800
Mw/Mn = 1.1
P-9
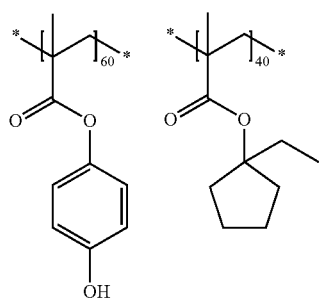
Mw = 4800
Mw/Mn = 1.3
P-10
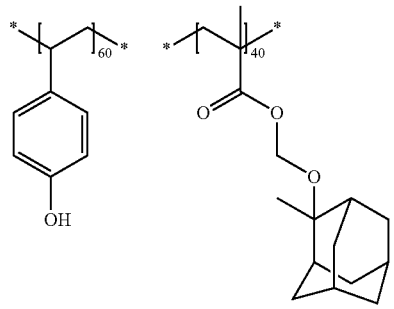
Mw = 5700
Mw/Mn = 1.3

-continued

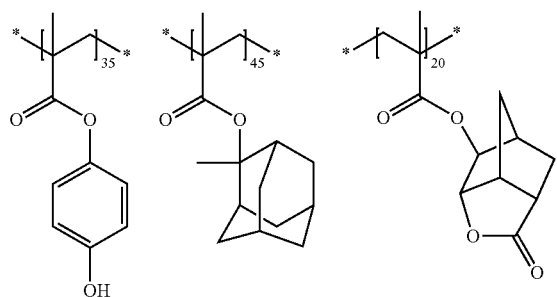

Mw = 6500
Mw/Mn = 1.3

[Basic Compound]
B1: Tetrabutylammonium hydroxide
B2: Tri(n-octyl)amine
B3: 2,4,5-Triphenylimidazole

[Chem. 55]

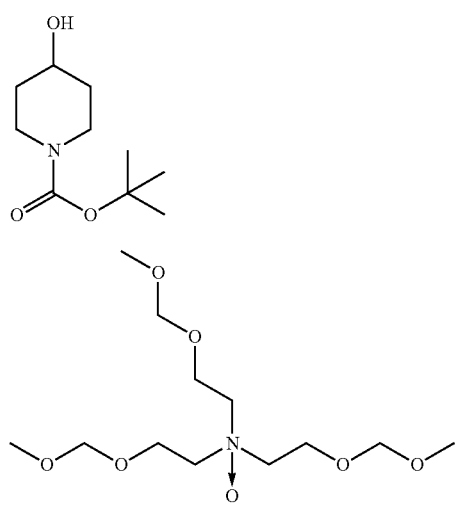

-continued

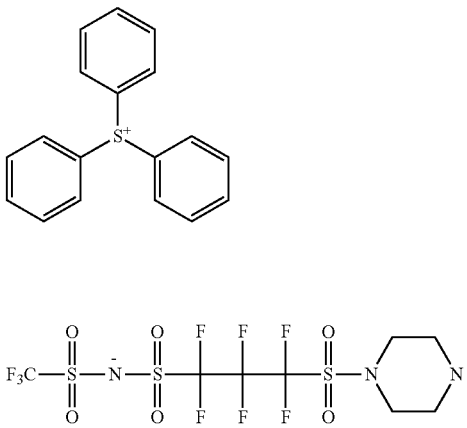

[Solvent]

S1: Propylene glycol monomethyl ether acetate (1-methoxy-2-acetoxypropane)

S2: Propylene glycol monomethyl ether (1-methoxy-2-propanol)

S3: 2-Heptanone

S4: Ethyl lactate

S5: Cyclohexanone

S6: γ-butyrolactone

S7: Propylene carbonate

[Surfactant]

W-1: Surfactant PF6320 (manufactured by Omnova Solutions, Inc.)

W-2: Megaface F176 (manufactured by Dainippon Ink & Chemicals, Inc.; fluorine based)

W-3: Polysiloxane Polymer KP-341 (manufactured by Shin-Etsu Chemical Co., Ltd., silicone based)

The evaluation results are shown in Table 4.

TABLE 4

(Electron Beam Exposure: Positive-tone)

| Example | Composition | Sensitivity ($\mu C/cm^2$) | LS Resolving Power (nm) | IL Resolving Power (nm) | Pattern Shape | LER (nm) | Dry Etching Resistance | PEB Temperature Dependency (nm/° C.) | PED Stability (%) |
|---|---|---|---|---|---|---|---|---|---|
| 1P | 1D | 10.8 | 30 | 25 | Rectangular | 3.5 | Extremely good | 0.6 | 0.6 |
| 2P | 2D | 10.9 | 30 | 20 | Rectangular | 3.5 | Extremely good | 0.4 | 0.4 |
| 3P | 3D | 10.7 | 30 | 25 | Rectangular | 3.5 | Extremely good | 0.6 | 0.6 |
| 4P | 4D | 10.7 | 30 | 25 | Rectangular | 3.5 | Extremely good | 0.6 | 0.6 |
| 5P | 5D | 11.8 | 30 | 25 | Slightly reverse tapered | 3.5 | Extremely good | 0.6 | 0.6 |
| 6P | 6D | 10.8 | 30 | 20 | Rectangular | 3.5 | Extremely good | 0.4 | 0.4 |
| 7P | 7D | 10.7 | 35 | 25 | Rectangular | 3.5 | Extremely good | 0.8 | 0.8 |
| 8P | 8D | 10.8 | 35 | 25 | Rectangular | 3.5 | Extremely good | 0.8 | 0.8 |
| 9P | 9D | 10.9 | 30 | 25 | Rectangular | 3.5 | Extremely good | 0.6 | 0.6 |
| 10P | 10D | 10.8 | 35 | 25 | Rectangular | 3.5 | Extremely good | 0.7 | 0.7 |
| 11P | 11D | 11.8 | 30 | 20 | Slightly reverse tapered | 3.5 | Extremely good | 0.4 | 0.4 |
| 12P | 12D | 12.8 | 35 | 25 | Slightly reverse tapered | 3.5 | Extremely good | 0.9 | 0.9 |
| 13P | 13D | 10.7 | 30 | 20 | Rectangular | 3.5 | Extremely good | 0.4 | 0.4 |
| 14P | 14D | 10.8 | 30 | 20 | Rectangular | 4.0 | Extremely good | 0.4 | 0.4 |
| 15P | 15D | 10.8 | 30 | 25 | Rectangular | 4.0 | Good | 0.6 | 0.6 |

TABLE 4-continued (Electron Beam Exposure: Positive-tone)

| Example | Composition | Sensitivity ($\mu C/cm^2$) | LS Resolving Power (nm) | IL Resolving Power (nm) | Pattern Shape | LER (nm) | Dry Etching Resistance | PEB Temperature Dependency (nm/° C.) | PED Stability (%) |
|---|---|---|---|---|---|---|---|---|---|
| 16P | 16D | 10.6 | 30 | 25 | Rectangular | 4.0 | Good | 0.6 | 0.6 |
| 17P | 17D | 10.8 | 30 | 25 | Rectangular | 4.0 | Good | 0.6 | 0.6 |
| 18P | 18D | 10.6 | 30 | 20 | Rectangular | 4.0 | Extremely good | 0.6 | 0.6 |
| 19P | 19D | 10.6 | 30 | 20 | Rectangular | 4.0 | Extremely good | 0.6 | 0.6 |
| 20P | 20D | 10.8 | 30 | 25 | Rectangular | 4.0 | Extremely good | 0.6 | 0.6 |
| 21P | 21D | 10.8 | 30 | 25 | Rectangular | 4.0 | Extremely good | 0.6 | 0.6 |
| 22P | 22D | 10.8 | 35 | 25 | Rectangular | 3.5 | Extremely good | 0.6 | 0.6 |
| 23P | 23D | 11.8 | 35 | 25 | Slightly reverse tapered | 3.5 | Extremely good | 0.5 | 0.5 |
| 24P | 24D | 12.6 | 35 | 25 | Slightly reverse tapered | 3.5 | Extremely good | 0.6 | 0.6 |
| Comparative Example 1P | Comparative Example 1D | 10.9 | 50 | 50 | Slightly reverse tapered | 5.0 | Good | 2.0 | 2.0 |
| Comparative Example 2P | Comparative Example 2D | 13.9 | 45 | 40 | Reverse tapered | 5.0 | Good | 0.6 | 0.6 |
| Comparative Example 3P | Comparative Example 3D | 10.9 | 45 | 40 | Slightly reverse tapered | 5.0 | Good | 1.5 | 1.5 |
| Comparative Example 4P | Comparative Example 4D | 10.9 | 50 | 50 | Slightly reverse tapered | 5.0 | Good | 2.0 | 2.0 |

From the results shown in Table 4, it can be understood that the composition according to the present invention has superior sensitivity, resolving power, pattern shape and LER performance in ultrafine pattern formation, has low PEB temperature dependency and has superior PED stability. Furthermore, it can be understood that the dry etching resistance of the chemical amplification resist composition of the Examples is improved in ultrafine pattern formation, in a case where a resin including a repeating unit represented by the General Formula (A) is included.

Examples 1Q to 9Q and Comparative Examples 1Q to 4Q (Preparation of Resist Solution)

The positive resist compositions shown in the Table 3 were filtered through a polytetrafluoroethylene filter having a pore size of 0.04 µm, and thus positive resist solutions were prepared.

(Resist Evaluation)

Each of the positive resist solutions thus prepared was uniformly applied on a silicon substrate that had been subjected to a hexamethyldisilazane treatment, by using a spin coater. The system was heated and dried on a hot plate at 100° C. for 60 seconds, and thus a resist film having a thickness of 50 nm was formed.

The resist film thus obtained was evaluated for sensitivity, resolving power, pattern shape, line edge roughness (LER) and dry etching resistance by the methods described below.

[Sensitivity]

The resist film thus obtained was exposed through a reflection type mask having a 1:1 line-and-space pattern having a line width of 50 nm, by using EUV light (wavelength: 13 nm) while changing the amount of exposure by 0.1 mJ/cm² over the range of 0 to 20.0 mJ/cm², and then the resist film was baked for 90 seconds at 110° C. Thereafter, the resist pattern was developed by using a 2.38 mass % aqueous solution of tetramethylammonium hydroxide (TMAH).

The exposure amount when reproducing a 1:1 line and space mask pattern with a 50 nm line width was set as the sensitivity. A smaller value of this amount of exposure indicates higher sensitivity.

[LS Resolving Power]

The limiting resolving power (minimum line width separating and resolving the line and space) in the exposure amount showing the above sensitivity was set as the LS resolving power (nm).

[Pattern Shape]

The cross-sectional shape of a 1:1 line and space resist pattern having a line width of 50 nm in the exposure amount (electron beam irradiation amount) showing the above sensitivity was observed using a scanning electron microscope (S-4300 manufactured by Hitachi, Ltd.). In the cross-sectional shape of the line pattern, a ratio represented by [line width in the bottom portion of the line pattern/line width in the center portion (half height position of the height of the line pattern) of the line pattern] less than 0.8 was evaluated as "reverse tapered", a ratio of 0.8 or higher and less than 0.95 was evaluated as "slightly reverse tapered", and a ratio of 0.95 or higher was evaluated as "rectangular".

[Line Edge Roughness (LER)]

A 1:1 line and space resist pattern with a line width 50 nm was formed with an exposure amount showing the above sensitivity. At any arbitrary 30 points included in 10 µm along the length direction, the distance from a reference line at which an edge should exist was measured by using a scanning electron microscope (S-9220 manufactured by Hitachi, Ltd.). The standard deviation of this distance was determined, and 3δ was calculated. A smaller value indicates satisfactory performance.

[Dry Etching Resistance]

Dry etching was performed on the unexposed resist film for 15 seconds with a Hitachi U-621 with $Ar/C_4F_6/O_2$ gas (mixed gas with a volume ratio of 100/4/2). Thereafter, the resist residual film ratio was measured and was used as an indicator for dry etching resistance.

(Indicator of Dry Etching Resistance)

Very satisfactory: a residual film ratio of 95% or greater

Satisfactory: a residual film ratio of greater than or equal to 90% and less than 95%

Poor: a residual film ratio of less than 90%

TABLE 5

| | Composition | Sensitivity (mJ/cm²) | LS Resolving Power (nm) | Pattern Shape | LER (nm) | Dry Etching Resistance |
|---|---|---|---|---|---|---|
| | | | (EUV Exposure: Positive-tone) | | | |
| 1Q | 1D | 10.8 | 25 | Rectangular | 3.5 | Extremely good |
| 2Q | 2D | 10.8 | 20 | Rectangular | 3.5 | Extremely good |
| 3Q | 10D | 10.8 | 30 | Rectangular | 3.5 | Extremely good |
| 4Q | 11D | 11.7 | 20 | Slightly reverse tapered | 3.5 | Extremely good |
| 5Q | 14D | 10.8 | 25 | Rectangular | 4.0 | Extremely good |
| 6Q | 15D | 10.8 | 25 | Rectangular | 4.0 | Good |
| 7Q | 16D | 10.7 | 25 | Rectangular | 4.0 | Good |
| 8Q | 17D | 10.8 | 25 | Rectangular | 4.0 | Good |
| 9Q | 12D | 12.9 | 30 | Slightly reverse tapered | 3.5 | Extremely good |
| Comparative Example 1Q | Comparative Example 1D | 10.9 | 50 | Slightly reverse tapered | 5.5 | Good |
| Comparative Example 2Q | Comparative Example 2D | 13.9 | 45 | Reverse tapered | 5.0 | Good |
| Comparative Example 3Q | Comparative Example 3D | 10.9 | 50 | Slightly reverse tapered | 5.0 | Good |
| Comparative Example 4Q | Comparative Example 4D | 10.9 | 50 | Slightly reverse tapered | 5.0 | Good |

From the results shown in Table 5, it can be understood that the composition according to the present invention has superior sensitivity, resolving power, pattern shape and LER performance in ultrafine pattern formation. Furthermore, it can be understood that the dry etching resistance of the chemical amplification resist composition of the Examples is improved in ultrafine pattern formation, in a case where a resin including a repeating unit represented by the General Formula (A) is included.

Examples E1 to E29 and Comparative Examples E1 to E4

(1) Preparation of Support

A 6-inch wafer on which Cr oxide is deposited (object subjected to shielding film treatment using ordinary photomask blanks) was prepared.

(2) Preparation of Resist Coating Solution (Solution Composition of Negative Resist Composition 1N)

| | |
|---|---|
| Resin (P'-4) | 4.21 g |
| Compound (A1) (structural formula is described above) | 0.47 g |
| Cross-linking agent CL-1 (structural formula is described below) | 0.59 g |
| Cross-linking agent CL-4 (structural formula is described below) | 0.30 g |
| Tetrabutylammonium hydroxide (basic compound) | 0.04 g |
| 2-Hydroxy-3-naphthoic acid (organic carboxylic acid) | 0.11 g |
| Surfactant PF6320 (manufactured by Omnova Solutions, Inc.) | 0.005 g |
| Propylene glycol monomethyl ether acetate (solvent) | 18.8 g |
| Propylene glycol monomethyl ether (solvent) | 75.0 g |

[Chem. 56]

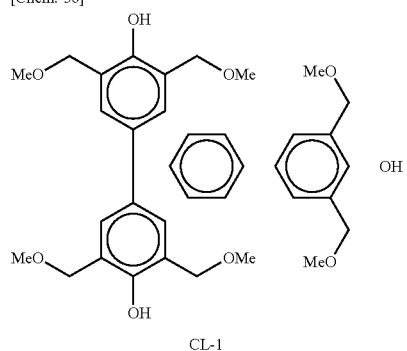

CL-1

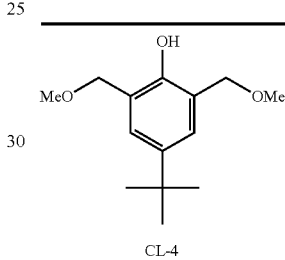

CL-4

A solution of the composition described above was precision filtered through a polytetrafluoroethylene filter having a pore size of 0.04 μm, and thus a resist coating solution was obtained.

(3) Production of Resist Film

The resist coating solution was applied on the 6-inch wafer by using a spin coater Mark 8 manufactured by Tokyo Electron, Ltd., and the wafer was dried on a hot plate at 110° C. for 90 seconds. Thus, a resist film having a thickness of 100 nm was obtained. That is, resist-coated mask blanks were obtained.

(4) Production of Negative Resist Pattern

This resist film was subjected to patternwise irradiation by using an electron beam lithographic apparatus (manufactured by Elionix, Inc.; ELS-7500, acceleration voltage: 50 KeV). After irradiation, the film was heated on a hot plate at 120° C. for 90 seconds, and after immersion for 60 seconds in a 2.38 mass % tetramethylammonium hydroxide (TMAH) aqueous solution, was rinsed for 30 seconds with water and dried.

(5) Evaluation of Resist Pattern

The pattern thus obtained was evaluated for sensitivity, resolving power, pattern shape, line edge roughness (LER) and dry etching resistance, PEB temperature dependence and PED stability by the methods described below.

[Sensitivity]

The cross-sectional shape of the pattern thus obtained was observed by using a scanning electron microscope (S-4300 manufactured by Hitachi, Ltd.). The exposure amount (electron beam irradiation amount) when resolving a 1:1 line and space resist pattern with a 50 nm line wide was set as the sensitivity. A smaller value of this amount of exposure indicates higher sensitivity.

[Resolving Power]

The limiting resolving power (minimum line width separating and resolving the line and space) in the exposure amount (electron beam irradiation amount) showing the sensitivity was set as the resolving power (nm).

[Pattern Shape]

The cross-sectional shape of a 1:1 line and space resist pattern having a line width of 50 nm in the exposure amount showing the above sensitivity was observed using a scanning electron microscope (S-4300 manufactured by Hitachi, Ltd.). In the cross-sectional shape of the line pattern, a ratio represented by [line width in the bottom portion of the line pattern/line width in the center portion (half height position of the height of the line pattern) of the line pattern] less than 1.2 was evaluated as "forward tapered", a ratio of 1.05 or higher and less than 1.2 was evaluated as "slightly forward tapered", and a ratio of less than 1.05 was evaluated as "rectangular".

[Line Edge Roughness (LER)]

A 1:1 line and space resist pattern with a line width 50 nm was formed with an exposure amount (electron beam irradiation amount) showing the above sensitivity. At any arbitrary 30 points included in 50 μm along the length direction, the distance from a reference line at which an edge should exist was measured by using a scanning electron microscope (S-9220 manufactured by Hitachi, Ltd.). The standard deviation of this distance was determined, and 3δ was calculated. A smaller value indicates satisfactory performance.

[Dry Etching Resistance]

Dry etching was performed on the unexposed resist film formed by performing irradiation of the entire surface with the irradiation amount (electron beam irradiation amount) showing the above sensitivity for 30 seconds with a Hitachi U-621 with $Ar/C_4F_6/O_2$ gas (mixed gas with a volume ratio of 100/4/2). Thereafter, the resist residual film ratio was measured and was used as an indicator for dry etching resistance.

(Indicator of Dry Etching Resistance)
Very satisfactory: a residual film ratio of 95% or greater
Satisfactory: a residual film ratio of greater than or equal to 90% and less than 95%
Poor: a residual film ratio of less than 90%

[PEB Temperature Dependency]

After the exposure amount reproducing a 1:1 line and space with a 50 nm mask size when post-exposure baking (PEB) was performed at 120° C. for 90 seconds was set to the optimal exposure amount and then exposure was performed at the optimal exposure amount, post baking was performed at the two temperatures of +2° C. and −2° C. (122° C., 118° C.) with respect to the post-baking temperature, length measurement was performed on the respectively obtained lines and spaces, and these were determined as line widths L1 and L2. The PEB temperature dependency (PEBS) was defined as the change in line width for each 1° C. PEB temperature change, and calculated by the following formula.

PEB temperature dependency (nm/° C.)=|L1−L2|/4

The smaller the value, the smaller and more favorable the performance change with respect to the temperature change shown.

[Evaluation of PED (Post Exposure Time Delay)]

After exposure in the exposure amount in which the dimensions of a line and space 1:1 pattern with a 50 nm line width become 50 nm, the length of the line width dimensions on the wafer quickly after PEB treatment (0h) and the line width dimension on the wafer two hours after PEB treatment (2.0h) were measured, and the line width change ratio was calculated with the formula below.

Line width change ratio (%)=ΔCD(2.0h−0h)nm/50 nm

The smaller the value, the more satisfactory the performance shown, and this was set as an indicator of PED stability.

Preparation of a resist coating solution (negative resist compositions 2N to 29N, negative resist comparative compositions 1N to 4N), negative pattern formation and evaluation thereof were performed in the same manner as Example E1 other than using the components disclosed in Table 6.

TABLE 6

| Composition | Photoacid Generator | Compound (B) | Organic Carboxylic Acid | Basic Compound | Surfactant | Cross-linking Agent | Solvent |
|---|---|---|---|---|---|---|---|
| 1N | A1 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 2N | A2 (0.47 g) | P'-4 (4.21 g) | D1 (0.11 g) | B1 (0.04 g) | W-1 (0.005 g) | CL-1/CL-4 (0.59 g/0.30 g) | S1/S3 (75.0 g/18.8 g) |
| 3N | A3 (0.47 g) | P'-4 (4.21 g) | D1 (0.11 g) | B1 (0.04 g) | W-1 (0.005 g) | CL-1/CL-4 (0.59 g/0.30 g) | S2/S3 (75.0 g/18.8 g) |
| 4N | A4 (0.47 g) | P'-4 (4.21 g) | D1 (0.11 g) | B1 (0.04 g) | W-1 (0.005 g) | CL-1/CL-4 (0.59 g/0.30 g) | S2/S7 (75.0 g/18.8 g) |
| 5N | A5 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 6N | A6 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 7N | A7 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 8N | A8 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 9N | A9 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 10N | A10 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 11N | A1 (0.47 g) | P'-1 (4.21 g) | D1 (0.11 g) | B1 (0.04 g) | W-1 (0.005 g) | CL-1/CL-4 (0.59 g/0.30 g) | S2/S1 (75.0 g/18.8 g) |

TABLE 6-continued

| Composition | Photoacid Generator | Compound (B) | Organic Carboxylic Acid | Basic Compound | Surfactant | Cross-linking Agent | Solvent |
|---|---|---|---|---|---|---|---|
| 12N | A1 (0.47 g) | P'-2 (4.21 g) | D1 (0.11 g) | B1 (0.04 g) | W-1 (0.005 g) | CL-1/CL-4 (0.59 g/0.30 g) | S1/S2/S6 (50.0 g/25.0 g/18.8 g) |
| 13N | A1 (0.47 g) | P'-3 (4.21 g) | D1 (0.11 g) | B1 (0.04 g) | W-1 (0.005 g) | CL-1/CL-4 (0.59 g/0.30 g) | S1/S2/S5 (50.0 g/25.0 g/18.8 g) |
| 14N | A1 (0.47 g) | P'-6 (4.21 g) | D1 (0.11 g) | B1 (0.04 g) | W-1 (0.005 g) | CL-1/CL-4 (0.59 g/0.30 g) | S1/S2/S4 (50.0 g/25.0 g/18.8 g) |
| 15N | A1 (0.47 g) | P'-4 (4.21 g) | D1 (0.11 g) | B2 (0.04 g) | W-1 (0.005 g) | CL-1/CL-4 (0.59 g/0.30 g) | S2/S1 (75.0 g/18.8 g) |
| 16N | A1 (0.47 g) | P'-4 (4.21 g) | D1 (0.11 g) | B3 (0.04 g) | None | CL-1 (0.89 g) | S2/S1 (75.0 g/18.8 g) |
| 17N | A1 (0.47 g) | P'-5 (4.21 g) | D1 (0.11 g) | B1 (0.04 g) | None | CL-3 (0.89 g) | S2/S1 (75.0 g/18.8 g) |
| 18N | A1 (0.47 g) | P'-4 (4.21 g) | D1 (0.11 g) | B1/B6 (0.02 g/0.02 g) | None | CL-1/CL-5 (0.59 g/0.30 g) | S2/S1 (75.0 g/18.8 g) |
| 19N | A1 (0.47 g) | P'-4 (4.21 g) | D1 (0.11 g) | B5 (0.04 g) | None | CL-2/CL-3 (0.59 g/0.30) | S2/S1 (75.0 g/18.8 g) |
| 20N | A1 (0.47 g) | P'-5 (4.21 g) | D1 (0.11 g) | B4 (0.04 g) | None | CL-3 (0.89 g) | S2/S1 (75.0 g/18.8 g) |
| 21N | A1 (0.47 g) | P'-4 (4.21 g) | D2 (0.11 g) | B1 (0.04 g) | W-2 (0.005 g) | CL-1/CL-5 (0.59 g/0.30 g) | S2/S1 (75.0 g/18.8 g) |
| 22N | A1 (0.47 g) | P'-3 (4.21 g) | D2 (0.11 g) | B3 (0.04 g) | W-3 (0.005 g) | CL-3 (0.89 g) | S2/S1 (75.0 g/18.8 g) |
| 23N | A1 (0.47 g) | P'-1/P'-3 (2.0 g/2.21 g) | D3 (0.11 g) | B2 (0.04 g) | None | CL-2 (0.89 g) | S2/S1 (75.0 g/18.8 g) |
| 24N | A1 (0.47 g) | P'-4 (4.21 g) | D1 (0.11 g) | B6 (0.04 g) | None | CL-1/CL-5 (0.59 g/0.30 g) | S2/S1 (75.0 g/18.8 g) |
| 25N | A1/A2 (0.20 g/0.27 g) | P'-4 (4.21 g) | D3 (0.11 g) | B6 (0.04 g) | None | CL-1/CL-5 (0.59 g/0.30 g) | S2/S1 (75.0 g/18.8 g) |
| 26N | A11 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 27N | A12 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 28N | A13 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| 29N | A14 (0.47 g) | P'-4 (4.21 g) | D1 (0.11 g) | B1 (0.04 g) | W-1 (0.005 g) | CL-1/CL-4 (0.59 g/0.30 g) | S2/S1 (75.0 g/18.8 g) |
| Comparative Composition 1N | Comparative Compound A1 (0.47 g) | P'-2 (4.80 g) | D1 (0.11 g) | B2 (0.04 g) | W-1 (0.005 g) | CL-3 (0.89 g) | S1 (93.8 g) |
| Comparative Composition 2N | Comparative Compound A2 (0.47 g) | P'-2 (4.21 g) | D1 (0.11 g) | B2 (0.04 g) | W-1 (0.005 g) | CL-3 (0.89 g) | S1 (93.8 g) |
| Comparative Composition 3N | Comparative Compound A3 (0.47 g) | P'-2 (4.21 g) | D1 (0.11 g) | B2 (0.04 g) | W-1 (0.005 g) | CL-3 (0.89 g) | S1 (93.8 g) |
| Comparative Composition 4N | Comparative Compound A4 (0.47 g) | P'-2 (4.21 g) | D1 (0.11 g) | B2 (0.04 g) | W-1 (0.005 g) | CL-3 (0.89 g) | S1 (93.8 g) |

Abbreviations of components other than those shown above used in the Examples and Comparative Examples are disclosed below.

[Compound (B)]

The structure of the compound (B) used in the Examples and Comparative Examples and the compositional ratio (molar ratio), weight average molecular weight and degree of dispersion of the compound (B) in a case where the compound (B) is a resin are shown below.

[Chem. 57]

P'-1

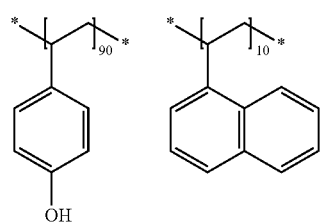

Mw = 12000, Mw/Mn = 2.3

P'-2

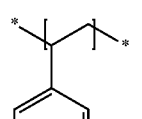

Mw = 4500, Mw/Mn = 1.1

P'-3

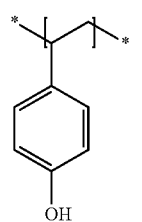

Mw = 3700, Mw/Mn = 1.1

P'-4

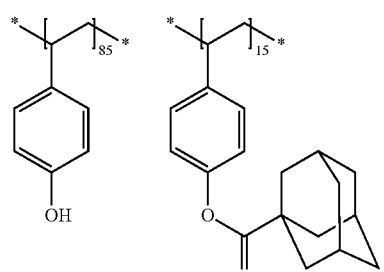

Mw = 4200, Mw/Mn = 1.1

P'-5

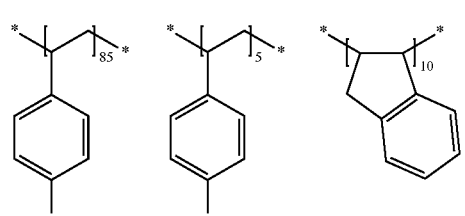

Mw = 4500, Mw/Mn = 1.5

P'-6

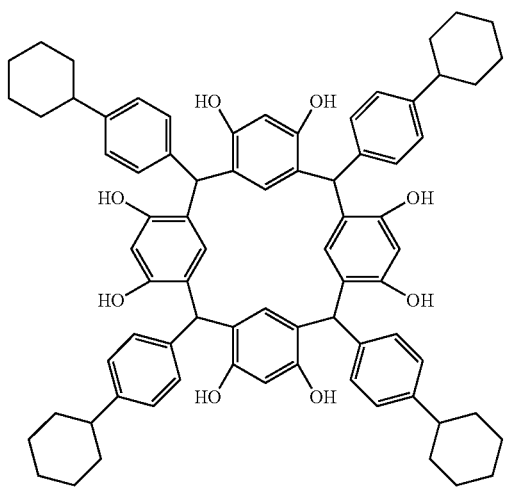

[Acid Cross-Linking Compound]

[Chem. 58]

CL-1

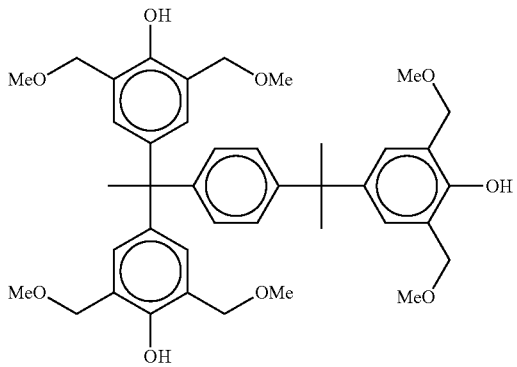

CL-2

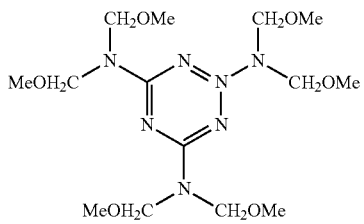

CL-3

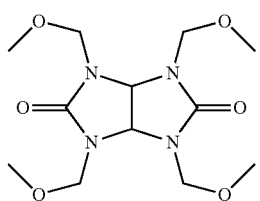

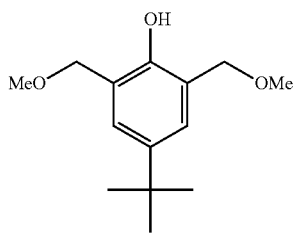

[Chem. 59]

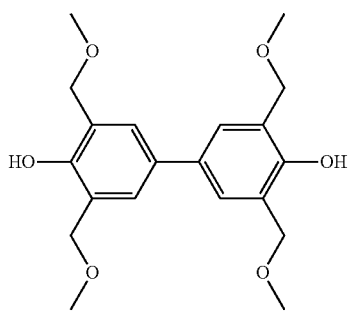

[Basic Compound]
B1: Tetrabutylammonium hydroxide
B2: Tri(n-octyl)amine
B3: 2,4,5-Triphenylimidazole

[Chem 60]

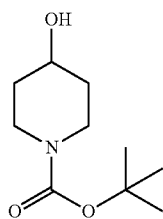

B4

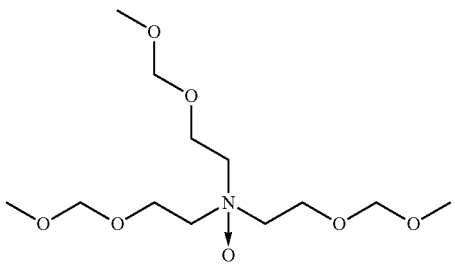

B5

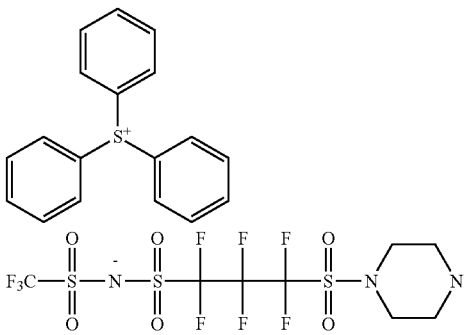

B6

[Organic Carboxylic Acid]
D1: 2-hydroxy-3-naphthoic acid
D2: 2-naphthoic acid
D3: benzoic acid

[Surfactant]
W-1: Surfactant PF6320 (manufactured by Omnova Solutions, Inc.)
W-2: Megaface F176 (manufactured by Dainippon Ink & Chemicals, Inc.; fluorine based)
W-3: Polysiloxane Polymer KP-341 (manufactured by Shin-Etsu Chemical Co., Ltd., silicone based)

[Solvent]
S1: Propylene glycol monomethyl ether acetate (1-methoxy-2-acetoxypropane)
S2: Propylene glycol monomethyl ether (1-methoxy-2-propanol)
S3: 2-Heptanone
S4: Ethyl lactate
S5: Cyclohexanone
S6: γ-butyrolactone
S7: Propylene carbonate The evaluation results are shown in Table 7 below.

TABLE 7

| | | | | | | | PEB Temperature | PED |
| | | Sensitivity | Resolving | | LER | Dry Etching | Dependency | Stability |
| Example | Composition | (μC/cm$^2$) | power (nm) | Pattern Shape | (nm) | Resistance | (nm/° C.) | (%) |
|---|---|---|---|---|---|---|---|---|
| E1 | 1N | 10.2 | 30 | Rectangular | 4.0 | Extremely good | 0.6 | 0.6 |
| E2 | 2N | 10.0 | 20 | Rectangular | 4.0 | Extremely good | 0.4 | 0.4 |
| E3 | 3N | 10.2 | 30 | Rectangular | 4.0 | Extremely good | 0.6 | 0.6 |
| E4 | 4N | 10.2 | 30 | Rectangular | 4.0 | Extremely good | 0.6 | 0.6 |
| E5 | 5N | 11.3 | 30 | Rectangular | 4.0 | Extremely good | 0.6 | 0.6 |
| E6 | 6N | 10.3 | 20 | Rectangular | 4.0 | Extremely good | 0.4 | 0.4 |
| E7 | 7N | 10.0 | 35 | Rectangular | 4.0 | Extremely good | 0.8 | 0.8 |
| E8 | 8N | 10.2 | 35 | Rectangular | 4.0 | Extremely good | 0.8 | 0.8 |
| E9 | 9N | 10.2 | 30 | Rectangular | 4.0 | Extremely good | 0.6 | 0.6 |
| E10 | 10N | 10.2 | 30 | Rectangular | 4.0 | Extremely good | 0.7 | 0.7 |
| E11 | 11N | 10.3 | 30 | Rectangular | 4.0 | Good | 0.6 | 0.6 |
| E12 | 12N | 10.2 | 30 | Rectangular | 4.0 | Good | 0.6 | 0.6 |
| E13 | 13N | 10.3 | 30 | Rectangular | 4.0 | Good | 0.6 | 0.6 |

TABLE 7-continued (Electron Beam exposure: Negative-tone)

| Example | Composition | Sensitivity ($\mu C/cm^2$) | Resolving power (nm) | Pattern Shape | LER (nm) | Dry Etching Resistance | PEB Temperature Dependency (nm/° C.) | PED Stability (%) |
|---|---|---|---|---|---|---|---|---|
| E14 | 14N | 13.3 | 30 | Rectangular | 4.0 | Good | 0.6 | 0.6 |
| E15 | 15N | 10.3 | 30 | Rectangular | 4.5 | Extremely good | 0.6 | 0.6 |
| E16 | 16N | 10.2 | 30 | Rectangular | 4.5 | Extremely good | 0.6 | 0.6 |
| E17 | 17N | 10.3 | 30 | Rectangular | 4.0 | Good | 0.6 | 0.6 |
| E18 | 18N | 10.5 | 30 | Rectangular | 4.0 | Extremely good | 0.6 | 0.6 |
| E19 | 19N | 10.2 | 30 | Rectangular | 4.5 | Extremely good | 0.6 | 0.6 |
| E20 | 20N | 10.2 | 30 | Rectangular | 4.5 | Good | 0.6 | 0.6 |
| E21 | 21N | 10.2 | 30 | Rectangular | 4.0 | Extremely good | 0.6 | 0.6 |
| E22 | 22N | 10.2 | 30 | Rectangular | 4.5 | Good | 0.6 | 0.6 |
| E23 | 23N | 10.2 | 30 | Rectangular | 4.5 | Good | 0.6 | 0.6 |
| E24 | 24N | 10.2 | 30 | Rectangular | 4.0 | Extremely good | 0.6 | 0.6 |
| E25 | 25N | 10.2 | 20 | Rectangular | 4.0 | Extremely good | 0.5 | 0.5 |
| E26 | 26N | 11.2 | 20 | Rectangular | 4.0 | Extremely good | 0.4 | 0.4 |
| E27 | 27N | 12.2 | 30 | Rectangular | 4.0 | Extremely good | 0.8 | 0.8 |
| E28 | 28N | 11.2 | 30 | Rectangular | 4.0 | Extremely good | 0.6 | 0.6 |
| E29 | 29N | 13.2 | 30 | Rectangular | 4.0 | Extremely good | 0.6 | 0.6 |
| Comparative Example E1 | Comparative Composition 1N | 10.8 | 50 | Slightly forward tapered | 6.5 | Good | 2.0 | 2.0 |
| Comparative Example E2 | Comparative Composition 2N | 14.8 | 40 | Forward tapered | 6.0 | Good | 0.6 | 0.6 |
| Comparative Example E3 | Comparative Composition 3N | 10.8 | 40 | Slightly forward tapered | 6.0 | Good | 1.5 | 1.5 |
| Comparative Example E4 | Comparative Composition 4N | 10.8 | 45 | Slightly forward tapered | 6.0 | Good | 2.0 | 2.0 |

From the results shown in Table 7, it can be understood that the composition according to the present invention has superior sensitivity, resolving power, pattern shape and LER performance in ultrafine pattern formation, has low PEB temperature dependency and has superior PED stability. Furthermore, it can be understood that the dry etching resistance of the chemical amplification resist composition of the Examples is improved in ultrafine pattern formation, in a case where a resin including a repeating unit represented by the General Formula (4') is included.

Examples 1F to 6F and Comparative Examples 1F to 4F (Preparation of Resist Solution)

The negative resist compositions shown in the Table 6 were filtered through a polytetrafluoroethylene filter having a pore size of 0.04 μm, and thus negative resist solutions were prepared.

(Resist Evaluation)

Each of the negative resist solutions thus prepared was uniformly applied on a silicon substrate that had been subjected to a hexamethyldisilazane treatment, by using a spin coater. The system was heated and dried on a hot plate at 100° C. for 60 seconds, and thus a resist film having a thickness of 50 nm was formed.

The resist film thus obtained was evaluated for sensitivity, resolving power, pattern shape, line edge roughness (LER) and dry etching resistance by the methods described below.

[Sensitivity]

The resist film thus obtained was exposed through a reflection type mask having a 1:1 line-and-space pattern having a line width of 50 nm, by using EUV light (wavelength: 13 nm) while changing the amount of exposure by 0.1 mJ/cm$^2$ over the range of 0 to 20.0 mJ/cm$^2$, and then the resist film was baked for 90 seconds at 110° C. Thereafter, the resist pattern was developed by using a 2.38 mass % aqueous solution of tetramethylammonium hydroxide (TMAH).

The exposure amount when reproducing a 1:1 line and space mask pattern with a 50 nm line width was set as the sensitivity. A smaller value of this amount of exposure indicates higher sensitivity.

[Resolving Power]

The limiting resolving power (minimum line width separating and resolving the line and space) in the exposure amount showing the above sensitivity was set as the resolving power (nm).

[Pattern Shape]

The cross-sectional shape of a 1:1 line and space resist pattern having a line width of 50 nm in the exposure amount showing the above sensitivity was observed using a scanning electron microscope (S-4300 manufactured by Hitachi, Ltd.). In the cross-sectional shape of the line pattern, a ratio represented by [line width in the bottom portion of the line pattern/line width in the center portion (half height position of the height of the line pattern) of the line pattern] 1.2 or higher was evaluated as "forward tapered", a ratio of 1.05 or higher and less than 1.2 was evaluated as "slightly forward tapered", and a ratio of less than 1.05 was evaluated as "rectangular".

[Line Edge Roughness (LER)]

A 1:1 line and space resist pattern with a line width 50 nm was formed with an exposure amount showing the above sensitivity. At any arbitrary 30 points included in 10 μm along the length direction, the distance from a reference line at which an edge should exist was measured by using a scanning electron microscope (S-9220 manufactured by Hitachi, Ltd.). The standard deviation of this distance was determined, and 3δ was calculated. A smaller value indicates satisfactory performance.

[Dry Etching Resistance]

Dry etching was performed on the unexposed resist film for 15 seconds with a Hitachi U-621 with $Ar/C_4F_6/O_2$ gas (mixed gas with a volume ratio of 100/4/2). Thereafter, the resist residual film ratio was measured and was used as an indicator for dry etching resistance.

(Indicator of Dry Etching Resistance)
Very satisfactory: a residual film ratio of 95% or greater
Satisfactory: a residual film ratio of greater than or equal to 90% and less than 95%
Poor: a residual film ratio of less than 90%
The results of the above evaluation are shown in Table 8.

TABLE 8

(EUV Exposure, Negative-tone)

| | Composition | Sensitivity $(mJ/cm^2)$ | Resolving Power (nm) | Pattern Shape | LER (nm) | Dry Etching Resistance |
|---|---|---|---|---|---|---|
| 1F | 1N | 12.8 | 30 | Rectangular | 4.0 | Extremely good |
| 2F | 2N | 12.7 | 20 | Rectangular | 4.0 | Extremely good |
| 3F | 3N | 12.8 | 30 | Rectangular | 4.0 | Extremely good |
| 4F | 12N | 12.8 | 30 | Rectangular | 4.0 | Good |
| 5F | 14N | 14.0 | 30 | Rectangular | 4.0 | Good |
| 6F | 27N | 13.5 | 35 | Slightly forward tapered | 4.0 | Extremely good |
| Comparative Example 1F | Comparative Composition 1N | 13.8 | 50 | Slightly forward tapered | 6.5 | Good |
| Comparative Example 2F | Comparative Composition 2N | 15.8 | 45 | Forward tapered | 6.0 | Good |
| Comparative Example 3F | Comparative Composition 3N | 13.8 | 45 | Slightly forward tapered | 6.5 | Good |
| Comparative Example 4F | Comparative Composition 4N | 13.8 | 50 | Slightly forward tapered | 6.5 | Good |

From the results shown in Table 8, it can be understood that the composition according to the present invention has superior sensitivity, resolving power, pattern shape and LER performance in ultrafine pattern formation. Furthermore, it can be understood that the dry etching resistance of the chemical amplification resist composition of the Examples is improved in ultrafine pattern formation, in a case where a resin including a repeating unit represented by the General Formula (4') is included.

Examples 1G to 11G and Comparative Examples 1G to 2G (1) Preparation of Support

A 6-inch wafer on which Cr oxide is deposited (object subjected to shielding film treatment using ordinary photomask blanks) was prepared.

(2) Preparation of Resist Coating Solution (Solution Composition of Organic Solvent Based Negative Resist Composition 1D)

| | |
|---|---|
| Acid Degradable resin (P-12) | 0.60 g |
| Photoacid Generator A2 (structural formula is shown above) | 0.12 g |
| Tri(n-octyl)amine (basic compound) | 0.002 g |
| Surfactant PF6320 (manufactured by Omnova Solutions, Inc.) | 0.001 g |
| Propylene glycol monomethyl ether acetate (solvent) | 5.4 g |
| Cyclohexanon (solvent) | 3.6 g |

(Preparation of Resist Solution)

The resist composition shown in the composition solution was filtered through a polytetralfuoroethylene filter with a pore size of 0.04 μm, and thus a resist solution was prepared.

(3) Resist Evaluation

Each of the resist solutions thus prepared was uniformly applied on a silicon substrate that had been subjected to a hexamethyldisilazane treatment, by using a spin coater. The system was heated and dried on a hot plate at 100° C. for 60 seconds, and thus a resist film having a thickness of 50 nm was formed.

The resist film thus obtained was evaluated for sensitivity, resolving power, pattern shape, line edge roughness (LER) and dry etching resistance by the methods described below.

[Sensitivity]

The resist film thus obtained was exposed through a reflection type mask having a 1:1 line-and-space pattern having a line width of 50 nm, by using EUV light (wavelength: 13 nm) while changing the amount of exposure by 0.1 $mJ/cm^2$ over the range of 0 to 20.0 $mJ/cm^2$, and then the resist film was baked for 90 seconds at 110° C. Thereafter, developing was performed for 30 seconds by puddling an organic developer described in the table below, and after the wafer is rotated at a rotation speed of 4000 rpm for 30 seconds after rinsing using a rinsing liquid described in the table below, a pattern was formed by performing baking at 90° C. for 60 seconds.

The exposure amount when reproducing a 1:1 line and space mask pattern with a 50 nm line width was set as the sensitivity. A smaller value of this amount of exposure indicates higher sensitivity.

[LS Resolving Power]

The limiting resolving power (minimum line width separating and resolving the line and space) in the exposure amount showing the above sensitivity was set as the LS resolving power (nm).

[Pattern Shape]

The cross-sectional shape of a 1:1 line and space resist pattern having a line width of 50 nm in the exposure amount showing the above sensitivity was observed using a scanning electron microscope (S-4300 manufactured by Hitachi, Ltd.). In the cross-sectional shape of the line pattern, a ratio represented by [line width in the bottom portion of the line pattern/line width in the center portion (half height position of the height of the line pattern) of the line pattern] 1.2 or higher was evaluated as "forward tapered", a ratio of 1.05 or higher and less than 1.2 was evaluated as "slightly forward tapered", and a ratio of less than 1.05 was evaluated as "rectangular".

[Line Edge Roughness (LER)]

A 1:1 line and space resist pattern with a line width 50 nm was formed with an exposure amount showing the above sensitivity. At any arbitrary 30 points included in 10 μm along the length direction, the distance from a reference line at which an edge should exist was measured by using a scanning electron microscope (S-9220 manufactured by Hitachi, Ltd.). The standard deviation of this distance was determined, and 3σ was calculated. A smaller value indicates satisfactory performance.

[Dry Etching Resistance]

Dry etching was performed on the unexposed resist film for 15 seconds with a Hitachi U-621 with $Ar/C_4F_6/O_2$ gas (mixed gas with a volume ratio of 100/4/2). Thereafter, the resist residual film ratio was measured and was used as an indicator for dry etching resistance.

(Indicator of Dry Etching Resistance)

Very satisfactory: a residual film ratio of 95% or greater

Satisfactory: a residual film ratio of greater than or equal to 90% and less than 95%

Poor: a residual film ratio of less than 90%

Preparation of a resist coating solution (negative resist compositions 2D to 11D, negative resist comparative compositions 1D to 2D), negative pattern formation and evaluation thereof were performed in the same manner as Example 1G other than using the components disclosed in Table 9. Moreover, the usage amount of solvent (total thereof, in the case of using plural types) is 9.0 g.

Abbreviations of components other than those shown above used in the Examples and Comparative Examples are disclosed below.

[Acid Degradable Resin]

The structure, compositional ratio (molar ratio), weight average molecular weight and degree of dispersion of the acid degradable resin used in the Examples and Comparative Examples are shown below.

[Chem. 61]

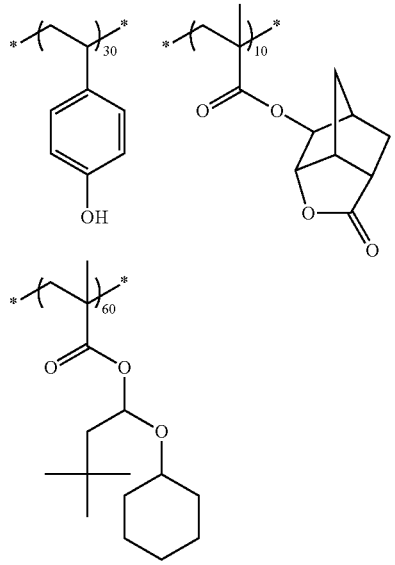

P-12

Mw = 11000
Mw/Mn = 1.42

TABLE 9

(EUV Exposure: Organic-based Development (Negative-tone))

| Composition Example | Photoacid generator | Resin | Basic Compound (0.002 g) | Surfactant (0.001 g) | Solvent (mass ratio) |
|---|---|---|---|---|---|
| 1D | A2 (0.12 g) | P-12 (0.6 g) | B2 | W-1 | S1/S5 (6/4) |
| 2D | A1 (0.12 g) | P-12 (0.6 g) | B2 | W-1 | S1/S2/S6 (6/3/1) |
| 3D | A7 (0.12 g) | P-13 (0.6 g) | B2 | W-2 | S1/S7 (6/4) |
| 4D | A8 (0.12 g) | P-15 (0.6 g) | B3 | W-2 | S1/S2 (6/4) |
| 5D | A10 (0.12 g) | P-16 (0.6 g) | B4 | W-3 | S1/S2 (6/4) |
| 6D | A11 (0.12 g) | P-17 (0.6 g) | B5 | W-1 | S1/S2 (6/4) |
| 7D | A13 (0.12 g) | P-18 (0.6 g) | B3 | W-3 | S1/S2 (6/4) |
| 8D | A2/A1 (0.06 g/0.06 g) | P-1/P-5 (0.3 g/0.3 g) | B6 | None | S1/S2 (6/4) |
| 9D | A14 (0.12 g) | P-19 (0.6 g) | B5 | W-1 | S1/S2 (6/4) |
| 10D | A2 (0.12 g) | P-14 (0.6 g) | B4 | W-1 | S1/S2 (6/4) |
| 11D | A6 (0.12 g) | P-20 (0.6 g) | B6 | W-1 | S1/S2 (6/4) |
| Comparative Composition 1D | Comparative Composition 2 (0.12 g) | P-1 (0.6 g) | B2 | W-1 | S1/S2 (6/4) |
| Comparative Composition 2D | A2 (0.12 g) | P-21 (0.6 g) | B2 | W-1 | S1/S2 (6/4) |

-continued
P-13
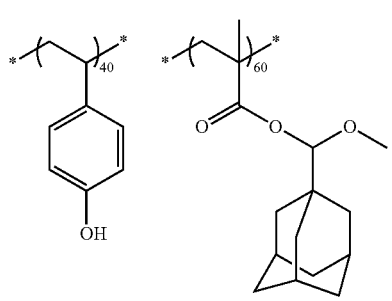
Mw = 7700
Mw/Mn = 1.55
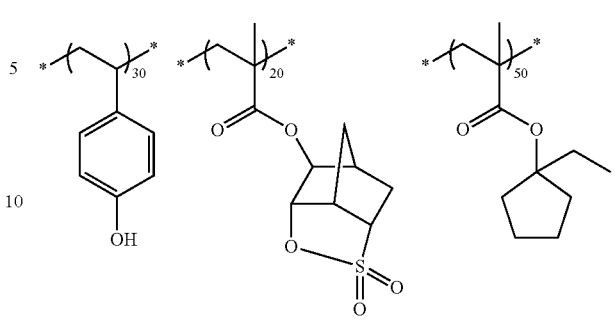
Mw = 7100
Mw/Mn = 1.56
P-14
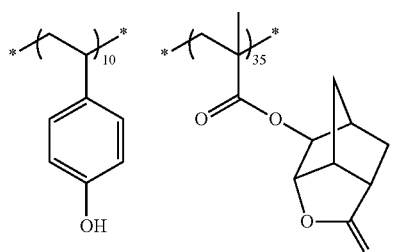
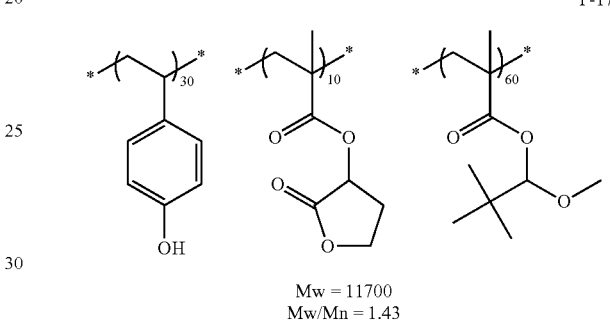
Mw = 11700
Mw/Mn = 1.43
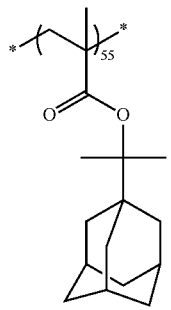
Mw = 14200
Mw/Mn = 1.64
P-18
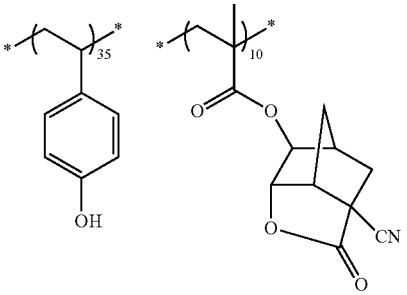
P-15
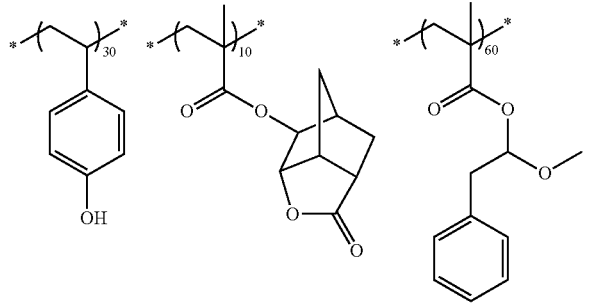
Mw = 8700
Mw/Mn = 1.53
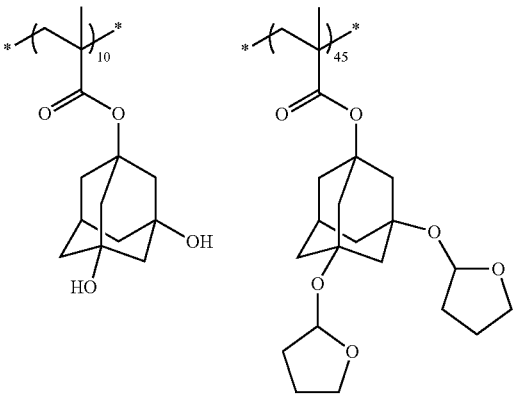
Mw = 8800
Mw/Mn = 1.58

TABLE 10

(EUV exposure; Solvent development type)

| | Composition | Developer | Rinsing Liquid | Sensitivity (mJ/cm²) | LS Resolving Power (nm) | Pattern Shape | LER (nm) | Dry Etching Resistance |
|---|---|---|---|---|---|---|---|---|
| 1G | 1D | SG-3 | — | 10.8 | 20 | Rectangular | 3.5 | Extremely good |
| 2G | 2D | SG-3 | — | 10.8 | 20 | Rectangular | 3.5 | Extremely good |
| 3G | 3D | SG-3 | — | 10.8 | 20 | Rectangular | 3.5 | Extremely good |
| 4G | 4D | SG-2 | SR-1 | 11.7 | 20 | Rectangular | 3.5 | Extremely good |
| 5G | 5D | SG-1 | SR-2 | 10.8 | 20 | Rectangular | 3.5 | Extremely good |
| 6G | 6D | SG-3 | SR-3 | 10.8 | 20 | Rectangular | 3.5 | Extremely good |
| 7G | 7D | SG-3 | — | 12.9 | 30 | Slightly forward tapered | 4.0 | Extremely good |
| 8G | 8D | SG-3 | — | 10.8 | 20 | Rectangular | 3.5 | Extremely good |
| 9G | 9D | SG-3 | — | 10.9 | 20 | Rectangular | 3.5 | Extremely good |
| 10G | 10D | SG-3 | — | 10.8 | 20 | Rectangular | 3.5 | Extremely good |
| 11G | 11D | SG-3 | — | 10.8 | 20 | Rectangular | 3.5 | Extremely good |
| Comparative Example 1G | Comparative Composition 1D | SG-3 | — | 13.9 | 40 | Forward tapered | 5.5 | Good |
| Comparative Example 2G | Comparative Composition 2D | SG-3 | — | 13.0 | 35 | Forward tapered | 4.5 | Good |

Abbreviations of components other than those shown above used in the Examples and Comparative Examples are disclosed below.

[Developer]
The developers below were used.
SG-1: 2-nonanone
SG-2: methyl amyl ketone (2-heptanone)
SG-3: butyl acetate

[Rinsing Liquid]
The rinsing liquids below were used.
SR-1: 4-methyl-2-pentanol
SR-2: 1-hexanol
SR-3: methyl isobutyl carbinol From the results shown in Table 10, it can be understood that the Examples 1G to 9G using the chemical amplification resist composition of the present invention has high sensitivity and resolving power, low LER, and superior pattern shape and dry etching resistance in ultrafine pattern formation, compared to Comparative Example 1G not using the compound (A) and Comparative Example 2G not using a compound including a phenolic hydroxyl group.

What is claimed is:

1. A chemical amplification resist composition comprising:
   (A) a compound including a triarylsulfonium cation having two or more fluorine atoms and capable of generating an acid with a volume of 240 Å$^3$ or higher by irradiation of active rays or radiation;
   (B) a compound including a phenolic hydroxyl group; and
   (C) an acid crosslinking compound,
   wherein benzene rings configuring at least two aryl groups from the three aryl groups in the triarylsulfonium cation of the compound (A) each independently is directly bonded to at least one fluorine atom, and
   the compound (B) is a resin having a weight average molecular weight of 2,000 or more.

2. The chemical amplification resist composition according to claim 1, wherein the compound (A) is a compound including a triarylsulfonium cation having three or more fluorine atoms.

3. The chemical amplification resist composition according to claim 2, wherein each of the three aryl groups in the triarylsulfonium cation of compound (A) includes one or more fluorine atoms.

4. The chemical amplification resist composition according to claim 1, wherein the compound (B) is a resin in which solubility with respect to an alkali developer increases due to the action of an acid.

5. The chemical amplification resist composition according to claim 1, wherein the compound (C) is a compound having two or more of a hydroxymethyl group or an alkoxymethyl group in the molecule.

6. The chemical amplification resist composition according to claim 1, wherein the compound (B) is a resin including a repeating unit represented by the following Formula (1),

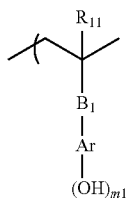

(1)

wherein, in Formula 1, $R_{11}$ represents a hydrogen atom, a methyl group or a halogen atom, $B_1$ represents a single bond or a divalent linking group,
Ar represents an aromatic ring, and
m1 represents an integer of 1 or more.

7. The chemical amplification resist composition according to claim 1, wherein the composition is a chemical amplification resist composition for electron beam or extreme ultraviolet light exposure.

8. A resist film formed of the chemical amplification resist composition according to claim 1.

9. A resist-coated mask blank coated with the resist film according to claim 8.

10. A photomask obtained by exposing and developing the resist-coated mask blank according to claim 9.

11. A method for forming a pattern comprising exposing the resist-coated mask blank according to claim 9, and developing the exposed mask blank.

12. A method of forming a pattern comprising exposing the resist film according to claim 8 and developing the exposed film.

13. A method of manufacturing an electronic device, including the method of forming a pattern according to claim 12.

14. The chemical amplification resist composition according to claim 1,
   wherein the compound (A) is represented by the following Formula (1),

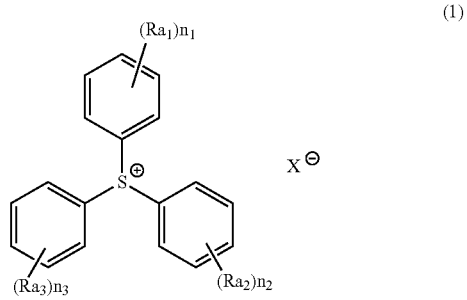

(1)

wherein, in Formula (1),
$R_{a1}$ represents a substituent,
$n_1$ represents an integer of 0 to 5,
$n_2$ represents an integer of 1 to 5,
when $n_2$ represents 1, $R_{a2}$ represents a fluorine atom,
when $n_2$ represents an integer of 2 to 5, $R_{a2}$ represents a substituent, a fluorine atom, or a group including one or more fluorine atoms, and at least one of $R_{a2}$'s represents a fluorine atom,
$n_3$ represents an integer of 1 to 5,
when $n_3$ represents 1, $R_{a3}$ represents a fluorine atom,
when $n_3$ represents an integer of 2 to 5, $R_{a3}$ represents a substituent, a fluorine atom, or a group including one or more fluorine atoms, and at least one of $R_{a3}$'s represents a fluorine atom,
$R_{a1}$ and $R_{a2}$ may be linked with each other to form a ring, and
X$^-$ represents an organic anion.

15. The chemical amplification resist composition according to claim 1,
   wherein the compound (A) includes a sulfonate anion represented by the following Formula (SA1),

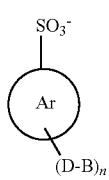

(SA1)

wherein, in Formula (SA1),

Ar represents an aryl group, and may further have a substituent other than the sulfonate anion and -(D-B) group, n represents an integer of 0 or more, D represents a single bond or a divalent linking group, and B represents a hydrocarbon group.

16. The chemical amplification resist composition according to claim 1 further comprising a photodegradable basic compound.

17. The chemical amplification resist composition according to claim 1, wherein the compound (A) includes at least one of the following compounds:

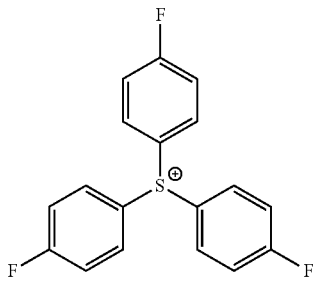 [SMILES: Fc1ccc([S+](c2ccc(F)cc2)c2ccc(F)cc2)cc1]

-continued

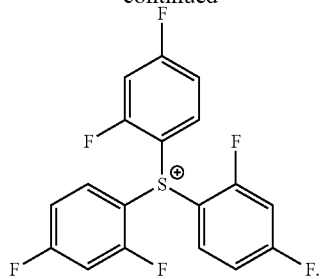

18. The chemical amplification resist composition according to claim 1, wherein the compound (A) includes the following compound:

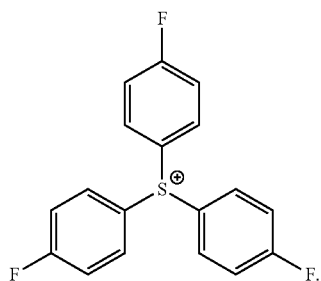

* * * * *